(12) United States Patent
Saito et al.

(10) Patent No.: US 6,790,541 B2
(45) Date of Patent: Sep. 14, 2004

(54) EXCHANGE COUPLING FILM AND ELECTRORESISTIVE SENSOR USING THE SAME

(75) Inventors: Masamichi Saito, Niigata-ken (JP); Naoya Hasegawa, Niigata-ken (JP); Yosuke Ide, Niigata-ken (JP); Kenichi Tanaka, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 283 days.

(21) Appl. No.: 09/834,105

(22) Filed: Apr. 11, 2001

(65) Prior Publication Data

US 2002/0018919 A1 Feb. 14, 2002

(30) Foreign Application Priority Data

Apr. 12, 2000 (JP) ........................................ 2000-110630
Apr. 12, 2000 (JP) ........................................ 2000-110640

(51) Int. Cl.$^7$ .............................................. G11B 5/33
(52) U.S. Cl. ..................... 428/692; 428/900; 360/313; 360/324.11
(58) Field of Search .................. 360/324.1, 324.11, 360/324.12, 325, 326, 327.32, 324, 313, 314; 428/611, 64.3, 64.4, 692, 694 R, 694 MM, 694 EC, 694 IS, 694 GR, 900; 324/210, 232, 252; 369/13.4, 13.41, 13.42, 13.44, 13.45, 13.49

(56) References Cited

U.S. PATENT DOCUMENTS

| 5,731,936 A | 3/1998 | Lee et al |
| 5,768,067 A | 6/1998 | Saito et al. . |
| 5,784,225 A | 7/1998 | Saito et al. |
| 5,993,956 A * | 11/1999 | Lambeth et al. ............. 428/900 |
| 6,023,395 A | 2/2000 | Dill et al. |
| 6,046,892 A | 4/2000 | Aoshima et al. |
| 6,083,632 A | 7/2000 | Fujikata et al. |
| 6,132,892 A * | 10/2000 | Yoshikawa et al. ......... 428/692 |
| 6,411,476 B1 | 6/2002 | Lin et al. |
| 6,433,972 B1 | 8/2002 | Mao et al. |
| 6,452,763 B1 | 9/2002 | Gill |
| 6,456,469 B1 | 9/2002 | Gill |

FOREIGN PATENT DOCUMENTS

| JP | 8-88118 | 7/1996 |
| JP | 9-69211 | 3/1997 |
| JP | 11-191647 | 7/1999 |

OTHER PUBLICATIONS

English Translation of JP 11–191647.
English Translation of JP 9–69211.

* cited by examiner

Primary Examiner—Stevan A. Resan
Assistant Examiner—Louis Falasco
(74) Attorney, Agent, or Firm—Brinks Hofer Gilson & Lione

(57) ABSTRACT

An exchange coupling film has an antiferromagnetic layer made of an antiferromagnetic material containing an element X and Mn, where the element X is selected from the group of elements consisting of Pt, Pd, Ir, Rh, Ru, and Os, and combinations thereof. The antiferromagnetic layer has a region in which the ratio of the atomic percent of the element X to Mn increases towards said ferromagnetic layer. The crystalline structure of at least part of said antiferromagnetic layer has a CuAu—I type face-centered square ordered lattice.

93 Claims, 13 Drawing Sheets

1ST ANTIFERROMAGNETIC LAYER THICKNESS X (Å)

Pt CONTENT X OF 1ST-ANTIFERROMAGNETIC LAYER ($Pt_xMn_{100-x}$) (at %)

EXCHANGE COUPLING FILM AND ELECTRORESISTIVE SENSOR USING THE SAME

RELATED APPLICATIONS

Reference is hereby made to commonly-assigned, copending patent applications having the following titles and docket numbers:

"Method of Producing Exchange Coupling Film and Method of Producing Magnetoresistive Sensor by Using the Exchange Coupling Film", Ser. No. 09/833,306.

"Exchange Film and Electroresistive Sensor Using the Same", Ser. No. 09/833,756.

"Method of Producing Exchange Coupling Film and Method of Producing Magnetoresistive Sensor by Using the Exchange Coupling Film", Ser. No. 09/833,459.

BACKGROUND OF THE INVENTION

1. Field of the Invention

The present invention relates to an exchange coupling film which has an antiferromagnetic layer and a ferromagnetic layer, wherein the direction of magnetization of the ferromagnetic layer is fixed in a predetermined direction by the effect of an exchange magnetic field which is generated at the interface between the antiferromagnetic layer and the ferromagnetic layer. More particularly, the present invention relates to an exchange coupling film which is improved to exhibit a large ratio of resistance variation and also to a magnetoresistive sensor, e.g., a spin valve thin-film device or an ARM device, incorporating such an exchange coupling film, as well as to a thin-film magnetic head which uses such a magnetoresistive sensor.

2. Description of the Related Art

A spin-valve-type thin-film device is a kind of GMR (Giant Magnetoresistive) device which makes use of a giant magnetoresistive effect, and is used for detecting recording magnetic fields from a recording medium such as a hard disk.

The spin-valve-type thin-film device, among various GMR devices, has advantageous features such as simplicity of the structure and high subtlety to vary its magnetic resistance even under a weak magnetic field.

The simplest form of the spin-valve-type thin-film device has an antiferromagnetic layer, a pinned magnetic layer, a non-magnetic intermediate layer, and a free magnetic layer. The antiferromagnetic layer and the pinned magnetic layer are formed in contact with each other, and the direction of the pinned magnetic layer is put into a single magnetic domain state and fixed by an exchange anisotropic magnetic field, which is produced at the interface between the antiferromagnetic layer and the pinned magnetic layer. The magnetization of the free magnetic layer is aligned in a direction which intersects the direction of magnetization of the pinned magnetic layer, by the effect of bias layers that are formed on both sides of the free magnetic layer.

Alloy films such as an Fe—Mn (Iron-Manganese) alloy film, Ni—Mn (Nickel-Manganese) alloy film and a Pt—Mn (Platinum-Manganese) alloy film are generally usable as the material of the antiferromagnetic layer, among which the Pt—Mn alloy film are attracting attention due to its advantages such as a high blocking temperature, superior corrosion resistance, and so forth. It has been recognized that, when a Pt—Mn alloy film is used as the material of a ferromagnetic layer, the film as deposited has a crystalline structure composed of face-centered cubic lattice in which atoms are positioned in an irregular manner.

In order that a large exchange coupling magnetic field is generated between a ferromagnetic layer and an antiferromagnetic layer after deposition, it is necessary that the crystalline structure of the antiferromagnetic layer be transformed from face-centered cubic lattice as disordered phase to a CuAu—I face-centered square lattice as an ordered phase. Such a transformation can be effected by a heat treatment.

It has been recognized also that a Pt—Mn alloy of bulk type is easily transformed into CuAu—I face-centered square lattice to maximize the antiferromagnetic properties when the ratio of content between Pt and Mn is 50:50 in terms of atomic percent (at %). With this knowledge, the present inventors have made spin valve thin-film device having an antiferromagnetic layer composed of a Pt—Mn alloy, the content ratio between Pt and Mn being set substantially at 50:50, and measured the strength of the exchange magnetic field generated between the antiferromagnetic layer and a ferromagnetic layer. As a result, the inventors found that the strength of the exchange coupling magnetic field is still unsatisfactory, despite the use of the composition ratio between Pt and Mn which is ideal for a bulk phase recrystalization. This is attributable to the fact that the transformation from a disordered lattice to an ordered lattice is still insufficient despite of the heat treatment.

SUMMARY OF THE INVENTION

An object of the present invention is to provide an exchange coupling film capable of generating a large exchange coupling magnetic field when an element X, wherein X is a platinum-group element and Mn comprise an antiferromagnetic layer. A further object is to provide magnetoresistive sensor using such an exchange coupling film and also a thin-film magnetic head incorporating such a magnetoresistive sensor, thereby overcoming the above-described problems of the prior art.

To this end, according to the present invention, there is provided an exchange coupling film comprising: an antiferromagnetic layer; and a ferromagnetic layer in contact with the antiferromagnetic layer such that an exchange coupling magnetic field is produced at the interface between the antiferromagnetic layer and the ferromagnetic layer to fix the magnetization of the ferromagnetic layer in a predetermined direction, wherein the antiferromagnetic layer is made of an antiferromagnetic material containing an element X and Mn, where the element X is from the group of elements consisting of Pt, Pd, Ir, Rh, Ru, and Os, and combinations thereof and combinations thereof, and wherein the crystalline structure of at least part of the antiferromagnetic layer has a CuAu0I type face-centered square ordered lattice.

The exchange film in accordance with the invention is a structure which is obtained through a heat treatment after deposition of the antiferromagnetic layer and the ferromagnetic layer.

One of the features of the present invention is that the antiferromagnetic layer has a region in which the ratio of the atomic percent of the element X to Mn increases towards the ferromagnetic layer. The presence of such a region indicates that the antiferromagnetic layer has been properly transformed from a disordered lattice to an ordered lattice without being restrained by factors, such as the crystalline structure of the ferromagnetic layer, at the interface between the antiferromagnetic layer and the ferromagnetic layer. Thus, the exchange coupling film in accordance with the present invention produces a greater exchange coupling magnetic field than those or the prior art.

The creation of this transformed region results from a production process which will be described later. Thus, in accordance with the present invention, the antiferromagnetic layer has a region in which the ratio of the atomic percent of the element X to Mn increases in a direction towards the ferromagnetic layer, and the crystalline structure of at least part of the antiferromagnetic layer has an ordered lattice. An important factor to these features is the structure of the antiferromagnetic layer as deposited, i.e., in the state prior to the heat treatment.

In accordance with the present invention, the antiferromagnetic layer is formed, for example, as follows. An ordered crystalline structure is readily formed and the antiferromagnetic properties are maximized when the ratio of Pt and Mn is set to 50:50. Such a composition ratio, however, serves to suppress the creation of a non-aligned crystal lattice state at the interface between ferromagnetic layer and the antiferromagnetic layer, resulting in an insufficient transformation from a disordered lattice to an ordered lattice under heat treatment and, hence, insufficient strength of the exchange coupling magnetic field.

Pt contents below about 50 at % tend to hamper transformation into an ordered lattice when heat-treated and, accordingly, make it difficult to achieve satisfactory antiferromagnetic properties. In addition, a strongly aligned crystal lattice state is developed at the interface between the antiferromagnetic layer and the ferromagnetic layer, so that the resultant exchange coupling magnetic field is unacceptably small. Conversely, Pt contents exceeding about 50 at % also hamper transformation to an ordered lattice when the antiferromagnetic layer is formed by heat treatment, so that only very small exchange coupling magnetic field is about 50 at % also hamper transformation to an ordered lattice when the antiferromagnetic layer is formed by heat treatment, so that only very small exchange coupling magnetic field is obtainable. Although such contents promote creation of non-aligned crystal lattice state at the interface between the antiferromagnetic layer and the ferromagnetic layer.

In accordance with the present invention, therefore, the antiferromagnetic layer is deposited to include a comparatively thin alloy film (referred to as "first antiferromagnetic layer"), which contacts the ferromagnetic layer and which is rich in Pt to facilitate creation of a non-aligned crystal lattice state at the interface adjacent to the ferromagnetic layer, and a Pt—Mn alloy film (referred to as "second antiferromagnetic layer") on the ferromagnetic layer through the intermediary of the first antiferromagnetic layer. The Pt—Mn alloy has a composition that permits easy transformation from a disordered lattice to an ordered lattice and has a thickness greater than that of the first antiferromagnetic layer.

Thus, in the Pt-enriched first antiferromagnetic layer at the interface adjacent to the ferromagnetic layer in the as-deposited structure prior to the heat treatment, the crystalline structure of the antiferromagnetic layer is not restrained by the structure of the ferromagnetic layer. Accordingly, the second antiferromagnetic layer, having a composition easy for transformation from a disordered lattice to an ordered lattice, is properly transformed as a result of the heat treatment. When the transformation is started by a heat treatment, diffusion of elements also takes place between the first and second antiferromagnetic layers. Accordingly, the Pt content in the region that has been constituted by the first antiferromagnetic layer is changed from that in the as-deposited state to create a composition which is rather easy to transform into an ordered lattice, with the result that the transformation takes place also in that region.

In the as-deposited state of the structure prior to heat treatment, the Pt-enriched first antiferromagnetic layer is interposed between the ferromagnetic layer and the second antiferromagnetic layer, where the second antiferromagnetic layer has an ideal composition that is easy to transform into CuAu—I face-centered square ordered lattice. Therefore, when a heat treatment is conducted, the crystalline structure of the antiferromagnetic layer can be sufficiently transformed from a disordered lattice to an ordered lattice, without being restrained by the factors such as crystalline structure of the ferromagnetic layer. Accordingly, an exchange coupling magnetic field greater than those of known devices can be obtained. Consequently, a composition modulation is effected by the heat treatment, so that the exchange coupling film, as heat-treated, has a region in which the ratio of the atomic percent of the element X increases in a direction towards the ferromagnetic layer. In addition, the crystalline structure of at least part of the antiferromagnetic layer has been changed to CuAu—I type face-centered square ordered lattice.

In accordance with the present invention, the antiferromagnetic layer may be made of an antiferromagnetic material containing an element X, an element X' and Mn, where the element X is selected from the group of elements consisting of Pt, Pd, Ir, Rh, Ru, and Os, and combinations thereof and the element X' is selected from the group of elements consisting of Ne, Ar, Kr, Xe, Be, B, C, N, Mg, Al, Si, P, Ti, V, Cr, Fe, 00, Ni, Cu, Zn, Ga, Ge, Zr, Nb, Mo, Ag, Cd, Sn, Hf, Ta, W, Re, Au, Pb and a rare earth element and combinations thereof. Also, the antiferromagnetic layer has a region in which the ratio of the atomic percent of the elements X+X' to Mn increases in a direction towards the ferromagnetic layer.

Preferably, the antiferromagnetic material containing an element X, an element X' and Mn is an interstitial solid solution in which the element X' has invaded and resides in the interstices of a space lattice constituted by the element X and Mn, or a substitutive solid solution in which part of the lattice points of a crystal lattice constituted by the element X and Mn has been substituted by the element X'. The antiferromagnetic layer formed of an X—Mn—X' alloy in the form of interstitial or substitutive solid solution can have a greater lattice constant than an X—Mn alloy. This results in a greater difference in the lattice constant between the antiferromagnetic layer and the ferromagnetic layer, thus making it possible to maintain appropriate non-aligned crystal lattice state at the interface. The antiferromagnetic layer and the ferromagnetic layer may have different lattice constants or different crystalline orientations over at least part of the interface.

It is also preferred that a non-aligned crystal lattice state is created over at least part of the above-mentioned interface. The term "non-aligned crystal lattice state" is used here to mean a state in which atoms in the antiferromagnetic layer and atoms in the ferromagnetic layer do not exactly correspond in a 1:1 fashion at the interface between the antiferromagnetic layer and the ferromagnetic layer.

Such a non-aligned crystal lattice state serves to reduce any restraint posed on the antiferromagnetic layer by the factors such as crystalline structure of the ferromagnetic layer. The non-aligned crystal lattice state contributes to realization of proper transformation from a disordered lattice to an ordered lattice, thereby making it possible to obtain a large exchange coupling magnetic field. In accordance with the present invention, the antiferromagnetic layer and the ferromagnetic layer have different lattice constants or different crystalline orientations over at least part of the interface therebetween. Such differences tend to cause the non-aligned crystal lattice state, thus offering a large exchange coupling magnetic field.

When the antiferromagnetic layer and the ferromagnetic layer have different crystalline orientations, assuming that the (111) planes of the ferromagnetic layers have been substantially oriented in parallel with the aforementioned interface, the degree of orientation of the (111) planes of the antiferromagnetic layer is smaller than that of the ferromagnetic layer. Alternatively, the (111) planes of the antiferromagnetic layer are not oriented at all. Likewise, assuming that the (111) planes of the antiferromagnetic layers have been substantially oriented in parallel with the aforementioned interface, the degree of orientation of the (111) planes of the ferromagnetic layer is smaller than that of the ferromagnetic layer, or, alternatively, the (111) planes are not oriented. Alternatively, the degrees of orientations of the (111) planes of both the antiferromagnetic layer and the ferromagnetic layer in directions parallel to the interface are small or these planes are not oriented, so that the crystal planes other than (111) planes are substantially oriented in parallel with the above-mentioned interface. Accordingly, a difference is created in the crystal orientation between the antiferromagnetic layer and the ferromagnetic layer.

The crystalline orientations are controllable by selectively using an underlying layer or adjusting values of factors such as composition ratios and electric power and gas pressure during the sputter deposition process, and suitably selecting the sequence of deposition of the films.

Preferably, assuming an imaginary boundary within the thickness of the antiferromagnetic layer in parallel with the interface so as to divide the antiferromagnetic layer into a first region between the imaginary boundary and the interface and a second region between the imaginary boundary and the face surface of the antiferromagnetic layer opposite to the interface, the antiferromagnetic has a region in which the ratio linearly or non-linearly increases from the second region towards the first region across the imaginary boundary. It is also preferred that the antiferromagnetic layer has a region in which the composition ratio (atomic percent) of the element X or the elements X+X' increases in a direction towards the ferromagnetic layer. It is also preferred that the antiferromagnetic layer has a region which is in proximity to the interface and in which the composition ratio (atomic percent) of the element X or the elements X+X' decreases in a direction towards the ferromagnetic layer.

More precisely, the above-described features mean that the region in which the atomic percent of the element X or the elements X+X' is maximized is not located near the aforementioned interface. Rather, there is a region in which the atomic percent of the element X or the elements X+X' is increased starting from the interface towards the side opposite to the interface. Thus, the atomic percent of the element X or the elements X+X' is maximized at a location which is spaced a predetermined distance in the thicknesswise direction from the interface.

The fact that the atomic percent of the element X or the elements X+X' is not maximized in a region near the interface is attributable to the fact that a diffusion of elements takes place between the antiferromagnetic layer (this is the "first antiferromagnetic layer" in the as-deposited state) and the ferromagnetic layer, as a result of the heat treatment which is conducted after the deposition. Thus, the atomic percent of the element X or the elements X+X' in the region near the interface is smaller in the as-heat-treated state than in the as-deposited state, so that the maximum atomic percent of the element X or the elements X+X' appears at a location spaced apart from the interface in the direction of thickness of the antiferromagnetic layer. The reduced atomic percent of the element X or the elements X+X' in the region near the interface permits proper transformation from a disordered lattice to an ordered lattice also in the region near the interface. Accordingly, a large exchange coupling magnetic field is obtained. Also, the antiferromagnetic layer may have a region that is near the face surface thereof opposite to the interface and in which the composition ratio (atomic percent) of the element X or the elements X+X' decreases in the direction away from the ferromagnetic layer.

Preferably, the composition ratio of the element X or the elements X+X' of the antiferromagnetic layer to the total composition ratio 100 at % of all the elements constituting the antiferromagnetic layer is about 50 at % to about 65 at % and, more preferably, about 50 at % to about 60 at %, in the region near the interface between the antiferromagnetic layer and the ferromagnetic layer.

As will be explained later, in the as-deposited state prior to the heat treatment, an antiferromagnetic layer serving as the first antiferromagnetic layer having a composition ratio of the element X of, for example, about 53 at % to about 65 at % is deposited at the interface adjacent to the ferromagnetic layer. The second antiferromagnetic layer formed on the first antiferromagnetic layer is deposited to have a composition in which the composition ratio of the element X is about 44 at % to about 57 at %.

When the first and second antiferromagnetic layers have composition ratios as specified above are deposited, a diffusion of elements takes place between the first antiferromagnetic layer and the second antiferromagnetic layer. Thus, the composition ratio of the element X may have fallen below 53 at % in the region near the interface after the heat treatment. In accordance with the present invention, therefore, the composition ratio of the element X or the elements X+X' in the state after the heat treatment is preferably about 50 at % to about 65 at %, in the region near the interface.

In accordance with the present invention, it is preferred also that the composition ratio of the element X of the antiferromagnetic layer to the total composition ratio 100 at % of all the elements constituting the antiferromagnetic layer is about 44 at % to about 57 at % and, preferably, about 46 at % but not greater than 55 at %, in the region near the face of the antiferromagnetic layer opposite to the interface adjacent to the ferromagnetic layer.

Preferably, the antiferromagnetic layer has a thickness of at least about 73 Å. According to the present invention, it is possible to obtain a large exchange coupling magnetic field even with the antiferromagnetic layer having such a small thickness.

In accordance with the present invention, there is provided also an exchange coupling film comprising: an antiferromagnetic layer; and a ferromagnetic layer formed such that an exchange coupling magnetic field is produced at the interface between the antiferromagnetic layer and the ferromagnetic layer, wherein the antiferromagnetic layer is made of an antiferromagnetic material containing an element X and Mn, where the element X is selected from the group of elements consisting of Pt, Pd, Ir, Rh, Ru, and Os, and combinations thereof; wherein the antiferromagnetic layer has a region in which the ratio of the atomic percent of the element X or the elements X+X' to Mn increases in a direction towards the ferromagnetic layer starting from a thicknesswise central region, and a region in which the ratio of the atomic percent of the element X or the elements X+X' to Mn increases in the direction away from the ferromagnetic layer starting from the thicknesswise central region; and wherein the crystalline structure of at least part of the antiferromagnetic layer has a CuAu—I type face-centered square ordered lattice. The exchange coupling film as set forth above is a structure obtained through a heat treatment which is executed after the deposition of the layers.

In accordance with the present invention, the antiferromagnetic layer has a region in which the ratio of the atomic percent of the element X or the elements X+X' to Mn increases in a direction towards the ferromagnetic layer starting from a thicknesswise central region, and a region in which the ratio of the atomic percent of the element X or the elements X+X' to Mn increases in the direction away from the ferromagnetic layer starting from the thicknesswise central region. In addition, the crystalline structure of at least a portion of the antiferromagnetic layer has a CuAu—I type face-centered square ordered lattice.

The presence of these regions where a change or modulation of composition occurs is derived from the production process that will be described later. In the present invention, by virtue of the presence of these regions, the transformation takes place properly in the antiferromagnetic layer over its entirety, without being restrained by the crystalline structure of the ferromagnetic layer at the interface adjacent to the ferromagnetic layer and without being restrained by the crystalline structure of the layer contacting the antiferromagnetic layer at the opposite interface. Accordingly, the crystalline structure of part of the antiferromagnetic layer is changed into CuAu—I face-centered square ordered lattice structure, Thus, in accordance with the present invention, the antiferromagnetic layer after the heat treatment has a region in which the ratio of the atomic percent of the element X to Mn increases in a direction towards the ferromagnetic layer, and a region in which the above-mentioned ratio increases in the direction away from the ferromagnetic layer, and the crystalline structure of at least part of the antiferromagnetic layer has ordered lattice. An important factor to these features is the structure of the antiferromagnetic layer as deposited, i.e., in the state prior to the heat treatment.

In accordance with the present invention, the antiferromagnetic layer is formed, for example, as follows. An ordered crystalline structure is easily formed and the antiferromagnetic properties are maximized when the ratio of content between Pt and Mn is set to 50:50. Such a composition ratio, however, serves to suppress creation of non-aligned crystal lattice state at the interface adjacent to the ferromagnetic layer, resulting in an insufficient transformation from a disordered lattice to an ordered lattice under heat treatment and, hence, insufficient strength of the exchange coupling magnetic field. Pt contents below 50 at % tend to hamper transformation into ordered lattice when heat-treated and, accordingly, make it difficult to achieve satisfactory antiferromagnetic properties. In addition, a strongly aligned state is developed at the interface between the antiferromagnetic layer and the ferromagnetic layer, so that the resultant exchange coupling magnetic field is unacceptably small. Conversely, Pt contents exceeding 50 at % also hampers transformation to an ordered lattice when the antiferromagnetic layer is formed by heat treatment, so that only a very small exchange coupling magnetic field is obtainable even though such contents promote creation of non-aligned crystal lattice state at the interface between the antiferromagnetic layer and the ferromagnetic layer.

In accordance with the present invention, therefore, the antiferromagnetic layer is deposited to include a comparatively thin alloy film (referred to as "first antiferromagnetic layer") which contacts the ferromagnetic layer and which is rich in Pt to facilitate creation of a non-aligned crystal lattice state at the interface adjacent to the ferromagnetic layer. A Pt—Mn alloy film (referred to as "second antiferromagnetic layer") is formed on the first antiferromagnetic layer where the Pt—Mn alloy has a composition that permits easy transformation from a disordered lattice to an ordered lattice and has a thickness greater than that of the first antiferromagnetic layer. In addition, a Pt-enriched third antiferromagnetic layer is formed in contact with the second antiferromagnetic layer.

Thus, in the Pt-enriched first antiferromagnetic layer at the interface adjacent to the ferromagnetic layer in the as-deposited structure prior to the heat treatment, the crystalline structure of the antiferromagnetic layer is not restrained by the structure of the ferromagnetic layer. Accordingly, the second antiferromagnetic layer, having a composition easy for transformation from a disordered lattice to an ordered lattice, is properly transformed as a result of the heat treatment. When the transformation is started by a heat treatment, diffusion of elements also takes place between the first and second antiferromagnetic layers, as well as between the third antiferromagnetic layer and the second antiferromagnetic layer. Accordingly, the Pt content in the region that has been constituted by the first antiferromagnetic layer, as well as in the region that has been constituted by the third antiferromagnetic layer, is changed from that in the as-deposited state to create a composition which is rather easy to transform into an ordered lattice, with the result that the transformation takes place also in the regions that have been constituted by the first and third antiferromagnetic layers in the as-deposited state.

In the as-deposited state of the structure prior to heat treatment, the Pt-enriched first and third antiferromagnetic layers are formed to sandwich therebetween the second antiferromagnetic layer having an ideal composition that is easy to be transformed into CuAu—I face-centered square ordered lattice. Therefore, when a heat treatment is conducted, the crystalline structure of the antiferromagnetic layer can be sufficiently transformed from a disordered lattice to an ordered lattice. Accordingly an exchange coupling magnetic field greater than those of known devices can be obtained.

In the heat-treated exchange coupling film formed as described above, a composition modulation has occurred, so that a region exists in which the ratio of the atomic percent of the element X increases in a direction towards the ferromagnetic layer starting from a thicknesswise central region, and a region in which the ratio increases in a direction towards the side opposite to the ferromagnetic layer. In addition, the crystalline structure of at least part of the antiferromagnetic layer has a CuAu—I type face-centered square ordered lattice.

The Pt-enriched third antiferromagnetic layer, which is deposited in contact with the second antiferromagnetic layer, serves to promote proper ordered transformation also in the region of the antiferromagnetic layer opposite to the ferromagnetic layer, thus ensuring a proper transformation over the entirety of the antiferromagnetic layer. Accordingly, a large exchange coupling magnetic field can be obtained.

The layer deposited to the side of the antiferromagnetic layer opposite to the ferromagnetic layer may be a non-magnetic underlying layer, a protective layer, or a seed layer. Factors such as the crystalline structure of such a layer may impede an ordered transformation of the antiferromagnetic layer, leading to a reduction in the exchange coupling magnetic field. In this invention, the Pt-enriched third antiferromagnetic layer is deposited on the above-mentioned side of the antiferromagnetic layer, thereby promoting ordered transformation of the antiferromagnetic layer, while avoiding the influence of the above-mentioned crystalline structure. Accordingly, a large exchange coupling magnetic field is obtained.

In accordance with the present invention, there is provided also an exchange coupling film comprising: an antiferromagnetic layer; and a ferromagnetic layer formed such that an exchange coupling magnetic field is produced at the interface between the antiferromagnetic layer and the ferromagnetic layer, wherein the antiferromagnetic layer is made of an antiferromagnetic material containing an element X, an element X' and Mn, where the element X is selected from the group of elements consisting of Pt, Pd, Ir, Rh, Ru, and Os, and combinations thereof, and the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof; wherein the antiferromagnetic layer has a region in which the ratio of the atomic percent of the elements X+X' to Mn increases in a direction towards the ferromagnetic layer starting from a thicknesswise central region and a region in which the ratio of the atomic percent of the elements X+X' to Mn increases in the direction away from the ferromagnetic layer starting from the thicknesswise central region; and wherein the crystalline structure of at least a portion of the antiferromagnetic layer has a CuAu—I type face-centered square ordered lattice.

In this aspect of the invention, the antiferromagnetic layer is made from an antiferromagnetic material containing an element X, an element X' and Mn. In this aspect also, the antiferromagnetic layer is formed of the above-described three layers, and the composition ratio of the element X+X' in the second antiferromagnetic layer is set to be smaller than those in the first and third antiferromagnetic layers. A heat treatment after the deposition triggers transformation in the second antiferromagnetic layer and transformation takes place also in the first and third antiferromagnetic layer. Consequently, transformation to ordered lattice structure occurs over the entirety of the antiferromagnetic layer. Accordingly, an exchange coupling magnetic field greater than those obtainable with known devices can be obtained.

In the state after the heat treatment, the antiferromagnetic layer has a region in which the ratio of the atomic percent of the elements X+X' to Mn increases in a direction towards the ferromagnetic layer starting from the thicknesswise central region, and a region in which the above-mentioned ratio increases in the direction away from the ferromagnetic layer. In addition, the crystalline structure of at least part of the antiferromagnetic layer has CuAu—I type face-centered square ordered lattice.

Preferably, the alloy material containing an element X, an element X' and Mn is an interstitial solid solution in which the element X' has invaded and resides in the interstices of a space lattice constituted by the element X and Mn, or a substitutive solid solution in which part of the lattice points of a crystal lattice constituted by the element X and Mn are substituted by the element X'.

It is also preferred that the above-described exchange coupling lattice further comprises a seed layer formed on the side of the antiferromagnetic layer opposite to the interface adjacent to the ferromagnetic layer, the seed layer having face-centered cubic crystals with substantially oriented (111) planes, the antiferromagnetic layer and the ferromagnetic layer having crystalline orientations with the (111) planes substantially oriented in parallel with the interface.

The seed layer serves to promote the substantial orientation of the crystalline structures of the antiferromagnetic layer and the ferromagnetic layer, thus allowing the crystal grains to grow large, thereby offering a large ratio of resistance variation. Preferably, the antiferromagnetic layer and the seed layer have different lattice constants over at least part of the interface therebetween.

It is also preferred that a non-aligned crystal lattice state is created over at least part of the interface between the antiferromagnetic layer and the seed layer. Such features are attained by, for example, a process in which the antiferromagnetic layer is formed by depositing three films, such that the Pt-enriched third antiferromagnetic layer is formed in the portion to be contacted by the seed layer. In the as-deposited state, a non-aligned crystal lattice state exists over at least part of the interface between the third antiferromagnetic layer and the seed layer. Therefore, when the heat treatment is conducted, transformation into ordered lattice structure properly takes place in the antiferromagnetic layer, while the non-aligned crystal lattice state is maintained at the interface between the antiferromagnetic layer and the seed layer. Accordingly, an exchange coupling magnetic field greater than those obtainable with known devices can be achieved.

Preferably, the seed layer is formed of an Ni—Fe alloy or an Ni—Fe—Y alloy, wherein Y is an element selected from the group consisting of Cr, Rh, Ta, Hf, Nb, Zr, and Ti and combinations thereof.

It is also preferred that the seed layer is a non-magnetic layer. It is important that the seed layer has a large specific resistance. High specific resistance of the seed layer suppresses shunting of the sense current into the seed layer, thereby offering advantages such as increase in the resistance variation ratio and reduction in the Barkhausen noise.

Preferably, the exchange coupling film is formed by sequentially depositing, on an underlying layer, the seed layer, the antiferromagnetic layer, and the ferromagnetic layer. The underlying layer is formed of at least one element selected from the group consisting of Ta, Hf, Nb, Zr, Ti, Mo and W.

A layer formed of elements selected from the group consisting of Ta, Hf, Nb, Zr, Ti, Mo and W and combinations thereof may be formed on the side of the antiferromagnetic layer opposite to the interface adjacent to the ferromagnetic layer.

In accordance with the invention, it is preferred that, assuming a first imaginary boundary at the side of the thicknesswise center of the antiferromagnetic layer adjacent to the face surface of the antiferromagnetic layer opposite to the interface and a second imaginary boundary at the side of the thicknesswise center adjacent to the interface, the ratio is greater in a first region between the face surface of the antiferromagnetic layer and the first imaginary boundary and in a third region between the interface adjacent to the ferromagnetic layer and the second imaginary boundary than in a second region between the first and second imaginary boundaries. Also, the ratio linearly or non-linearly increases from the second region towards the first region across the first imaginary boundary and from the second region towards the third region across the second imaginary boundary.

The antiferromagnetic layer preferably includes a region in which the atomic percent of the element X increases in a direction towards the interface adjacent to the ferromagnetic layer starting from a predetermined thicknesswise central region, and a region in which the atomic percent of the element X increases in a direction towards the side opposite to the interface starting from the predetermined thicknesswise central region.

It is also preferred that the antiferromagnetic layer includes a region in which the atomic percent of the element X decreases in a direction towards the interface adjacent to the ferromagnetic layer, and a region in which the atomic percent of the element X decreases in a direction towards the side opposite to the interface.

More precisely, the above-described features mean that the region in which the atomic percent of the element X or the elements X+X' is maximized is not located near the aforementioned interface. Rather, there is a region in which the atomic percent of the element X or the elements X+X' is increased starting from the interface towards the side opposite to the interface. Thus, the atomic percent of the element X or the elements X+X' is maximized at a location which is spaced a predetermined distance in the thicknesswise direction from the interface.

The fact that the atomic percent of the element X or the elements X+X' is not maximized in a region near the interface is attributable to the fact that a diffusion of elements takes place at the interface between the antiferromagnetic layer and the ferromagnetic layer, as well as at the interface between the antiferromagnetic layer and the layer formed on the side opposite to the ferromagnetic layer, as a result of the heat treatment which is conducted after the deposition. Thus, the atomic percent of the element X or the elements X+X' in the region near the interface is smaller in the as-heat-treated state than in the as-deposited state, so that the maximum atomic percent of the element X or the elements X+X' appears at a location spaced apart from the interface in the direction of thickness of the antiferromagnetic layer. The reduced atomic percent of the element X or the elements X+X' in the region near the interface permits proper transformation from a disordered lattice to an ordered lattice also in the region near the interface. Accordingly, a large exchange coupling magnetic field is obtained.

Preferably, the composition ratio of the element X or the elements X+X' of the antiferromagnetic layer to the total composition ratio 100 at % of all the elements constituting each of the portions of the antiferromagnetic layer near the interface adjacent to the ferromagnetic layer and near the side opposite to the interface is about 50 at % to about 65 at %, in the region near the interface between the antiferromagnetic layer and the ferromagnetic layer, as well as at the side opposite to the above-mentioned interface.

As will be explained later, in the as-deposited state prior to the heat treatment, an antiferromagnetic layer serving as the first antiferromagnetic layer having a composition ratio of the element X or the elements X+X' of, for example, about 53 at % to about 65 at % is deposited at the interface adjacent to the ferromagnetic layer, and an antiferromagnetic layer serving as the third antiferromagnetic layer and having a composition ratio of the element X or the elements X+X' of, for example, about 53 at % to about 65 at % is deposited on the first antiferromagnetic layer through the intermediary of a second antiferromagnetic layer. The second antiferromagnetic layer formed between the first antiferromagnetic layer and the third antiferromagnetic layer has a composition in which the composition ratio of the element X or the elements X+X' is about 44 at % to about 57 at %.

When the first, second and third antiferromagnetic layers having composition ratios as specified above are deposited, a diffusion of elements takes place between the first antiferromagnetic layer and the ferromagnetic layer, as well as between the third antiferromagnetic layer and the layer formed on the side of the antiferromagnetic layer opposite to the ferromagnetic layer. Thus, the composition ratio of the element X or the elements X+X' may have fallen below 53 at % in the region near each interface, in the state after the heat treatment. In accordance with the present invention, therefore, the composition ratio of the element X or the elements X+X' in the state after the heat treatment is preferably about 50 at % to about 65 at %, in the region near the interface.

Preferably, the antiferromagnetic layer has a thickness of at least about 76 Å. In accordance with the present invention, it is possible to achieve a large exchange coupling film, even with the antiferromagnetic layer having such a small thickness.

The antiferromagnetic layer and the ferromagnetic layer may have different lattice constants, or different crystalline orientations, over at least part of the interface therebetween. In this invention, the antiferromagnetic layer and the ferromagnetic layer have the same crystalline orientation when the seed layer is used. Preferably, a non-aligned crystal lattice state exists over at least part of the above-mentioned interface. The presence of such a non-aligned crystal lattice state promotes the transformation of the antiferromagnetic layer into an ordered lattice, thus making it possible to obtain a large exchange coupling magnetic field.

When the antiferromagnetic layer and the ferromagnetic layer have different crystalline orientations, assuming that the (111) planes of the ferromagnetic layers have been substantially oriented in parallel with the aforementioned interface, the degree of orientation of the (111) planes of the antiferromagnetic layer is smaller than that of the ferromagnetic layer. Alternatively, the (111) planes of the antiferromagnetic layer are not oriented. Likewise, assuming that the (111) planes of the antiferromagnetic layers have been substantially oriented in parallel with the aforementioned interface, the degree of orientation of the (111) planes of the ferromagnetic layer is smaller than that of the ferromagnetic layer, or the (111) planes are not oriented.

Alternatively, the degrees of orientations of the (111) planes of both the antiferromagnetic layer and the ferromagnetic layer in directions parallel to the interface are small or these planes are not oriented, so that the crystal planes other than (111) planes are substantially oriented in parallel with the above-mentioned interface. Accordingly, a difference is created in the crystal orientation between the antiferromagnetic layer and the ferromagnetic layer. The crystalline orientations are controllable by selectively using an underlying layer or adjusting values of factors such as composition ratios and electric power and gas pressure during the sputtering, and suitably selecting the sequence of deposition of the films.

The exchange coupling film of the present invention having the above-described features is usable in a variety of types of magnetoresistive sensor. For example, the present invention provides a magnetoresistive sensor comprising: an antiferromagnetic layer; a pinned magnetic layer in contact with the antiferromagnetic layer such that an exchange coupling magnetic field is produced at the interface between the antiferromagnetic layer and the pinned magnetic layer to fix the magnetization of the pinned magnetic layer in a predetermined direction; a non-magnetic intermediate layer between the pinned magnetic layer and a free magnetic layer; and a bias layer which aligns the direction of magnetization of the free magnetic layer in a direction intersecting the direction of magnetization of the pinned magnetic layer; wherein the antiferromagnetic layer and the pinned magnetic layer comprise the exchange coupling film described above.

The present invention also provides a magnetoresistive sensor comprising: an antiferromagnetic layer; and a pinned magnetic layer in contact with the antiferromagnetic layer such that an exchange coupling magnetic field is produced at the interface between the antiferromagnetic layer and the pinned magnetic layer to fix the magnetization of the pinned magnetic layer in a predetermined direction; a non-magnetic intermediate layer between the pinned magnetic layer and a free magnetic layer; and an antiferromagnetic exchange bias layer adjacent to one of an upper side or a lower side of the free magnetic layer and having portions spaced from each other in a track width direction; wherein the exchange bias layer and the free magnetic layer comprise the exchange coupling film described above; and wherein the magnetization of the free magnetic layer is fixed in a predetermined direction.

The present invention also provides a magnetoresistive sensor comprising: a free magnetic layer; first and second non-magnetic intermediate layers formed on upper and lower sides of the free magnetic layer, respectively; first and second pinned magnetic layers, wherein the first pinned magnetic layer is formed on an upper side of the first non-magnetic intermediate layers and the second pinned magnetic layer on a lower side of the second non-magnetic intermediate layer; first and second antiferromagnetic layers, wherein the first ferromagnetic layer is formed on an upper side of the first pinned magnetic layers and the second ferromagnetic layer on a lower side of the second pinned magnetic layer, the first and second antiferromagnetic layers serving to fix the directions of magnetization of the first and second pinned magnetic layers, respectively, by exchange anisotropic magnetic fields; and a bias layer adjacent to sides of the free magnetic layer which aligns the direction of magnetization of the free magnetic layer to a direction that intersects the directions of the pinned magnetic layers; wherein at least one of the first antiferromagnetic layer and the first pinned magnetic layer or the second antiferromagnetic layer and second pinned magnetic layer are formed of the exchange coupling film described above.

The present invention also provides a magnetoresistive sensor comprising: a non-magnetic layer; a magnetoresistive layer and a soft magnetic layer separated by the non-magnetic layer; and an antiferromagnetic layer formed on one of an upper side or a lower side of the magnetoresistive layer and having portions spaced from each other in a track width direction; wherein the antiferromagnetic layer and the magnetoresistive layer and the magnetoresistive layer comprise the exchange coupling film described above.

The present invention also provides a thin-film magnetic head having shield layers formed on gap layers adjacent to the upper and lower sides of the magnetoresistive sensor.

DESCRIPTION OF THE PREFERRED EMBODIMENTS

Figure 1:
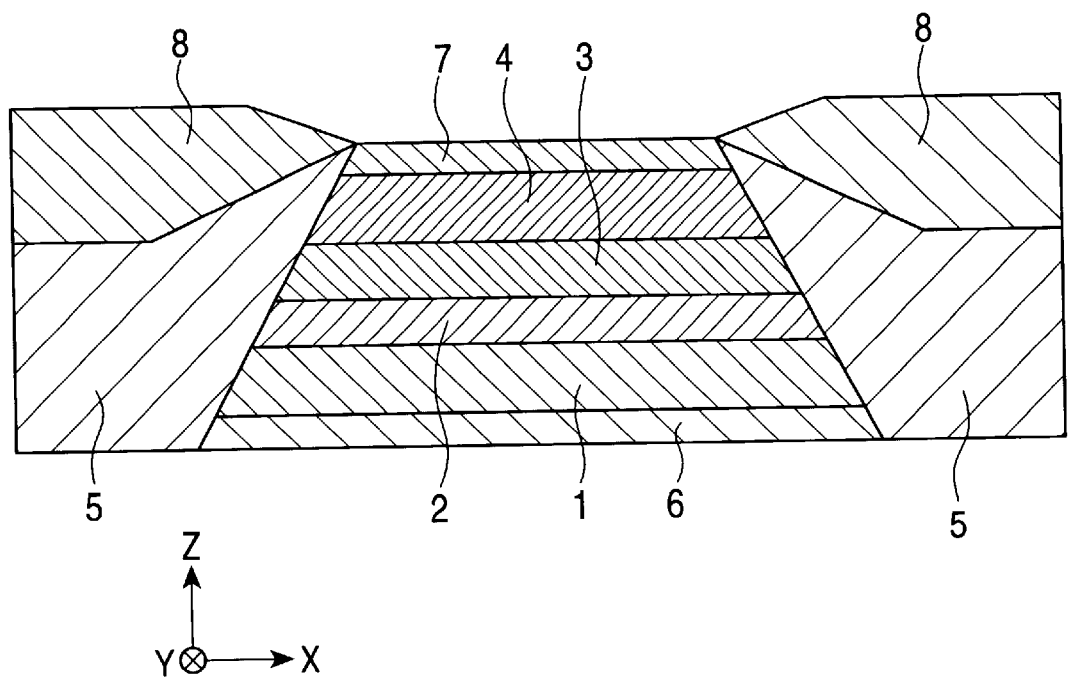
FIG. 1 is a cross-sectional view of the structure of a single spin valve type magnetoresistive sensor in accordance with a first embodiment of the present invention, as viewed from the same side as an ABS surface.

FIG. 1 is a cross-sectional view of a single spin valve type magnetoresistive sensor in accordance with a first embodiment of the present invention, as viewed from the same side as the ABS surface. In this Figure, only the central portion of the device which extends in the X direction is shown in cross-sectional view.

This single spin valve type magnetoresistive sensor is provided on, for example, a trailing side end of a floating slider of a hard disk device, and is intended to detect, for example, the recording magnetic fields on the hard disk. A recording medium such as the hard disk moves in a Z direction, while the direction of the magnetic field leaking from the hard disk is indicated by Y.

Shown at the bottom of FIG. 1 is an underlying layer 6 which is formed of a non-magnetic material including selected from the group consisting of Ta, Hf, Nb, Zr, Ti, Mo, and W and combinations thereof. On the underlying layer 6 are deposited a free magnetic layer 1, a non-magnetic intermediate layer 2, a pinned magnetic layer 3, and an antiferromagnetic layer 4. The antiferromagnetic layer 4 is overlain by a protective layer 7 made from a non-magnetic material including elements selected from the group consisting of Ta, Hf, Nb, Zr, Ti, Mo, and W and combinations thereof.

As shown in FIG. 1, a hard bias layer 5 is formed on each end of the laminate composed of the six layers of from the underlying layer 6 to the protective layers 7. A conductive layer 8 is deposited on each portion of the hard bias layer 5. In accordance with the present invention, each of the free magnetic layer 1 and the pinned magnetic layer 3 is made from, for example, a Ni—Fe alloy, a Co—Fe alloy, Co, or a Co—Ni—Fe alloy.

In the structure shown in FIG. 1, the free magnetic layer 1 is formed of a single layer. This, however, is only illustrative and the free magnetic layer 1 may be multi-layered. For example, the free magnetic layer 1 may be formed of a laminate composed of a Ni—Fe alloy and Co layers.

The non-magnetic intermediate layer 2 interposed between the free magnetic layer 1 and the pinned magnetic layer 3 is formed of, for example, Cu. When the magnetoresistive sensor embodying the present invention is a tunnel-type magnetoresistive sensor (TMR sensor) using the tunneling effect, the non-magnetic intermediate layer 2 is made from an insulating material such as $Al_2O_3$. The hard bias layer 5 is formed of, for example, a Co—Pt (cobalt-platinum) alloy or a Co—Cr—Pt (cobalt-chromium-platinum) alloy. The conductive layer 8, 8 is made from Cu (copper), W (tungsten), or the like. In case of the tunnel-type magnetoresistive sensor, the conductive layer 8 is formed both on the lower side of the free magnetic layer 1 and the upper side of the antiferromagnetic layer 4.

A description will now be given of a method of producing a magnetoresistive sensor embodying the present invention, focusing mainly on an exchange coupling film constituted by the antiferromagnetic layer 4 and the ferromagnetic layer (pinned magnetic layer 3). Then, a description will follow as to the features of the structure of the magnetoresistive sensor produced by the described method.

Figure 2:
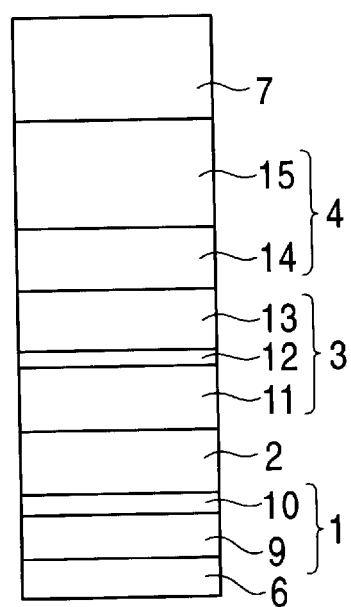
FIG. 2 is a schematic illustration of a laminate structure in accordance with the present invention in a state after deposition and prior to a heat treatment.

FIG. 2 is a partial schematic illustration of a laminate structure which has, as in the structure shown in FIG. 1, the lowermost underlying layer 6 and the uppermost protective layer 7, with the antiferromagnetic layer 4 formed on the upper side of the pinned magnetic layer 3. The laminate structure shown in FIG. 2 is in a state after deposition of the layers, i.e., in a state prior to a heat treatment.

The underlying layer 6 of Ta or the like is formed on a substrate which is not shown. By way of example, the underlying layer 6 is formed to have a thickness of 50 Å or so.

Then, by way of example, a Ni—Fe alloy film 9 is formed on the underlying layer 6, and a Co film 10 is formed on the Ni—Fe alloy film 9. The Ni—Fe alloy film 9 and the Co film 10 in combination form a free magnetic layer 1. By forming the Co film 10 on the side of the free magnetic layer 1 contacting the non-magnetic intermediate layer 2, it is possible to prevent diffusion of the metal elements at the interface between the free magnetic layer 1 and the non-magnetic intermediate layer 2 and, hence, to increase the resistance variation ratio ΔMR. The Ni—Fe alloy film 9 is formed to contain, for example, about 80 at % of Ni and about 20 at % of Fe. The Ni—Fe alloy film 9 has a thickness of about 45 Å, while the Co film 10 has a thickness of about 5 Å.

Then, the non-magnetic intermediate layer 2 of, for example, Cu is formed on the free magnetic layer 1. By way of example, the non-magnetic intermediate layer 2 has a film thickness of about 25 Å.

Then, the pinned magnetic layer 3 is formed on the non-magnetic intermediate layer 2. In this embodiment, the pinned magnetic layer 3 is composed of a triple-layered laminate structure. For example, the pinned magnetic layer 3 is composed of a Co film 11, an Ru film 12, and another Co film. In view of an exchange coupling magnetic field, to be described in more detail below, acting at the interface between the pinned magnetic layer 3 and the antiferromagnetic layer 4, the Co film 11 and the Co film 13 are made to have directions of magnetization that are not parallel. This state is generally referred to as a ferromagnetic state, and serves to stabilize the magnetization of the pinned magnetic layer 3, while achieving a greater exchange coupling magnetic field occurring at the interface between the pinned magnetic layer 3 and the antiferromagnetic layer 4. The Co film 11 is preferably formed to have a thickness of about 20 Å, the Ru film 12 is preferably formed to have a thickness of about 8 Å, and the Co film 13 is preferably formed to have a thickness of about 15 Å.

Then, the antiferromagnetic layer 4 is formed on the pinned magnetic layer 3. As will be seen from FIG. 3, a first antiferromagnetic layer 14 is formed on the pinned magnetic layer 3, and a second antiferromagnetic layer 15 is formed on the first antiferromagnetic layer 14.

In accordance with the present invention, each of the first antiferromagnetic layer 14 and the second antiferromagnetic layer 15 may be formed from an antiferromagnetic material which contains an element X and Mn, wherein X is selected from the group of elements consisting of Pt, Pd, Ir, Rh, Ru, and Os, and combinations thereof.

The X—Mn alloy containing a platinum-group element or elements exhibits superior corrosion resistance and high blocking temperature, as well as superior properties required for an antiferromagnetic material, e.g., a large exchange coupling magnetic field (Hex). Among these platinum group elements, is preferred Pt in the form of, for example, a binary-system Pt—Mn alloy.

In accordance with the present invention, each of the first antiferromagnetic layer 14 and the second antiferromagnetic layer 15 may also be formed from an antiferromagnetic material which contains an element X, an element X' and Mn, wherein the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof.

Preferably, an element that invades and resides in interstices of the space lattice formed by the element X and Mn, or an element which substitutes part of the lattice points of the crystalline structure formed of the element X and Mn, is used as the element X'. A term "solid solution" is used here to mean a solid in which components are uniformly mixed over a wide region.

The formation of an interstitial solid solution or a substitutional solid solution enables the lattice constant of the X—Mn—X' alloy to be greater than the lattice constant of the aforesaid X—Mn alloy, thus creating a greater difference of the lattice constant from the lattice constant of the pinned magnetic layer 3. The difference in lattice constants makes it easy to create a non-aligned crystal lattice state of the interface structure between the antiferromagnetic layer 4 and the pinned magnetic layer 3. When an element which forms a substitutional solid solution is used as the element X', a too large composition ratio of the element X' will impair the antiferromagnetic properties, resulting in a smaller exchange coupling magnetic field at the interface between the pinned magnetic layer 3 and the antiferromagnetic layer 4. In accordance with the present invention, therefore, it is preferred that an inert rare gas element, such as Ne, Ar, Kr, and Xe and combinations thereof, which forms an interstitial solid solution, be used as the element X'. The rare gas element is an inert gas, so that it does not significantly affect the antiferromagnetic properties even when it is present in the film. In addition, Ar is a gas conventionally used as a sputter gas introduced into a sputtering apparatus and, therefore, can easily be contained in the film.

When a gaseous element is used as the element X', it is difficult to have the film containing a large amount of the element X', but a trace amount of element X' contained in the film drastically increases the exchange coupling magnetic field, which is generated as a result of a heat treatment.

In accordance with the present invention, the composition ratio of the element X' preferably ranges from about 0.2 at % to about 10 at % and, more preferably, from about 0.5 at % to about 5 at %. In accordance with the present invention, it is possible to use Pt as the element X and, hence, to use a Pt—Mn—X' alloy.

The element X or elements X+X' which form the first antiferromagnetic layer 14 and the antiferromagnetic layer 15 may be the same, alternatively, or different elements may be used for both these antiferromagnetic layers. For example, it is possible to use, as the material of the first antiferromagnetic layer 14, a Pt—Mn—X' alloy that enables a large lattice constant to be obtained, while using a Pt—Mn alloy as the material of the second antiferromagnetic layer 15.

In the state of the laminate structure after the deposition (prior to the heat treatment) shown in FIG. 2, it is important that the composition ratio (at %) of the element X in the first antiferromagnetic layer 14 is greater than the composition ratio (at %) of the element X in the second antiferromagnetic layer 15. When each of the first antiferromagnetic layer 14 and the second antiferromagnetic layer 15 is made from an X—Mn—X' alloy, the composition ratio (at %) of the elements X+X' in the first antiferromagnetic layer 14 is preferably greater than the composition ratio (at %) of the elements X+X' in the second antiferromagnetic layer 15. When the first antiferromagnetic layer 14 is made of an X—Mn—X' alloy and the second antiferromagnetic layer 15 is made of an X—Mn alloy, the composition ratio (at %) of the elements X+X' in the first antiferromagnetic layer 14 is preferably greater than the composition ratio (at %) of the element X in the second antiferromagnetic layer 15

An important role to be played by the first antiferromagnetic layer 14 is to weaken, when a heat treatment is conducted after deposition of the second antiferromagnetic layer 15 thereon, the restraint force of the crystalline structure of the pinned magnetic layer 3. Weakening the resistant force keeps the second antiferromagnetic layer 15 away from the restraint force, thereby allowing the disordered lattice of the antiferromagnetic layer 14 to be properly transformed into ordered lattice.

In order to reduce the influence of the restraint force produced by the crystalline structure of the pinned magnetic layer 3 at the interface between the antiferromagnetic layer 4 and the pinned magnetic layer 3, it is necessary that the composition ratio of the element X or elements X+X' in the first antiferromagnetic layer is set to a sufficiently large value. A large composition ratio of the element X or elements X+X' tends to cause the composition to deviate from the composition which is ideal for formation of ordered lattice at the heat treatment, but serves to increase the difference from the lattice constant of the pinned magnetic layer. Increase of the difference in the lattice constant offers a greater freedom of the first antiferromagnetic layer 14 and, hence, of the second antiferromagnetic layer 15 from the restraint force produced by the crystalline structure of the pinned magnetic layer 3.

In accordance with the present invention, it is preferred that a non-aligned crystal lattice state is created over at least part of the interface between the first antiferromagnetic layer 14 and the pinned magnetic layer 3. Presence of non-aligned crystal lattice state at this interface further reduces the influence of the crystalline structure of the pinned magnetic layer 3 on the first antiferromagnetic layer 14.

As described above, in a bulk type of Pt—Mn alloy, a CuAu—I type face-centered cubic ordered lattice is most easy to obtain and, therefore, antiferromagnetic properties are most easy to achieve, when the at % ratio of Pt and Mn is about 50:50. Increase of the Pt content beyond about 50 at % in one hand weakens the antiferromagnetic properties but on the other hand enhances the lattice constant of the Pt—Mn alloy, allowing easier creation of the non-aligned crystal lattice state at the interface between the pinned magnetic layer 3 and the antiferromagnetic layer 4.

Preferably, the composition ratio of the element X or the elements X+X' in the second antiferromagnetic layer 15 is at least about 44 at % to about 57 at % and, more preferably, at least about 46 at % to about 55 at %, and most preferably at least about 48 at % but at least about 53 at %.

It is to be understood that the thickness of the first antiferromagnetic layer 14 is not unrestricted. A too small thickness of the first antiferromagnetic layer weakens the non-aligned crystal lattice state at the interface between the first antiferromagnetic layer 14 and the pinned magnetic layer 3, making it impossible to obtain a proper intensity of the exchange coupling magnetic field through the heat treatment. The first antiferromagnetic layer 14 has a composition which inherently is not liable to exhibit transformation from a disordered lattice to an ordered lattice. Hence, first antiferromagnetic layer 14 is less liable to possess antiferromagnetic properties when heat treated, with the result that a too large thickness of the first antiferromagnetic layer 14 increases the proportion of the region that is hard to transform, which in turn increases the region in which disordered lattice remains without being transformed by heat treatment. Accordingly, the exchange coupling magnetic field is drastically reduced.

In accordance with the present invention, the thickness of the first antiferromagnetic layer 14 is preferably at least about 3 Å to about 30 Å. Results of experiments which will be described later show that a thickness of the first antiferromagnetic layer 14 falling within the above-specified range provides a large exchange coupling magnetic field (Hex), specifically an exchange coupling magnetic field of about $7.9 \times 10^4$ (A/m) or greater.

Subsequent to the deposition of the first antiferromagnetic layer 14, the second antiferromagnetic layer 15, which has a composition ratio of the element X or the elements X+X' smaller than that in the first antiferromagnetic layer 14, is formed on the first antiferromagnetic layer 14.

Preferably, the composition ratio of the element X or the elements X+X' in the second antiferromagnetic layer 15 is at least about 44 at % to about 57 at % and, more preferably, at least about 46 at % to about 55 at %, and most preferably at least about 48 at % but at least about 53 at %.

It is also preferred that the composition ratio of the element X or the elements X+X' in the second antiferromagnetic layer 15 approximates a composition ration that is ideal for causing transformation from a disordered lattice to an ordered lattice upon a heat treatment, so that the heat treatment executed after the deposition of the second antiferromagnetic layer 15 causes the latter to properly transform its structure from a disordered lattice to an ordered lattice. It is to be noted that the thickness of the second antiferromagnetic layer 15 is not unrestricted. It has been confirmed through an experiment that a too small thickness of the second antiferromagnetic layer 15 can cause a drastic reduction in the exchange coupling magnetic field (Hex).

In accordance with the present invention, it is preferred that the second antiferromagnetic layer 15 have a thickness of at least about 70 Å. A thickness meeting this requirement makes it possible to obtain a large exchange coupling magnetic field, specifically about $7.9 \times 10^4$ (A/m) or greater.

In accordance with the present invention, it is preferred that the first antiferromagnetic layer 14 and the second antiferromagnetic layer 15 are formed by sputtering. In particular, when the first antiferromagnetic layer 14 or the second antiferromagnetic layer 15 is formed of an X—Mn—X' alloy, use of sputtering for depositing this alloy enables the alloy to be deposited in a non-equilibrium state, so that the element X' invades and resides the interstices of the space lattice constituted by the element X and Mn or substitutes for part of the lattice points of the crystalline lattice formed by the element X and Mn, in the deposited X—Mn—X' alloy. As a result of the formation of an interstitial solid solution or a substitutional solid solution by the use of the element X', the lattice is expanded, so that the lattice constant of the antiferromagnetic layer 4 is increased as compared with the case where the element X' is not contained.

In accordance with the present invention, the deposition of the first antiferromagnetic layer 14 and the second antiferromagnetic layer by sputtering is conducted preferably such that the sputtering gas pressure is maintained in the deposition of the first antiferromagnetic layer 14 at a level lower than that in the deposition of the second antiferromagnetic layer 15. Such a technique provides a composition ratio of the element X or the elements X+X' in the first antiferromagnetic layer 14 greater than that in the second antiferromagnetic layer 15.

Thus, in accordance with the present invention, it is preferred that the antiferromagnetic layer 4 have a laminate structure composed of the first antiferromagnetic layer 14 and the second antiferromagnetic layer 15. The first and second antiferromagnetic layers 14, 15 are preferably deposited such that the composition ratio of the element X or the elements X+X' in the first antiferromagnetic layer 14 is set to be greater than that in the second antiferromagnetic layer 15. The relative composition ratio reduces the influence of the restraint force produced by the crystalline structure of the pinned magnetic layer 3 on the first antiferromagnetic layer 14 at the interface between the first antiferromagnetic layer 14 and the pinned magnetic layer 3, thus creating a non-aligned crystal lattice state over at least part of the above-mentioned interface. Accordingly, a proper transformation from a disordered lattice to an ordered lattice is obtained upon heat treatment and a large exchange coupling magnetic field is obtainable between the antiferromagnetic layer 4 and the pinned magnetic layer 3.

In accordance with the present invention, as stated before, it is preferred that a non-aligned crystal lattice state is created at at least part of the interface between the first antiferromagnetic layer 14 and the pinned magnetic layer 3 in the state after the deposition of the layers. Such a non-aligned crystal lattice state can be obtained by providing the first antiferromagnetic layer 14 and the second antiferromagnetic layer 15 with different lattice constants. It suffices only to produce such a difference at at least part of the above-mentioned interface.

Alternatively, different crystal orientations are created over at least part of the first antiferromagnetic layer 14 and the pinned magnetic layer 3. Creation of the above-mentioned non-aligned crystal lattice state over at least part of the interface between the first antiferromagnetic layer 14 and the pinned magnetic layer 3 can be facilitated also by employing different crystal orientations. For example, when the (111) face of the pinned magnetic layer 3 has been substantially oriented in a direction parallel to the film surface, the degree of orientation of the (111) face of the first antiferromagnetic layer 14 is set to be smaller than that of the (111) face of the pinned magnetic layer 3, or not oriented at all. Alternatively, when the (111) face of the first antiferromagnetic layer 3 has been substantially oriented in a direction parallel to the film surface, the degree of orientation of the (111) face of the pinned magnetic layer 3 is set to be smaller than that of the (111) face of the first antiferromagnetic layer 14, or the (111) face of the first antiferromagnetic layer 14 is not oriented at all.

Alternatively, the first antiferromagnetic layer 14 is made to have a small degree of orientation, or have no orientation at all, of the (111) plane with respect to the interface between the first antiferromagnetic layer 14 and the pinned magnetic layer 3. The above-mentioned degree of crystalline orientation is controllable by varying factors, such as use or non-use of the underlying layer, composition ratio, electric power and gas pressure during the sputtering, and order of lamination of the layers.

The laminate structure thus formed is then subjected to a heat treatment. As a result of this heat treatment, an exchange coupling magnetic field is generated at the interface between the antiferromagnetic layer 4 and the pinned magnetic layer 3, so that the magnetization of the pinned magnetic layer 3 is formed into a single magnetic domain in a predetermined direction, specifically in the height direction Y shown in FIG. 1.

As described before, the first antiferromagnetic layer 14 is not restrained by the crystalline structure of the pinned magnetic layer 3 at the interface between the first antiferromagnetic layer 14 and the pinned magnetic layer 3. Preferably, a non-aligned crystal lattice state is created over at least part of the above-mentioned interface, so that the second antiferromagnetic layer 15 that is formed on the pinned magnetic layer 1 through the first antiferromagnetic layer starts to transform from a disordered lattice to an ordered lattice while maintaining the above-mentioned non-aligned crystal lattice state. This is because the second antiferromagnetic layer 15 is formed from an antiferromagnetic material having a composition approximating the ideal composition for easy transformation from a disordered lattice to an ordered lattice, as described before.

It is considered that diffusion of elements takes place at the interface between the first antiferromagnetic layer 14 and the second antiferromagnetic layer 15, once such a transformation is started. Such a diffusion allows the elements of the second antiferromagnetic layer to immigrate into the first antiferromagnetic layer 14 and the elements of the first antiferromagnetic layer to immigrate into the second antiferromagnetic layer. Accordingly, the antiferromagnetic layer 4 is formed to have a structure in which elements of both the first antiferromagnetic layer 14 and the second antiferromagnetic layer 15 are mixed together without any distinct border.

At the region near the interface between the first antiferromagnetic layer 14 and the second antiferromagnetic layer 15, the composition ratio (at %) of the element X or the elements X+X' is smaller than that in the first antiferromagnetic layer 14 as initially deposited, as a result of the above-described diffusion. Consequently, when the second antiferromagnetic layer starts to be transformed into ordered lattice due to a heat treatment, transformation into ordered lattice is promoted also in the first antiferromagnetic layer, whereas, at the interface between the pinned magnetic layer and the antiferromagnetic layer 4, the first antiferromagnetic layer is freed from the influence of the restraint force of the crystalline structure of the pinned magnetic layer. Accordingly, a transformation from a disordered lattice to an ordered lattice takes place over the whole antiferromagnetic layer 4, thus affording a greater exchange coupling magnetic field.

Figure 3:
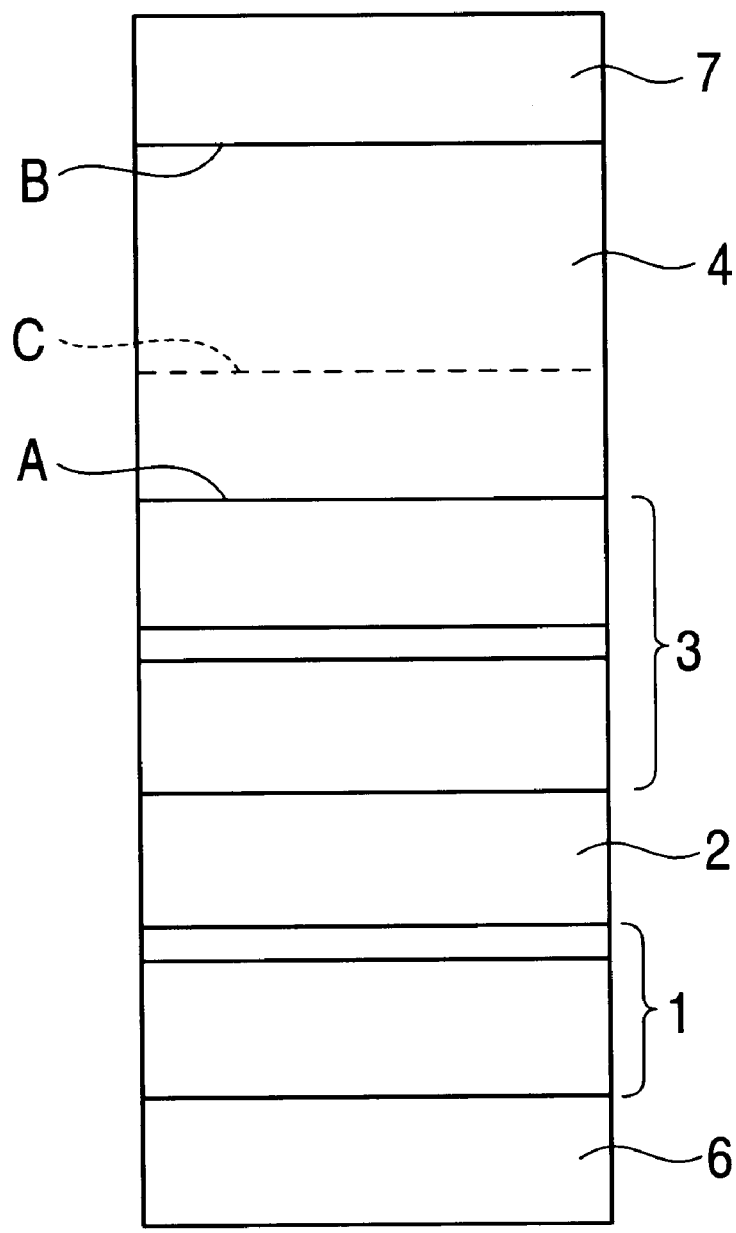
FIG. 3 is a schematic illustration of the laminate structure of FIG. 2 in a state after the heat treatment.

The laminate structure thus obtained after the heat treatment is schematically shown in FIG. 3. The configuration of the laminate structure starting from the lowermost underlying layer 6 and terminating in the pinned magnetic layer 3 is not changed by the heat treatment. It is to be understood, however, that the structure of the antiferromagnetic layer 3 is changed from the structure as deposited (prior to the heat treatment: see FIG. 2) to the structure (after the heat treatment) shown in FIG. 3.

The antiferromagnetic layer 4 shown in FIG. 3 is made from an antiferromagnetic alloy material containing an element X and Mn, wherein the element X is selected from the group of elements consisting of Pt, Pd, Ir, Rh, Ru, and Os, and combinations thereof, or from an antiferromagnetic alloy containing the element X, an element X' and Mn, wherein the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof.

The aforementioned X—Mn—X' alloy is preferably an interstitial solid solution in which the element X' resides in interstices of the space lattice constituted by the element X and Mn, or a substitutional solid solution in which the element X' has substituted for part of the lattice points of the crystal lattice formed of the element X and Mn. Thus, the X—Mn—X' alloy can have an expanded lattice constant over the X—Mn alloy, making it easier to create the non-aligned crystal lattice state at the interface between the antiferromagnetic layer 4 and the pinned magnetic layer after the heat treatment.

In accordance with the present invention, the antiferromagnetic layer 4 has a region in which the ratio of the atomic percent of the element X or elements X+X' to Mn increases towards the pinned magnetic layer 3. In addition, at least part of the crystalline structure of the antiferromagnetic layer 4 has a CuAu—I type face-centered cubic lattice (ordered lattice). Preferably, a non-aligned crystal lattice state is created over at least part of the aforementioned interface A.

The reason why the region in which the ratio of the atomic percent of the element X or elements X+X' to Mn increases towards the pinned magnetic layer 3 exists is that, although the first antiferromagnetic layer 14 and the second antiferromagnetic layer 15 experience diffusion due to the heat treatment, the diffusion is still imperfect and the first antiferromagnetic layer 14 and the second antiferromagnetic layer are not completely diffused in each other. In particular, the antiferromagnetic layer after the heat treatment does not have completely uniform structure.

As explained before with reference to FIG. 2, the composition ratio of the element X or the elements X+X' in the first antiferromagnetic layer 14 at the interface adjacent to the pinned magnetic layer is greater than that in the second antiferromagnetic layer 15, which is formed on the pinned magnetic layer through the intermediary of the first antiferromagnetic layer 14.

Also, as described before, the composition ratio of the element X or the elements X+X' in the second antiferromagnetic layer 15 is set to a value near about 50at % which is liable to cause transformation into ordered lattice by a heat treatment, requiring that the composition ratio of Mn also is about 50 at %. In contrast, the composition ratio of the element X or the elements X+X' in the first antiferromagnetic layer 14 is set to a value of about 58 at %, in order to reduce the influence of the restraint force of the pinned magnetic layer 3 at the interface adjacent to the pinned magnetic layer 3, requiring a smaller Mn content to be present than in the second antiferromagnetic layer 15.

Although the heat treatment causes mutual diffusion of elements between the first antiferromagnetic layer 14 and the second antiferromagnetic layer 15, such a diffusion is still imperfect and the antiferromagnetic layer 4 has such a gradient of the composition ratio that the atomic percent of the element X or elements X+X' to that of Mn progressively increases in a direction towards the pinned magnetic layer 3. Accordingly, a greater atomic percent of the element X or the elements X+X' is achieved in the region near the interface A adjacent to the pinned magnetic layer 3 than in the region near the side B opposite to the interface A, as a result of the above-described diffusion.

The antiferromagnetic layer 4 is transformed from disordered lattice into ordered lattice as a result of the heat treatment, so that at least part of the crystalline structure of the antiferromagnetic layer 4 has CuAu—I type face-centered cubic lattice (ordered lattice). Further, it is preferred that a non-aligned crystal lattice state is created over at least part of the interface adjacent to the pinned magnetic layer 3.

When the aforementioned antiferromagnetic layer 4 is formed of a Pt—Mn alloy, the ratio c/a between the lattice constants "a" and "c" of the antiferromagnetic layer 4, partly transformed into ordered lattice, i.e., the antiferromagnetic layer 4 after the heat treatment, preferably falls within the range of from about 0.93 to about 0.99. A lattice constant ratio c/a falling down below about 0.93 allows almost the entirety of the crystalline structure of the antiferromagnetic layer to be transformed into ordered lattice, producing undesirable effects such as delamination due to reduction in the adhesion between the antiferromagnetic layer 4 and the pinned magnetic layer 3. Conversely, a lattice constant ratio c/a above about 0.99 allows almost the entirety of the crystalline structure of the antiferromagnetic layer to remain in the state of ordered lattice, reducing disadvantageously the exchange coupling magnetic field at the interface between the antiferromagnetic layer 4 an the pinned magnetic layer 3.

In accordance with the present invention, it is preferred that a non-aligned crystal lattice state is created over at least part of the interface between the pinned magnetic layer 3 and the antiferromagnetic layer 4. Creation of such a non-aligned crystal lattice state is facilitated by allowing the pinned magnetic layer 3 and the antiferromagnetic layer 4 over at least part of the above-mentioned interface.

Alternatively, the structure after the heat treatment may be such that a region exists in which the ratio of the atomic percent of the element X or the elements X+X' to Mn increases in a direction towards the pinned magnetic layer 3 and that at least part of the crystalline structure of the antiferromagnetic layer 4 has CuAu—I type face-centered ordered lattice, while allowing the antiferromagnetic layer 4 and the pinned magnetic layer 3 to have different crystalline structures over at least part of the interface A. These features in combination also affords a greater exchange coupling magnetic field than the conventional art.

Alternatively, the structure after the heat treatment may be such that a region exists in which the ratio of the atomic percent of the element X or the elements X+X' to Mn increases in a direction towards the pinned magnetic layer 3 and that at least part of the crystalline structure of the antiferromagnetic layer 4 has CuAu—I type face-centered ordered lattice, while allowing the antiferromagnetic layer 4 and the pinned magnetic layer 3 to have different crystalline structures at at least part of the interface A.

For example, when the (111) face of the pinned magnetic layer 3 has been substantially oriented in the direction of the film plane, the (111) face of the antiferromagnetic layer 4 is oriented at a smaller degree of orientation than the (111) face of the pinned magnetic layer 3, or not oriented at all. Conversely, if the (111) face of the antiferromagnetic layer 4 has been substantially oriented in a direction parallel to the aforementioned interface, the (111) face of the pinned magnetic layer 3 is oriented at a smaller degree of orientation than the (111) face of the antiferromagnetic layer 4, or not oriented at all. Alternatively, the degrees of orientation of the (111) faces of the antiferromagnetic layer 4 and of the pinned magnetic layer 3 are both reduced with respect to the direction parallel to the interface between the antiferromagnetic layer 4 and the pinned magnetic layer 3, or these (111) are not oriented at all.

It is also possible to facilitate creation of the non-aligned crystal lattice state at the interface between the pinned magnetic layer 3 and the antiferromagnetic layer 4 and to obtain a large exchange coupling magnetic field, by employing different crystal orientations for the pinned magnetic layer 3 and the antiferromagnetic layer 4.

The elements constituting the antiferromagnetic layer 4 after the heat treatment depend on the composition elements of the first antiferromagnetic layer 14 and the second antiferromagnetic layer 15 employed in the deposition prior to the heat treatment. Therefore, when both the first antiferromagnetic layer 14 and the second antiferromagnetic layer 15 are deposited by using the same elements, for example, the first antiferromagnetic layer 4 after the heat treatment has the same elements over its entirety.

It is preferred that the first antiferromagnetic layer 14 is deposited with an antiferromagnetic material that affords a greater lattice constant, in order that the non-aligned crystal lattice state be maintained at the interface between the first antiferromagnetic layer 14 and the pinned magnetic layer 3, in the as-deposited state prior to the heat treatment. The second antiferromagnetic layer 15 is deposited from an antiferromagnetic material that permits a smooth transformation from a disordered lattice to an ordered lattice upon the heat treatment. Thus, antiferromagnetic materials having different composition elements may be used for the first antiferromagnetic layer 14 and the second antiferromagnetic layer 15.

For example, the kind of element X or the elements X+X' constituting the portion of the antiferromagnetic layer 4 near the interface A adjacent to the pinned magnetic layer 3 after the heat treatment may be partly the same as or different from that at the side B opposite to the interface A. This can occur when a Pt—Mn—Cr alloy is used as the material of the first antiferromagnetic layer 14 and a Pt—Mn alloy is used as the material of the second antiferromagnetic layer 15, or when a Pt—Mn—Cr alloy is used as the material of the first antiferromagnetic layer 14 and a Pd—Mn alloy is used as the material of the second antiferromagnetic layer 15.

As described before, the antiferromagnetic layer 4 after the heat treatment has a region in which the ratio of atomic percent of the element X or the elements X+X' to Mn progressively increases towards the pinned magnetic layer 3. It is, however, preferred that, in the region near the interface A, the composition ratio of the element X or the elements X+X' is about 50 at % to about 65 at %, where the total composition ratio of all the elements constituting the antiferromagnetic layer is expressed as being 100 at %. This range of the composition ratio of the element X or the elements X+X' depends on the composition ratio of the element X or the elements X+X' of the first antiferromagnetic layer 14 as deposited, i.e., prior to the heat treatment, and on the diffusion of elements caused by the heat treatment.

More specifically, it is preferred that, as described before, the composition ratio of the element X or the element X+X' is about 53 at % to about 65 at %. A diffusion of elements takes place also at the interface between the first antiferromagnetic layer 14 and the pinned magnetic layer 3. For these reasons, it is understood that the composition ratio of the element X or the elements X+X' in the region near the interface between the antiferromagnetic layer 4 and the pinned magnetic layer 3 is reduced from that obtained in the as-deposited state, leaving a possibility that the composition ratio of the element X or the elements X+X' comes down below 53 at %. For this reason, the preferred composition ratio of the element X or the elements X+X' in the region near the interface A after the heat treatment is preferably about 50 at % to about 65 at %. More preferred composition ratio of the element X or the elements X+X' is about 50 at % to about 60 at %.

In accordance with the present invention, the composition ratio of the element X or the elements X+X' of the antiferromagnetic layer 4 near the surface opposite to the above-mentioned interface A is preferably about 44 at % to about 57 at %, where the total composition ratio of all the elements constituting the antiferromagnetic layer 4 is represented by 100 at %. The composition ratio of the element X or the elements X+X' in the region near the side B depends on the composition ratio of the element X or the elements X+X' of the second antiferromagnetic layer 15 in the as-deposited state, i.e., prior to the heat treatment.

As stated above, it is preferred that the composition ratio of the element X or the elements X+X' of the second antiferromagnetic layer 15 is preferably about 44 at % to about 57 at %. Therefore, the preferred range of the element X or the elements X+X' in the region near the side B opposite to the above-mentioned interface A in the state after the heat treatment is about 44 at % to about 57 at %, as is the case of the composition ratio in the second antiferromagnetic layer 15. More preferred range of the element X or the elements X+X' is about 46 at % to about 55 at %.

In accordance with the present invention, the region in the antiferromagnetic layer 4 in which the composition ratio of the element X or the elements X+X' is about 46 at % to about 53 at % is about 70% but not more than 95% in terms of the volume ratio to the total volume of the antiferromagnetic layer 4. The fact that the volume ratio of the above-mentioned region falls within the above-specified range means that the transformation of the antiferromagnetic layer 4 caused by the heat treatment from the disordered lattice to ordered lattice has been properly completed, offering a greater exchange coupling magnetic field.

A description will now be given of a composition modulation occurring in the direction of thickness of the antiferromagnetic layer 4. As described before, in accordance with the present invention, the antiferromagnetic layer has a region in which the ratio of the atomic percent of the element X or the element X+X' to Mn increases in a direction towards the pinned magnetic layer 3. In addition to this feature, the antiferromagnetic layer 4 may have a composition modulation as described below.

Assume here an imaginary boundary plane extending in parallel to the interface within the thickness of the antiferromagnetic layer 4, so as to divide the antiferromagnetic layer 4 in thicknesswise direction into a first region between the imaginary boundary plane and the interface A and a second region between the imaginary boundary plane and the side opposite to the interface A. In such a case, the above-mentioned ratio may be linearly or non-linearly increased from the second region to the first region across the imaginary boundary plane. For example, the imaginary boundary mentioned above is represented by a broken line C. Thus, the broken line C indicates the interface between the first antiferromagnetic layer 14 and the second antiferromagnetic layer 15 of the antiferromagnetic layer 4 as deposited, i.e., prior to the heat treatment. (See FIG. 2)

In the state as deposited, the composition ratio of the element X or the elements X+X' is greater in the first antiferromagnetic layer 14 than in the second antiferromagnetic layer 15. It is understood that the heat treatment causes diffusion of the composition across the interface between the first antiferromagnetic layer 14 and the second antiferromagnetic layer 15. After the heat treatment, therefore, the above-mentioned ratio is greater in the first region between the interface A and the imaginary boundary (broken line C) than in the second region between the imaginary boundary (broken line C) and the side B opposite to the interface A. In addition, the above-mentioned ratio linearly or non-linearly increases in a direction from the second region to the first region within a transient region including the above-mentioned imaginary boundary. In particular, the non-linear increase of the above-mentioned ratio tends to occur when the composition ratio of the element X or the elements X+X' in the first antiferromagnetic layer 14 is significantly greater than that in the second antiferromagnetic layer 15 in the as-deposited state.

In accordance with the present invention, the antiferromagnetic layer 4 preferably has a region in which the composition ratio (atomic percent) of the element X or the elements X+X' increases in a direction towards the pinned magnetic layer 3. According to the present invention, as described before, the composition ratio of the element X or the elements X+X' in the first antiferromagnetic layer 14 in the antiferromagnetic layer as deposited (prior to heat treatment) adjacent to the pinned magnetic layer 3 is determined to be greater than that in the second antiferromagnetic layer 15. Despite any composition modulation caused in the region between the first antiferromagnetic layer 14 and the second antiferromagnetic layer 15 by the heat treatment, the composition ratio (atomic percent) of the element X or the elements X+X' in the portion adjacent to the pinned magnetic layer that has been constituted by the first antiferromagnetic layer before the heat treatment is still greater than that in the region that has been constituted by the second antiferromagnetic layer. Accordingly, the above-mentioned composition modulation takes place at a certain portion.

In accordance with the present invention, it is preferred that a region exists in proximity to the interface A between the antiferromagnetic layer 4 and the pinned magnetic layer 3, in which the atomic percent of the element X or the elements X+X' decreases in a direction towards the pinned magnetic layer 3. A diffusion of elements takes place between the antiferromagnetic layer 4 and the pinned magnetic layer 3, in the region of the antiferromagnetic layer 4 near the interface A between the antiferromagnetic layer 4 and the pinned magnetic layer 3. Such a diffusion will result in a smaller composition ratio of the element X or the elements X+X' in the region near the interface A than that was achieved in the as-deposited state.

when the antiferromagnetic layer 4 has a region in which the composition ratio of the element X or the element X+X' decreases in a direction towards the pinned magnetic layer 3 in the region near the interface A as in the case of the present invention, it causes the transformation from the disordered lattice to ordered lattice to be properly effected in the region near the interface A. Accordingly, a large exchange coupling magnetic field is generated.

In the heat treated antiferromagnetic layer 4, it is preferred that the composition ratio of the element X or the elements X+X' is maximized in the region which immediately underlies the interface A adjacent to pinned magnetic layer 3 and that the region have a thickness of at least about 3 Å to about 30 Å as measured from the interface A in the thicknesswise direction towards the side B opposite to the interface A. This range of thickness is the preferred range of thickness of the first antiferromagnetic layer 14 in the as-deposited state prior to the heat treatment.

In accordance with the present invention, a protective layer 7 made of, for example, Ta or the like is formed on the side B of the antiferromagnetic layer 4 opposite to the interface A adjacent to the pinned magnetic layer 3.

A composition modulation due to heat treatment occurs also at the boundary between the second antiferromagnetic layer 15 as deposited and the protective layer 7. Thus, in accordance with the present invention, a region can exist in the antiferromagnetic layer 4 near the side thereof opposite to the pinned magnetic layer 3, in which the composition ratio of the element X or the elements X+X' decreases in a direction towards the above-mentioned side of the antiferromagnetic layer 4.

In accordance with the present invention, the antiferromagnetic layer 4 preferably has a thickness at least about 73 Å. As explained before with reference to FIG. 2, the thickness of the first antiferromagnetic layer 14 is about 3 Å at the smallest and the whole thickness of the second antiferromagnetic layer 15 is about 70 Å at the smallest, so that the total thickness of the whole antiferromagnetic layer 4 is preferably about 73 Å or greater. Thus, in accordance with the present invention, the minimum thickness required for the antiferromagnetic layer 4 is about 73 Å, which is significantly smaller than that required for the conventional structure. This means that the gap width can be reduced when the laminate structure of FIG. 3 is used as a thin-film magnetic head.

Although in the described embodiment the antiferromagnetic layer 4 as deposited (prior to the heat treatment) is composed of a dual-layer structure having the first antiferromagnetic layer 14 and the second antiferromagnetic layer 15, this is only illustrative and other production method can also be employed. For example, an exchange coupling magnetic field greater than those of the conventional structures can be obtained even when the antiferromagnetic layer 4 as deposited (prior to the heat treatment) is composed of a single layer, provided that the following production process is employed.

More specifically, in accordance with the present invention, the antiferromagnetic layer 4 may be formed by a sputtering process in which an element X and Mn are used as the sputtering targets, where the element X is selected from the group of elements consisting of Pt, Pd, Ir, Rh, Ru, and Os, and combinations thereof. The sputtering gas pressure is progressively increased as the deposition proceeds in a direction away from the pinned magnetic layer 3 during the deposition of the antiferromagnetic layer 4. Accordingly, the composition ratio (atomic percent) of the element X is reduced in the direction away from the side of the antiferromagnetic layer 4 adjacent to the pinned magnetic layer 3. When this method is used, it is preferred that a non-aligned crystal lattice state is obtained over at least part of the interface between the antiferromagnetic layer 4 and the pinned magnetic layer 3.

Representing the composition ratio of all the element constituting the portion of the antiferromagnetic layer 4 near the side thereof opposite to the above-mentioned interface, it is preferred that the composition ratio of the element X is about 44 (at %) to about 57 (at %) and, more preferably, about 46 (at %) but not more than 55 (at %).

By virtue of these features, the portion of the antiferromagnetic layer 4 near interface between the antiferromagnetic layer 4 and the pinned magnetic layer 3 is freed from the influence of the restraint force produced by the crystalline structure of the pinned magnetic layer 3, while the remainder portion of the antiferromagnetic layer 4, other than the region near the above-mentioned interface, can have a composition having a composition ratio (at %) of the element X that approaches an ideal composition. An ideal composition facilitates transformation from a disordered lattice to an ordered lattice when subjected to a heat treatment.

It is therefore possible to effect a proper transformation of the antiferromagnetic layer 4 as deposited from a disordered lattice to an ordered lattice, by effecting a heat treatment on the antiferromagnetic layer as deposited. Further, since the heat treatment possibly causes diffusion of elements in the antiferromagnetic layer 4, the transformation from a disordered lattice to an ordered lattice properly takes place in the antiferromagnetic layer 4. Accordingly, it is possible to obtain a greater exchange coupling magnetic field than in conventional structures.

When a non-aligned crystal lattice state exists in the above-mentioned interface, the antiferromagnetic layer 4 is conveniently freed from the restraint force produced by the crystalline structure of the pinned magnetic layer 3, so that the transformation of the whole antiferromagnetic layer 4 is promoted.

It is also preferred that the antiferromagnetic layer 4 has a thickness at least about 73 Å. This minimum value of about 73 Å is the sum of the minimum thicknesses that are required, as explained before with reference to FIG. 2, for the first antiferromagnetic layer 14 and the second antiferromagnetic layer 15, which in combination form the antiferromagnetic layer 4.

Referring again to FIG. 2, the minimum required thickness of the first antiferromagnetic layer is about 3 Å, while the minimum required thickness for the second antiferromagnetic layer 15 is about 70 Å, so that the minimum thickness required for the antiferromagnetic layer is set to be about 73 Å.

The composition ratio of the element X is preferably at least about 53 at % to about 65 at % and, more preferably, about 55 at % to about 60 at %, in the thicknesswise region of at least about 3 Å as measured from the interface adjacent to the pinned magnetic layer 3, where the composition ratio of all the elements in this region is 100 at %. These composition ratios hold even when the antiferromagnetic layer 4 as deposited (prior to the heat treatment) is formed of a single layer. The remainder region having a thickness of about 70 Å or greater preferably has a composition of the element X at least about 44 at % to about 57 at %, and more preferably about 46 at % to about 55 at %. With these features, it is possible to obtain an exchange coupling magnetic field of about $7.9 \times 10^4$ (A/m) or greater, as in the case of the structure shown in FIG. 2.

In accordance with the present invention, the antiferromagnetic layer 4 may also be formed by a sputtering process in which an element X, an element X' and Mn are used as the sputtering targets, where the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof. The sputtering gas pressure is progressively increased as the deposition proceeds in the direction away from the pinned magnetic layer 3 during the deposition of the antiferromagnetic layer 4. Accordingly, the composition ratio (atomic percent) of the elements X+X' is reduced in the direction away from the side of the antiferromagnetic layer 4 adjacent to the pinned magnetic layer 3.

Preferably, an element that invades interstices of the space lattice formed by the element X and Mn, or an element which substitutes part of the lattice points of the crystalline structure formed of the element X and Mn, is used as the element X'. Such an element X' allows the lattice constant of the X—Mn—X' alloy to be expanded over the lattice constant of the X—Mn alloy, thus making it easy to maintain a non-aligned crystal lattice state at the interface adjacent to the pinned magnetic layer 3.

As stated before, according to the present invention, it is preferred that a non-aligned crystal lattice state is created over at least part of the interface between the antiferromagnetic layer 4 and the pinned magnetic layer 3. One of the methods for creating such a non-aligned crystal lattice state is to employ, over at least part of the above-mentioned interface, different lattice constants for the antiferromagnetic layer 4 and the pinned magnetic layer 3.

Thus, the present invention may be carried out such that, when the antiferromagnetic layer 4 is formed by a sputtering process using an element X and Mn as the puttering targets or using elements X+X' and Mn as the sputtering targets, the sputtering gas pressure is progressively increased in the direction away from the pinned magnetic layer 3 during the deposition of the antiferromagnetic layer 4. Accordingly, the composition ratio (atomic percent) of the element X or the elements X+X' is reduced in the direction away from the side of the antiferromagnetic layer 4 adjacent to the pinned magnetic layer 3. During the deposition of the antiferromagnetic layer 4, different lattice constants for the antiferromagnetic layer 4 and the pinned magnetic layer 3 are formed over at least part of the interface between the antiferromagnetic layer 4 and the pinned magnetic layer 3.

Alternatively, the invention may be carried out while employing, during the deposition of the antiferromagnetic layer 4, different crystal orientations for the antiferromagnetic layer 4 and the pinned magnetic layer 3 over at least part of the interface between the antiferromagnetic layer 4 and the pinned magnetic layer 3. Creation of non-aligned crystal lattice state over at least part of the interface between the antiferromagnetic layer 4 and the pinned magnetic layer 3 is facilitated also by causing the antiferromagnetic layer 4 and the pinned magnetic layer 3 to have different crystal orientations.

By effecting a heat treatment on the laminate structure formed by the described process, it is possible to obtain a laminate structure similar to that shown in FIG. 3. Thus, the antiferromagnetic layer 4 after the deposition is formed of an antiferromagnetic material containing an element X and Mn or, alternatively, elements X+X' and Mn, and has a region in which the ratio of the atomic percent of the element X or the elements X+X' increases in a direction towards the antiferromagnetic layer 3. The crystalline structure of at least a portion of the antiferromagnetic layer has a CuAu—I type face-centered cubic ordered lattice, and a non-aligned crystal lattice state is created over at least part of the aforesaid interface A.

Figure 4:
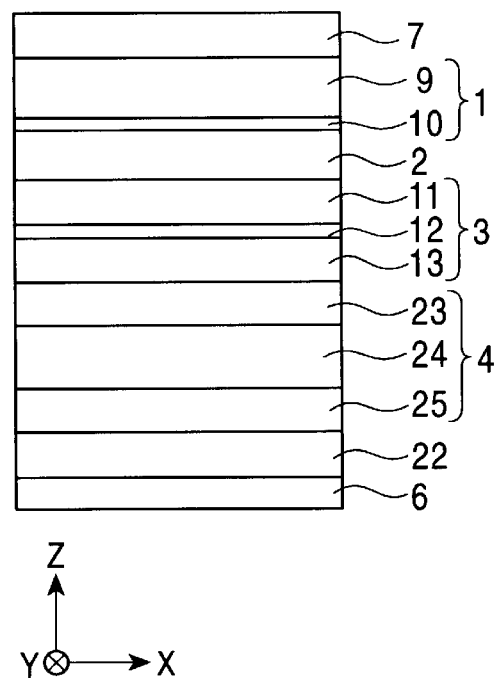
FIG. 4 is a schematic illustration of a laminate structure in accordance with the present invention using a seed layer in a state after deposition and prior to a heat treatment.
Figure 5:
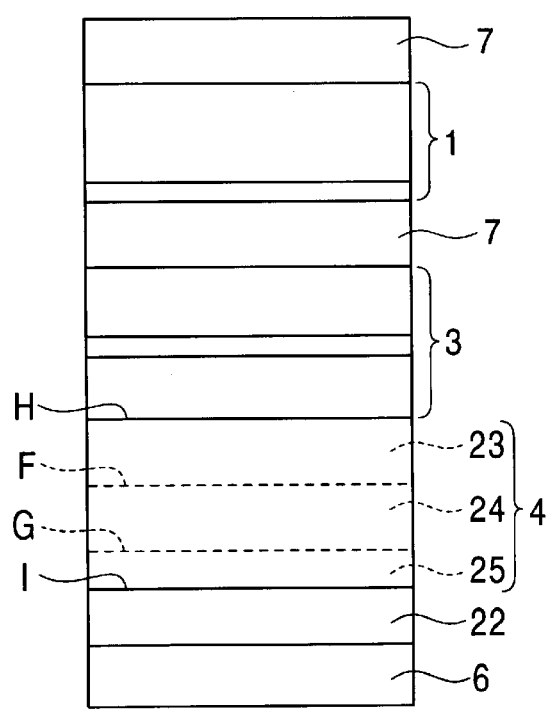
FIG. 5 is a schematic illustration of the laminate structure of FIG. 4 in a state after the heat treatment.
Figure 6:
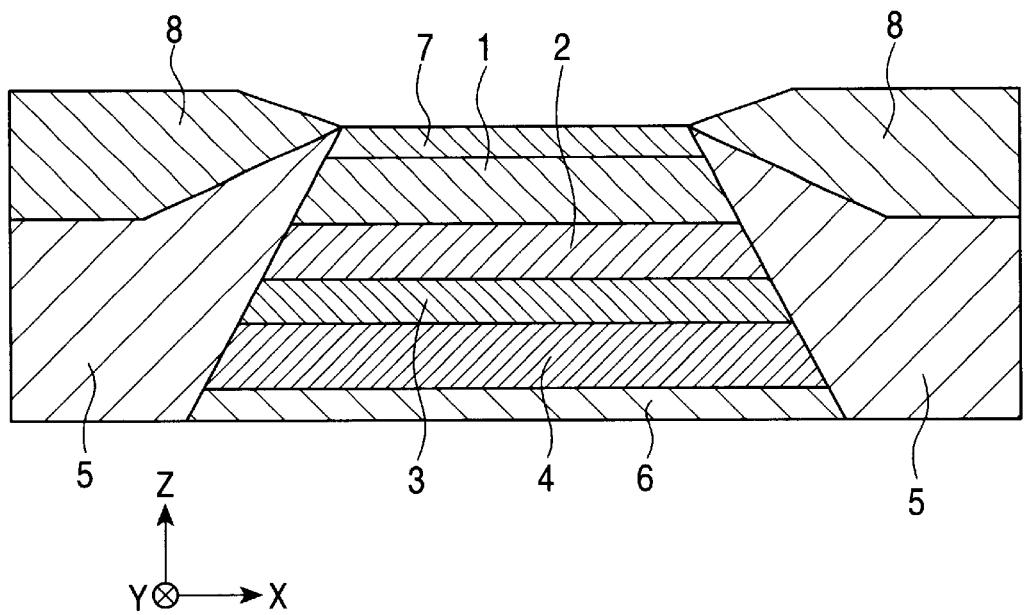
FIG. 6 is a cross-sectional view of the structure of a single spin valve type magnetoresistive sensor in accordance with a second embodiment of the present invention, as viewed from the same side as an ABS surface.

FIG. 4 shows a laminate structure employing a seed layer 22 in a state as deposited, i.e., in a state prior to a heat treatment. FIG. 5 shows the laminate structure obtained by effecting the heat treatment on the laminate structure shown in FIG. 4. The laminate structure of FIG. 4 and, hence, the laminate structure of FIG. 5 are used in the production of a single-spin-valve type magnetoresistive sensor having an antiferromagnetic layer 4 underlying a pinned magnetic layer 3 as shown in FIG. 6 by way of example.

As the first step of a fabrication process, a seed layer 22 is formed on an underlying layer 6, and then an antiferromagnetic layer 4 is formed on the seed layer 22. The underlying layer 6 is preferably formed of at least one element selected from the group consisting of Ta, Hf, Nb, Zr, Ti, Mo, and W. The underlying layer 6 is intended to align the (111) face of the seed layer 22 thereon substantially in the direction parallel to the interface between the underlying layer 6 and the seed layer 22. The underlying layer has a thickness of, for example, about 50 Å.

The seed layer 22 is mainly constituted by face-centered cubic crystals, with the (111) face substantially oriented in the direction parallel to the interface between the seed layer 22 and the antiferromagnetic layer 4. It is preferred that the seed layer is formed of an Ni—Fe alloy or an Ni—Fe—Y alloy, where Y is at least one element selected from the group consisting of Cr, Rh, Ta, Hf, Nb, Zr, and Ti. The seed layer 22 formed from such a material on the underlying layer 6 serves to facilitate the preferential orientation of the (111) face in the direction parallel to the interface adjacent to the antiferromagnetic layer 4.

Preferably, the seed layer 22 is formed of a non-magnetic material. The non-magnetic nature of the seed layer 22 serves to enhance the specific resistance of the seed layer 22. The shunting of the sense current into the seed layer 22 undesirably causes reduction of the ratio of resistance variation ($\Delta$MR) or generation of Barkhausen noise.

When a non-magnetic material is used as the material of the seed layer 22, the Ni—Fe—Y alloy, Y being at least one element selected from the group consisting of Cr, Rh, Ta, Hf, Nb, Zr, and Ti, may be selected as such a non-magnetic material, among the materials mentioned above. Such material has a face-centered crystalline structure and, moreover, the (111) face thereof can easily be substantially aligned in the direction parallel to the interface adjacent to the antiferromagnetic layer 4. The seed layer 22 has a thickness of, for example, about 30 Å.

As will be seen from FIG. 4, the antiferromagnetic layer 4 formed on the seed layer 22 is composed of a laminate structure having a first antiferromagnetic layer 23, a second antiferromagnetic layer 24, and a third antiferromagnetic layer 25.

In accordance with the present invention, each of the first antiferromagnetic layer 23, second antiferromagnetic layer 24, and the third antiferromagnetic layer 25 may be formed from an antiferromagnetic material which contains an element X and Mn, wherein X is selected from the group of elements consisting of Pt, Pd, Ir, Rh, Ru, and Os, and combinations thereof.

Alternatively, each of the first antiferromagnetic layer 23, second antiferromagnetic layer 24, and the third antiferromagnetic layer 25 may be formed from an antiferromagnetic material which contains an element X, an element X' and Mn, wherein the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof.

In each of the above-described structures, the X—Mn—X' alloy is preferably an interstitial solid solution in which the element X' has come into and resides in the interstices of a space lattice formed by the element X and Mn, or a substitutional solid solution in which part of the lattice points of the crystal lattice formed by the element X and Mn has been substituted by the element X'. The X—Mn—X' alloy in the form of an interstitial solid solution or a substitutional solid solution has an expanded lattice constant over the X—Mn alloy.

In accordance with the present invention, the composition ratio of the element X or the elements X+X' in each of the first and third antiferromagnetic layers 23 and 25 is determined to be greater than that in the second antiferromagnetic layer 24. The second antiferromagnetic layer 24 formed between the first and third antiferromagnetic layers 23 and is made of an antiferromagnetic material that approximates an ideal composition that is easy to be transformed from a disordered lattice to an ordered lattice by a heat treatment.

The reason why the composition ratio of the element X or the elements X+X' in each of the first and third antiferromagnetic layers 23 and 25 is determined to be greater than that in the second antiferromagnetic layer 24 is the same as that described before with reference to FIG. 2. In particular, it is intended that restraint forces produced by the crystalline structures of the pinned magnetic layer 3 and the seed layer 22 and acting at the respective interfaces are diminished so as to allow an easy transformation of the antiferromagnetic layer 4 under the heat treatment.

Preferably, the composition ratio of the element X or elements X+X' of each of the first antiferromagnetic layer 23 and the third antiferromagnetic layer 25 is about 53 at % to about 65 at % and, more preferably, about 55 at % to about 60 at %. Preferably, the thickness of each of the first antiferromagnetic layer 23 and the third antiferromagnetic layer 25 is about 3 Å to about 30 Å. For example, in the embodiment shown in FIG. 4, the thickness of each of the first antiferromagnetic layer 23 and the third antiferromagnetic layer 25 is about 10 Å.

Preferably, the composition ratio of the element X or elements X+X' of the second antiferromagnetic layer 24 is about 44 at % to about 57 at % and, more preferably, about 46 at % to about 55 at %. A composition ratio of the element X or the elements X+X' falling within this range permits easy transformation of the second antiferromagnetic layer 24 from a disordered lattice to an ordered lattice by the heat treatment. Preferably, the thickness of the second antiferromagnetic layer 24 is about 70 Å. For example, in the embodiment shown in FIG. 4, the thickness of the second antiferromagnetic layer 24 is about 100 Å.

Preferably, each of the first, second and third antiferromagnetic layers 23, 24 and 25 is formed by sputtering. It is also preferred that the sputter deposition of each of the first antiferromagnetic layer 23 and the third antiferromagnetic layer 25 is conducted at a sputter gas pressure lower than that for the second antiferromagnetic layer 24. Such a lower sputtering gas pressure provides a greater composition of the element X or the elements X+X' for each of the first and third antiferromagnetic layers 23 and 25 than for the second antiferromagnetic layer 24.

Alternatively, in accordance with the present invention, the antiferromagnetic layer 4, as deposited, is not formed of a three-layered laminate structure as described above, but of a single-layered structure in accordance with the following process. Also, even when such a process is used, it is possible to create a suitable variation of the composition ratio (atomic percent) of the element X or the elements X+X' in the direction of thickness of the antiferromagnetic layer 4.

Preferably, antiferromagnetic layer 4 is deposited by using the element X and Mn or, alternatively, the elements X+X' and Mn, as the sputtering targets, while progressively increasing the sputtering gas pressure in the direction away from the seed layer 22 and, when the deposition has proceeded to about a half of the final thickness, the sputtering gas pressure is progressively decreased until the deposition of the antiferromagnetic layer is completed.

When such a deposition technique is used, the composition ratio (atomic percent) of the element X or the elements X+X' is progressively increased from the interface adjacent to the seed layer 22 towards the thicknesswise central region of the antiferromagnetic layer 4 and then progressively decreased towards the interface adjacent to the pinned magnetic layer 3.

It is thus possible to form an antiferromagnetic layer 4 in which the composition ratio (atomic percent) of the element X or the elements X+X' is large at the interface adjacent to the seed layer 22 and also at the interface adjacent to the pinned magnetic layer 3, and is minimum at the thicknesswise central region of the antiferromagnetic layer 4.

Preferably, the composition ratio of the element X or the composition ratio of the elements X+X' of the antiferromagnetic layer to the total composition ratio (100 at %) of all the elements constituting the antiferromagnetic layer 4 is about 53 (at %) but not more than 65 (at %) and, preferably, about 55 (at %) but not more than 60 (at %), in the region near the interface between the antiferromagnetic layer 4 and the pinned magnetic layer, as well as in the region near the antiferromagnetic layer 4 and the seed layer 22.

It is also preferred that In these methods of the present invention, the composition ratio of the element X or the composition ratio of the elements X+X' of the antiferromagnetic layer 4 is about 44 (at %) but not more than 57 (at %) and, preferably, about 46 (at %) but not more than 55 (at %), in the thicknesswise central region of the antiferromagnetic layer and the ferromagnetic layer 4. It is also preferred that the thickness of the antiferromagnetic layer is at least about 76 Å or greater.

The pinned magnetic layer 3 is formed on the antiferromagnetic layer 4, as shown in FIG. 4. In the embodiment shown in FIG. 4, the pinned magnetic layer 3 has a so-called ferromagnetic state constituted by three layers: a Co film 11, an Ru film 12 and a Co film 13, as in the case of the embodiment shown in FIG. 2. The Co film 11 is preferably formed to have a thickness of about 20 Å, the Ru film 12 is preferably formed to have a thickness of about 8 Å, and the Co film 13 is preferably formed to have a thickness of about 15 Å.

As a result of this heat treatment, the antiferromagnetic layer 4 is properly transformed to change its crystalline structure from a disordered lattice to an ordered lattice, without being restrained by the restraint forces produced by the seed layer 22 and the pinned magnetic layer 3 at the interfaces adjacent to the seed layer 22 and the pinned magnetic layer 3. Accordingly, an exchange coupling magnetic field is generated at the interface between the antiferromagnetic layer 4 and the pinned magnetic layer 3, and the magnetization of the pinned magnetic layer 3 is formed into a single magnetic domain in a direction, specifically in the height direction Y.

In accordance with the present invention, a non-aligned crystal lattice state is created over at least part of the interface between the seed layer 22 and the pinned magnetic layer 3. Presence of such a non-aligned crystal lattice state reduces the influence of the restraint forces produced by the seed layer 22 and the pinned magnetic layer 3 at the respective interfaces, thus promoting transformation of the antiferromagnetic layer 4 into ordered structure.

In accordance with the present invention, the antiferromagnetic layer 4 has the first and third antiferromagnetic layers 23 and 25 which are formed at the sides thereof contacting the seed layer 22 and the pinned magnetic layer 3, respectively. Each layer has a large composition ratio of the element X or the elements X+X'. A second antiferromagnetic layer 24 is interposed between the first antiferromagnetic layer 23 and the third antiferromagnetic layer 25 and has a composition easy to transform from a disordered lattice to an the ordered lattice. Therefore, transformation proceeds at the second antiferromagnetic layer 24 as a result of a heat treatment, while diffusion of elements takes place at the boundaries between the first antiferromagnetic layer 23 and the second antiferromagnetic layer 24 and between the second antiferromagnetic layer 24 and the third antiferromagnetic layer 25. Accordingly, transformation from a disordered lattice to an ordered lattice takes place also in the first antiferromagnetic layer 23 and in the third antiferromagnetic layer 25, while properly maintaining non-aligned crystal lattice state at the interface between the first antiferromagnetic layer 23 and the seed layer 22. A non-aligned crystal lattice state is also maintained at the interface between the third antiferromagnetic layer 25 and the pinned magnetic layer 3. Accordingly, a proper transformation occurs in the whole antiferromagnetic layer 4. In accordance with the present invention, it is possible to expect a proper transformation in excess of that described in the prior art and, hence, a greater exchange coupling magnetic field, specifically an exchange magnetic coupling of about $7.9 \times 10^4$ (A/m) or greater is possible.

In accordance with the invention, a non-magnetic intermediate layer 2 such as of Cu is formed on the pinned magnetic layer 3, and a free magnetic layer 1 is formed on the non-magnetic intermediate layer 2. The free magnetic layer 1 is formed of, for example, an Ni—Fe alloy film 9 and a Co film 10. The non-magnetic intermediate layer 2 has a thickness of, for example, about 22 Å, while the N—Fe alloy film 9 has a thickness of about 45 Å. The Co film 10 has a thickness of about 5 Å. Then, a protective layer 7 of, for example, Ta is formed on the free magnetic layer 1, as shown in FIG. 4. The protective layer 7 has a thickness of, for example, about 30 Å. In accordance with the present invention, as stated before, the seed layer 22 is formed on the lower side of the antiferromagnetic layer 4, i.e., on the side of the antiferromagnetic layer 4 opposite to the interface adjacent to the pinned magnetic layer 3. The seed layer is constituted primarily of face-centered crystalline structure, with the (111) face oriented in a direction parallel to the interface adjacent to the antiferromagnetic layer 4. Therefore, the crystals of the layers on the seed layer 22, starting from the antiferromagnetic layer 4 and terminating in the free magnetic layer 1, are also liable to be aligned such that their (111) faces are substantially oriented in a direction parallel to the above-mentioned interface, allowing the crystal grains to grow large. Such large crystal grains increases the ratio of resistance variation (ΔMR), offering improved reproduction characteristics.

As described before, the embodiment shown in FIG. 4 provides not only improved ratio of resistance variation but also a large exchange coupling magnetic field. The ratio of resistance variation is reduced when the exchange coupling magnetic field is reduced. an exchange coupling magnetic field is necessary to a certain extent, also from the viewpoint of improvement in the ratio of resistance variation.

A heat treatment is conducted after the deposition of the layers, from the underlying layer 6 up to the protective layer 7, shown in FIG. 4. FIG. 5 shows the laminate structure in the state after the heat treatment. The seed layer 22 formed of Ta or the like still retains its crystalline structure primarily constituted by face-centered cubic crystals with the (111) face oriented in a direction parallel to the interface adjacent to the antiferromagnetic layer 4, even in the structure shown in FIG. 5 obtained after the heat treatment.

The antiferromagnetic layer 4 formed on the seed layer 22 has a crystalline structure at least part of which is formed of a CuAu—I type face-centered ordered lattice, and each of the layers from the antiferromagnetic layer 4 to the free magnetic layer 1 have their (111) faces substantially oriented in the direction parallel to the aforementioned interface. Further, a non-aligned crystal lattice state is created at over at least part of the interface I between the antiferromagnetic layer 4 and the seed layer and over at least part of the interface H between the antiferromagnetic layer 4 and the pinned magnetic layer 3.

As described before, in the present invention, layers from the antiferromagnetic layer 4 to the free magnetic layer 1 have crystalline structures with their (111) faces oriented in the direction parallel to the aforementioned interface and, at the same time, have large crystal grains, thus offering a greater resistance variation ratio (ΔMR).

As described before, the seed layer 22 is preferably formed from an Ni—Fe alloy or an Ni—Fe—Y alloy, where Y is at least one element selected from the group consisting of Cr, Rh, Ta, Hf, Nb, Zr, and Ti. The non-magnetic nature of the seed layer 22 serves to enhance the specific resistance of the seed layer 22, so that shunting of a sense current from the conductive layer to the seed layer 22 is suppressed to afford a greater resistance variation ratio, while suppressing generation of Barkhausen noise.

Furthermore, in accordance with the present invention, a non-aligned crystal lattice state is created over at least part of the interface I between the antiferromagnetic layer 4 and the seed layer 22, and over at least part of the interface H between the antiferromagnetic layer 4 and the pinned magnetic layer 3. Moreover, the crystalline structure of at least a portion of the antiferromagnetic layer 4 has been transformed into CuAu—I type face-centered cubic ordered lattice structure. This indicates that the antiferromagnetic layer 4 has been properly transformed from disordered lattice structure to ordered lattice structure, thus offering a greater exchange coupling magnetic field than ever to appear between the antiferromagnetic layer 4 and the pinned magnetic layer 3. In particular, an exchange coupling magnetic field of about $7.9 \times 10^4$ (A/m) or greater is attained.

In accordance with the present invention, the antiferromagnetic layer 4 and the seed layer 22 may have different lattice constants over at least part of the aforementioned interface I. Also, the antiferromagnetic layer 4 and the pinned magnetic layer 3 can have different lattice constants over at least part of the aforementioned interface H. This permits a non-aligned crystal lattice state to be created over at least ort of the interface I between the antiferromagnetic layer 4 and the seed layer 22 and over at least part of the interface H between the antiferromagnetic layer 4 and the pinned magnetic layer 3.

The heat treatment causes a diffusion of elements at the interface F between the first antiferromagnetic layer 23 and the second antiferromagnetic layer 24 and at the interface G between the third antiferromagnetic layer 25 and the second antiferromagnetic layer 24, so that the interfaces F and G become obscure and indefinite after the heat treatment. The antiferromagnetic layer 4 is preferably formed from an antiferromagnetic material containing an element X and Mn, where the element X is selected from the group of elements consisting of Pt, Pd, Ir, Rh, Ru, and Os, and combinations thereof, or from an antiferromagnetic element containing an element X, an element X' and Mn, where the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof. The aforementioned X—Mn—X' alloy, when used as the material of the antiferromagnetic layer 4, preferably has the form of an interstitial solid solution in which the element X' has come into interstices of the space lattice constituted by the element X and Mn, or the from of a substitutional solid solution in which the element X' has substituted for part of the lattice points of the crystal lattice formed of the element X and Mn. The X—Mn—X' alloy can expand the lattice constant over that of the X—Mn alloy, making it possible to properly maintain the non-aligned crystal lattice state at the interface between the seed layer 22 and the pinned magnetic layer 3.

Preferably, the antiferromagnetic layer 4 after the heat treatment has a region in which the ratio of the atomic percent of the element X or the elements X+X' increases in a direction towards the seed layer 22.

The presence of such a composition modulation means that the transformation into the ordered lattice structure has been properly effected by the heat treatment. The region of the above-mentioned composition modulation can be achieved by a composition ratio of the element X or the elements X+X' in the third antiferromagnetic layer 25 that is greater than that in the second antiferromagnetic layer 24 in the as-deposited state, i.e., in the state shown in FIG. 4 prior to the heat treatment. Alternatively, the composition modulation can be achieved by varying the sputter gas pressure during the deposition of the antiferromagnetic layer 4 such that the atomic percent of the element X or the elements X+X' is progressively decreased towards the thicknesswise center of the antiferromagnetic layer 4. With this feature, the transformation into the ordered lattice structure is properly performed at the interface I between the seed layer 22 and the antiferromagnetic layer 4, without being influenced by any restraint force produced by the crystalline structure of the seed layer 22. Accordingly, providing a large exchange coupling magnetic field.

In addition to the above-described composition modulation, the antiferromagnetic layer 4 has a region in which the ratio of the atomic percent of the element X or the elements X+X' increases in a direction towards the pinned magnetic layer 3. This can be achieved by determining the composition ratio of the element X or the elements X+X' in the first antiferromagnetic layer 23 to be greater than that in the second antiferromagnetic layer 24 in the as-deposited state, i.e., in the state shown in FIG. 4 prior to the heat treatment, or by varying the sputter gas pressure during the deposition of the antiferromagnetic layer 4 such that the composition ratio (atomic percent) of the element X or the elements X+X' is progressively decreased from the thicknesswise central region towards the pinned magnetic layer 3.

Thus, the antiferromagnetic layer 4 adjoining the seed layer 22 shown in FIG. 5 has a thicknesswise region between the thicknesswise central region and the pinned magnetic layer 3 in which the atomic percent of the element X or the elements X+X' to Mn progressively increases in a direction towards the pinned magnetic layer 3, and a thicknesswise region between the thicknesswise central region and the seed layer 22 in which the atomic percent of the element X or the elements X+X' to Mn progressively increases in a direction towards the seed layer 22.

Representing by 100 at % the composition ratio of all the elements constituting the region of the first antiferromagnetic layer 2e near the interface I adjacent to the seed layer 22, as well as that in the region of the first antiferromagnetic layer near the interface H adjacent to the pinned magnetic layer 3, the composition ratio of the element X or the elements X+X' is preferably about 50 at % to about 65 at %. This range is derived from the proper composition range (from about 53 at % to about 65 at %) of the first antiferromagnetic layer 23 and the third antiferromagnetic layer 25 in the as-deposited state prior to the heat treatment. The minimum value (about 50 at %) of the composition ratio allowed in the antiferromagnetic layer 4 after the heat treatment is smaller than the above-mentioned minimum value (about 53 at % allowed for the first antiferromagnetic layer 23 and the third antiferromagnetic layer 25. This is because of diffusions of compositions at the interface I between the antiferromagnetic layer 4 and the seed layer 22 and at the interface H between the antiferromagnetic layer 4 and the pinned magnetic layer 3 caused by the heat treatment. The composition ratio of the element X or the elements X+X' is preferably about 50 at % to about 60 at % in each of the interface I adjacent to the seed layer 22 and the interface H adjacent to the pinned magnetic layer 3.

The composition ratio (atomic percent) of the element X or the elements X+X' after the heat treatment is preferably about 44 at % to about 57 at % in the thicknesswise central region. This range of the composition ratio is derived from the preferred composition ratio (from 44 at % to 57 at %) of the element X or the elements X+X' of the second antiferromagnetic layer 24 in the as-deposited state, i.e., prior to the heat treatment. More preferably, the above-mentioned composition ratio of the element X or the elements X+X' is about 46 at % to about 55 at %.

Assume here two imaginary boundary planes extending in parallel to the interfaces adjacent to the pinned magnetic layer 3 and the seed layer 22, within the thickness of the antiferromagnetic layer 4. The ratio of the atomic percent of the element X or the elements X+X' to Mn is greater in a third region and in a first region than in a second region, wherein the third region is a region between the interface H adjacent to the pinned magnetic layer 3 and a second imaginary boundary plane adjacent to the interface H. The first region is a region between the interface I adjacent to the seed layer 22 and a first imaginary boundary plane adjacent to the interface I. The second region is the region between the two imaginary boundary planes, with the above-mentioned ratio preferably increasing linearly or non-linearly from the second region towards the first region across the first imaginary boundary plane and from the second region towards the third region across the second imaginary boundary regions.

For example, it is assumed here that a broken line G of FIG. 5 indicates the first imaginary boundary plane, while a broken line F shown in FIG. 5 indicates the second imaginary boundary plane. The broken lines F and G are drawn at thicknesswise positions where the interface between the first antiferromagnetic layer 23 and the second antiferromagnetic layer 24 and the interface between the second antiferromagnetic layer 24 and the third antiferromagnetic layer 25 existed in the as-deposited state prior to the heat treatment.

In the as-deposited structure prior to the heat treatment, the composition ratio of the element X or the elements X+X' is greater in the first and third antiferromagnetic layers 23 and 25 than in the second antiferromagnetic layer 24. It is understood that a subsequent heat treatment causes diffusions at the interfaces between the second antiferromagnetic layer 24 and the first and third antiferromagnetic layers 23 and 25. Accordingly, in the state after the heat treatment, the ratio of the atomic percent of the element X or the elements X+X' to Mn in the third region between the interface H facing the pinned magnetic layer 3 and the second imaginary boundary plane (broken line F) adjacent to the interface H, as well as that in the first region between the interface I facing the seed layer 22 and the first imaginary boundary plane (broken line G) adjacent to the interface I, is greater than the ratio of the atomic percent of the element X or the elements X+X' to Mn in the second region between these imaginary boundary planes. In addition, the ratio of atomic percent of the element X or the elements X+X' to Mn linearly or non-linearly increases from the second region towards the third region across the second imaginary boundary plane (broken line F). Likewise, the ratio increases linearly or non-linearly from the second region towards the first region across the first imaginary boundary plane (broken line G). In particular, the non-linear change described above is liable to occur when the composition ratio of the element X or the elements X+X' is significantly greater in each of the first and third antiferromagnetic layers 23 and 25 than in the second antiferromagnetic layer 24.

It is thus understood that, in the antiferromagnetic layer 4 after the heat treatment, the composition ratio (atomic percent) of the element X or the elements X+X' increases from a certain thicknesswise central portion towards the interface H adjacent to the pinned magnetic layer 3 and increases also from the above-mentioned thicknesswise central portion towards the interface I adjacent to the seed layer 22. This is due to the fact that the composition ratio of the element X or the elements X+X' is greater in each of the first and third antiferromagnetic layers 23 and 25 than in the second antiferromagnetic layer 24.

The heat treatment also causes diffusions of the compositions between the antiferromagnetic layer 4 and the pinned magnetic layer 3 across the interface H and between the antiferromagnetic layer 4 and the seed layer 22 across the interface I. Accordingly, the composition ratio of the element X or the elements X+X' is decreased from that achieved in the as-deposited state, at each of the regions near these interfaces H and I.

In accordance with the present invention, therefore, the antiferromagnetic layer 4 preferably has a region near the interface I adjacent to the seed layer 22, in which the atomic percent of the element X or the elements X+X' decreases in a direction towards the seed layer 22. In addition, a region exists near the interface H adjacent to the pinned magnetic layer 3, in which the atomic percent of the element X or the elements X+X' decreases in a direction towards the pinned magnetic layer 3.

The diffusion of elements occurring at each of the interface H between the antiferromagnetic layer 4 and the pinned magnetic layer 3 and the interface I between the antiferromagnetic layer 4 and the seed layer 22 causes the atomic percent of the element X or the elements X+X' to be decreased in the region near each of these interfaces H and I from the atomic percent that was achieved in the as-deposited state. Accordingly, a proper transformation from a disordered lattice to an ordered lattice takes place in the regions near these interfaces H and I, making it possible to produce a large exchange coupling magnetic field.

In the antiferromagnetic layer 4 after the heat treatment, the region in which the composition ratio (atomic percent) of the element X or the elements X+X' increases towards the interface F adjacent to the pinned magnetic layer 3 has a depth about 3 Å to about 30 Å as measured from this interface F towards the thicknesswise center of the antiferromagnetic layer 4. Likewise, the region in which the composition ratio (atomic percent) of the element X or the elements X+X' increases in a direction towards the interface I adjacent to the seed layer 22 has a depth about 3 Å to about 30 Å as measured from this interface I towards the thicknesswise center of the antiferromagnetic layer 4. These thickness ranges are the preferred thicknesses of the first and third antiferromagnetic layers 23 and 25 in the as-deposited state prior to the heat treatment.

Preferably, the antiferromagnetic layer 4 has a thickness which is at least about 76 Å. As explained before with reference to FIG. 4 in connection with the production process, each of the first and third antiferromagnetic layers has the minimum thickness of 3 Å, while the minimum thickness required for the second antiferromagnetic layer 24 is 70 Å, so that the minimum required thickness of the whole first antiferromagnetic layer 4 is 76 Å. Thus, in accordance with the present invention, the minimum thickness required for the antiferromagnetic layer 4 is as small as about 76 Å, which is significantly smaller than that required for the conventional structure.

A hard bias layer 5 for aligning the magnetization of the free magnetic layer 1, as well as a conductive layer 8, is formed on each side of the laminate structure including the lowermost underlying layer 6 and the topmost protective layer 7 and the layers intermediate therebetween, as shown in FIG. 1.

Although the laminate structure as deposited (prior to the heat treatment) employing the seed layer 22 as shown in FIG. 4 has the antiferromagnetic layer 4 composed of three layers which serve to enhance the exchange coupling magnetic field, the present invention does not exclude the use of an antiferromagnetic layer 4 having a uniform X—Mn or a uniform X+X' composition. In such a case, it is necessary that a non-aligned crystal lattice state is created over at least part of the interface between the seed layer 22 and the antiferromagnetic layer 4, or that the seed layer 22 and the antiferromagnetic layer 4 are made to have different lattice constants over at least part of this interface. Preferably, a non-aligned crystal lattice state is created over at least part of the interface between the seed layer 22 and the antiferromagnetic layer 4 and, at the same time, the seed layer 22 and the antiferromagnetic layer 4 are made to have different lattice constants over at least part of this interface.

For example, a single-layered antiferromagnetic layer 4 is formed of a $Pt_{52}Mn_{48}$ alloy. The antiferromagnetic layer 4 made of such a Pt—Mn alloy exhibits a comparatively small degree of non-aligned crystal lattice state with respect to the seed layer 22 and the pinned magnetic layer 3 SO that the exchange coupling magnetic field correspondingly decreases. Nevertheless, the resistance variation ratio is improved by virtue of the presence of the seed layer 22, because the crystalline structure of at least part of the antiferromagnetic layer 4 has a CuAu—I type cubic ordered lattice and the above-mentioned layers have such crystal orientations that the (111) faces are substantially oriented in a direction parallel to the antiferromagnetic layer 4 and the pinned magnetic layer 3 to create a non-aligned crystal lattice state over at least part of the interface between the antiferromagnetic layer 4 and the seed layer 22. In this case also, the antiferromagnetic layer 4 and the seed layer 22 may have different lattice constants over at least part of the interface therebetween.

In accordance with the invention, the antiferromagnetic layer 4 may be composed of the second antiferromagnetic layer 24 and the third antiferromagnetic layer 25, with the first antiferromagnetic layer 23 adjacent to the pinned magnetic layer 3 being omitted. In such a case, the restraint force produced by the crystalline structure of the pinned magnetic layer 3 tends to provide a greater influence at the interface adjacent to the pinned magnetic layer 3 to reduce the exchange coupling magnetic field. This problem is not critical however if the interface adjacent to the seed layer 22 is held in a state to avoid the influence of the restraint force produced by the crystalline structure of the seed layer 22. Accordingly, the exchange coupling field is still greater as compared with the case where a significant influence is caused by the restraint force produced by the crystalline structure of the seed layer 22 at the interface adjacent to the seed layer 22. The proper transformation of the antiferromagnetic layer 4 from a disordered lattice to an ordered lattice is ensured to a certain degree, without impairing the large resistance variation ratio offered by the presence of the seed layer 22. In this case, the antiferromagnetic layer 4 has a composition modulation similar to that explained before with reference to FIG. 3. In particular, it is preferred that the antiferromagnetic layer 4 has a region in which the ratio of the atomic percent of the element X or the elements X+X' to Mn increases in a direction towards the seed layer 22. Assuming a first imaginary boundary plane parallel to the interface adjacent to the seed layer 22 at the same side of the thicknesswise central portion of the antiferromagnetic layer 4 as the seed layer 22, and a second imaginary boundary plane parallel to the interface adjacent to the pinned magnetic layer 3 at the same side of the thicknesswise central portion as the pinned magnetic layer 3, wherein the aforementioned ratio is greater in the region between the interface adjacent the seed layer 22 and the first imaginary boundary plane than in the region between the first and second imaginary boundary planes. The ratio increases linearly or non-linearly across the first imaginary boundary plane towards the interface adjacent to the seed layer 22. It is also preferred that a non-aligned crystal lattice state is created over at least part of the interface between the seed layer 22 and the antiferromagnetic layer 4. It is also preferred that a non-aligned crystal lattice state is created over at least part of the interface between the seed layer 22 and the antiferromagnetic layer 4.

Preferably, the antiferromagnetic layer 4 has a region starting from a certain thicknesswise position towards the seed layer 22 in which the atomic percent of the element X or the elements X+X' increases in a direction towards the seed layer 22 and more preferably, the antiferromagnetic layer 4 further has a region near the interface adjacent to the seed layer 22 in which the atomic percent of the element X or the elements X+X' decreases in a direction towards the seed layer 22.

In the case where the seed layer 22 is employed, the material of the antiferromagnetic layer 4 is not limited to the X—Mn alloy or the X—Mn—X' alloy which are mentioned heretofore. For example, it is possible to use an Ni—Mn alloy that has been conventionally used as an antiferromagnetic material, or other antiferromagnetic material free of Mn. The large resistance variation ratio offered by the invention due to the presence of the seed layer 22 is achievable even when such materials are used.

In addition, the three-layered structure of the antiferromagnetic layer 4 as shown in FIG. 4 may be employed even when the laminate structure lacks the seed layer 22 as in FIG. 2. Assuming that the antiferromagnetic layer 4 in the structure of FIG. 2 is composed of three layers and that the structure is subjected to a heat treatment, the antiferromagnetic layer 4 after the heat treatment will have a region in which the ratio of the atomic percent of the element X or the elements X+X' to Mn increases in a direction towards the pinned magnetic layer 3 starting from a thicknesswise central portion, and a region in which the ratio of the atomic percent of the element X or the elements X+X' to Mn increases in a direction towards the protective layer starting from the above-mentioned thicknesswise central portion. The crystalline structure of at least part of the antiferromagnetic layer 4 has a CuAu—I type face-centered cubic ordered lattice. In this case also, it is preferred that a non-aligned crystal lattice state is created over at least part of the interface adjacent to the pinned magnetic layer 3 or that the antiferromagnetic layer 4 and the pinned magnetic layer 3 have different lattice constants over at least part of the above-mentioned interface. The structure shown in FIG. 2 has the protective layer 7 made of a non-magnetic material selected from the group consisting of Ta, Hf, Nb, Zr, Ti, Mo, and W and combinations thereof, formed on the side of the antiferromagnetic layer 4 opposite to the pinned magnetic layer 3A diffusion of elements takes place between the protective layer 7 and the antiferromagnetic layer 4, with the result that a region is formed near the interface adjacent to the protective layer 7, in which the atomic percent of the element X or the elements X+X' progressively decreases.

Each of the laminate structures shown in FIGS. 2 to 5 can be employed in a variety of types of magnetoresistive sensors. In the laminate structures of FIGS. 2 and 3, the antiferromagnetic layer 4 may be deposited on the lower side of the pinned magnetic layer 3, although in these Figures the antiferromagnetic layer 4 is deposited on the upper side of the pinned magnetic layer 3.

In such a case, the exchange coupling film is formed by depositing, starting from the lower side, the second antiferromagnetic layer 15, the first antiferromagnetic layer 14, and the pinned magnetic layer 3 in this order. The thickness requirements for the first and second antiferromagnetic layers 14 and 15 are the same as those described before with reference to FIG. 2.

The structure having the antiferromagnetic layer 4 formed on the lower side of the pinned magnetic layer 3 can be used as, for example, a single-spin-valve type magnetoresistive sensor as shown in FIG. 6. The single spin valve type magnetoresistive sensor shown in FIG. 6 has a laminate structure composed of an underlying layer 6, an antiferromagnetic layer 4, a pinned magnetic layer 3, a non-magnetic intermediate layer 2, a free magnetic layer 1, and a protective layer 7 which are sequentially deposited from the bottom in this order. A hard bias layer 5 and a conductive layer 8 are formed on each side of the laminate structure.

In the production of the single-spin-valve type magnetoresistive sensor of FIG. 6, the antiferromagnetic layer 4 may be deposited to have a three-layered structure similar to that explained before with reference to FIG. 4. More specifically, the third antiferromagnetic layer 25, the second antiferromagnetic layer 24 and the first antiferromagnetic layer 23 are formed in this order on the underlying layer 6. Materials, compositions and thicknesses of these antiferromagnetic layers may be the same as those described before in connection with FIG. 4.

A subsequent heat treatment causes diffusions of compositions from and into the respective antiferromagnetic layers. Accordingly, the antiferromagnetic layer 4, as heat-treated, has a region in which the ratio of the atomic percent of the element X to Mn increases in a direction towards the pinned magnetic layer 3 starting from a thicknesswise central portion of the antiferromagnetic layer 4. Additionally, a region is formed in which the ratio of the atomic percent of the element X to Mn increases in a direction towards the pinned magnetic layer 3 starting from the thicknesswise central portion of the antiferromagnetic layer 4. The crystalline structure of at least part of the antiferromagnetic layer 4 has a CuAu—I type face-centered cubic ordered lattice. Preferably, a non-aligned crystal lattice state is created over at least part of the interface adjacent to the pinned magnetic layer 3 or, alternatively, both layers on this interface employ difference lattice constants.

The process forming the antiferromagnetic layer 4 described above is not exclusive, and the first antiferromagnetic layer 4 may be formed by varying the sputter gas pressure so that the atomic percent of the element X or the elements X+X' is progressively changed n the thicknesswise direction, while using the same target.

In the laminate structures of FIGS. 4 and 5 having the seed layer 22, the antiferromagnetic layer 4 may be deposited on the upper side of the pinned magnetic layer 3, although in these Figures the antiferromagnetic layer 4 is deposited on the lower side of the pinned magnetic layer 3. Such a laminate structure can be used as a single-spin-valve type magnetoresistive sensor of the type shown in FIG. 1.

In particular, the laminate structure is formed by sequentially depositing an underlying layer 6, a free magnetic layer 1, a non-magnetic intermediate layer 2, a pinned magnetic layer 3, an antiferromagnetic layer 4, a seed layer 22, and a protective layer 7, with a hard bias layer 5 and a conductive layer formed at each side of the laminate structure. Requirements concerning the crystalline structure and material of the seed layer 22 are the same as those described before with reference to FIGS. 4 and 5.

Figure 7:
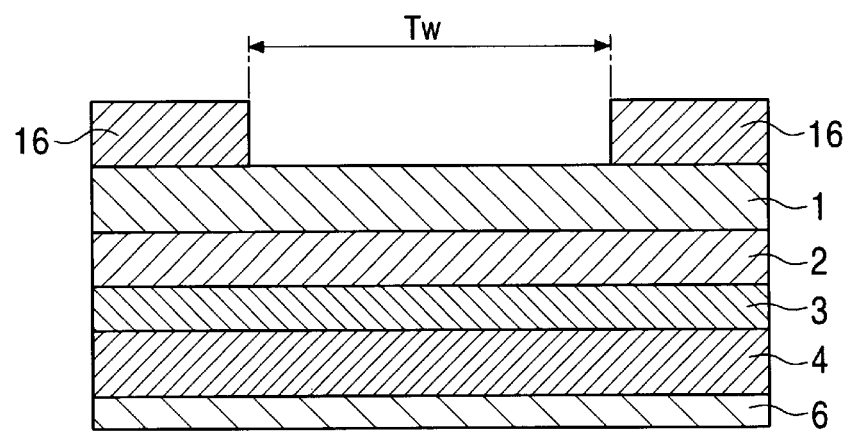
FIG. 7 is a cross-sectional view of the structure of a single spin valve type magnetoresistive sensor in accordance with a third embodiment of the present invention, as viewed from the same side as an ABS surface.
Figure 8:
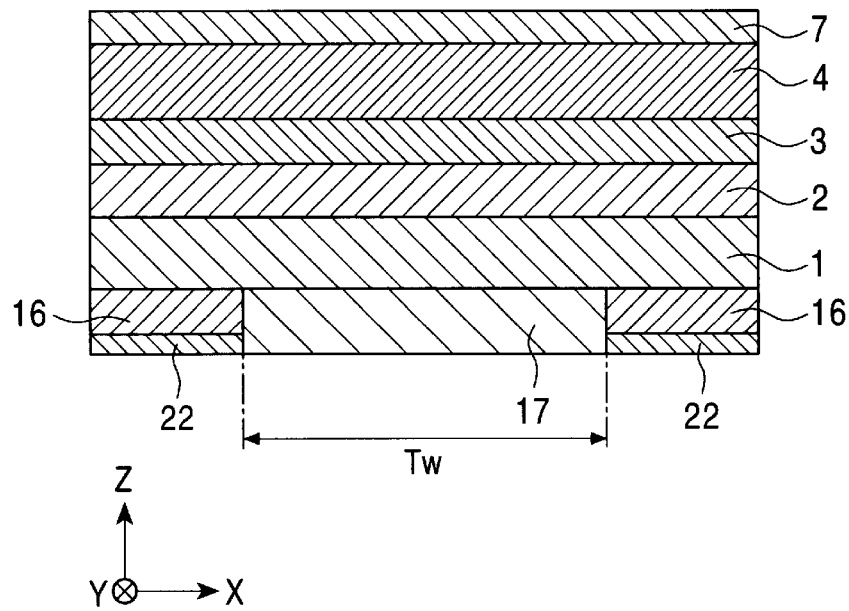
FIG. 8 is a cross-sectional view of the structure of a single spin valve type magnetoresistive sensor in accordance with a fourth embodiment of the present invention, as viewed from the same side as an ABS surface.

FIGS. 7 and 8 are cross-sectional views of different forms of the single-spin-valve type magnetoresistive sensor in accordance with the present invention. Referring to FIG. 7, an underlying layer 6, an antiferromagnetic layer 4, a pinned magnetic layer 3, a non-magnetic intermediate layer 2, and a free magnetic layer 1 are sequentially deposited from the bottom. Thus, the antiferromagnetic layer 4 is formed on the lower side of the pinned magnetic layer 3 in this embodiment.

In the production of this magnetoresistive sensor, the second antiferromagnetic layer 15 and the first antiferromagnetic layer 14 are deposited on the underlying layer 6, so as to form the antiferromagnetic layer 4. The pinned magnetic layer 3 is formed on the antiferromagnetic layer 4. Alternatively, the antiferromagnetic layer 4 may have a three-layered structure such as that described before with reference to FIG. 4. Preferably, each of the first antiferromagnetic layer 14 and the second antiferromagnetic layer 15 is an X—Mn alloy (X is selected from the group of elements consisting of Pt, Pd, Ir, Rh, Ru, and Os, and combinations thereof. In particular, a Pt—Mn alloy, or from an X—Mn—X' alloy (X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof).

In accordance with the present invention, it is preferred that a non-aligned crystal lattice state is created over at least part of the interface between the first antiferromagnetic layer 14 and the pinned magnetic layer 3. The second antiferromagnetic layer 15 is formed of an antiferromagnetic material having a composition approximating an ideal composition that allows easy transformation from disordered lattice structure to ordered lattice structure when heat-treated. The requirements concerning the composition ratios of the element X or the elements X+X' and the thickness in the first antiferromagnetic layer 14 and the second antiferromagnetic layer 15 are the same as those explained before with reference to FIG. 2.

The process forming the antiferromagnetic layer 4 described above is not exclusive, and the first antiferromagnetic layer 4 may be formed by varying the sputter gas pressure so that the atomic percent of the element X or the elements X+X' is progressively changed n the thicknesswise direction, while using the same target.

A heat treatment is conducted after the deposition of the antiferromagnetic layer 4. The heat treatment causes a proper transformation from disordered lattice structure into ordered lattice structure in the second antiferromagnetic layer 15. Additionally, a diffusion of elements at the boundary between the first antiferromagnetic layer 14 and the second antiferromagnetic layer 15 takes place whereby a transformation from disordered lattice structure into an ordered lattice structure is properly effected in the first antiferromagnetic layer 14.

Preferably, the ratio of the atomic percent of the element X or the elements X+X' in the state after the heat treatment increases in a direction towards the pinned magnetic layer 3. Accordingly, the crystalline structure of at least part of the antiferromagnetic layer 4 has a CuAu—I type face-centered cubic ordered lattice, and with a non-aligned crystal lattice state is created over at least part of the interface between the antiferromagnetic layer 4 and,the pinned magnetic layer 3. It is also preferred that the pinned magnetic layer 3 and the antiferromagnetic layer 4 have different lattice constants or different crystal orientations at the interface therebetween.

When the antiferromagnetic layer 4 has been deposited to have a three-layered structure as shown in FIG. 4 or when the antiferromagnetic layer 4 has been deposited such that the composition ratio of the element X or the elements X+X' progressively decreases in a direction towards the thicknesswise central portion from both interfaces on the antiferromagnetic layer 4, the heat-treated antiferromagnetic layer 4 has a region in which the ratio of the atomic percent of the element X to Mn progressively increases in a direction towards the pinned magnetic layer 3 starting from a thicknesswise central portion of the antiferromagnetic layer 4. Additionally, a region is formed in which the ratio of the atomic percent of the element X to Mn progressively increases in a direction towards the underlying layer 6 starting from the above-mentioned thicknesswise central portion of the antiferromagnetic layer 4. In addition, the crystalline structure of at least part of the antiferromagnetic layer 4 has a CuAu—I type face-centered cubic ordered lattice and. Preferably, a non-aligned crystal lattice state is created over at least part of the interface adjacent to the pinned magnetic layer 3 or, alternatively, both layers on the above-mentioned interface have different lattice constants or different crystal orientations.

As shown in FIG. 7, segments 16 of the exchange bias layer are formed on the free magnetic layer 1, leaving therebetween a space corresponding to the track width Tw in the track width direction. The exchange bias layer 16 is formed from an X—Mn alloy (X is selected from the group of elements consisting of Pt, Pd, Ir, Rh, Ru, and Os, and combinations thereof), a Pt—Mn alloy, or an X—Mn—X' alloy (X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof).

Deposition of the exchange bias layer 16 employs the steps of forming a first antiferromagnetic layer 14 on the free magnetic layer 1, and forming a second antiferromagnetic layer 15 on the first antiferromagnetic layer 14. These first antiferromagnetic layer 14 and second antiferromagnetic layer 15 are the same of those shown in FIG. 2. In particular, the first antiferromagnetic layer 14 has a greater composition ratio of the element X or the elements X+X' than the second antiferromagnetic layer 15. In addition, the second antiferromagnetic layer 15 is formed of an antiferromagnetic material having a composition approximating an ideal composition that permits east transformation from disordered lattice structure into ordered lattice structure when heat-treated.

As a result of the above-described heat treatment, the exchange bias layer 16 is properly transformed from disordered lattice structure into ordered lattice structure, without undergoing the restraint force produced by the crystalline structure of the pinned magnetic layer 3 at the interface adjacent to the free magnetic layer 1. Accordingly, an exchange coupling magnetic field is generated at the interface between the exchange bias layer 16 and the free magnetic layer 1.

The exchange bias layer 16 after the heat treatment has a region in which the ratio of the atomic percent of the element x or elements X+X' to Mn increases towards the free magnetic layer 1. Also, the crystalline structure of at least part of the exchange bias layer 16 has a GuAu—I type face-centered cubic ordered lattice. Preferably, a non-aligned crystal lattice state is created over at least part of the interface adjacent to the free magnetic layer 1.

The exchange bias layer 16 may be formed to have a three-layered structure, such as that described before with reference to FIG. 4. In this case, the exchange bias layer 16 has a region in which the ratio of the atomic percent of the element X to Mn increases in a direction towards the free magnetic layer 1 starting from the thicknesswise central region of this layer, and a region in which the ratio of the atomic percent of the element X to Mn increases in the direction away from the free magnetic layer 1 starting from the thicknesswise central region of this layer. In addition, the crystalline structure of at least part of the exchange bias layer 16 has a CuAu—I type face-centered cubic ordered lattice and. Preferably, a non-aligned crystal lattice state is created over at least part of the interface adjacent to the free magnetic layer 1 or, alternatively, both layers on the above-mentioned interface have different lattice constants or different crystal orientations.

Both end portions of the free magnetic layer 1 are formed into single magnetic domain in the X direction by the effect of the exchange coupling magnetic field acting between the exchange bias layer 16 and the free magnetic layer 1. Also, the region of the free magnetic layer 1 extending over the width Tw corresponding to the track width has been properly aligned in the X direction to such a degree as to be sensitive to external magnetic fields.

In the single-spin-valve type magnetoresistive sensor produced by the described process, the magnetization of the free magnetic layer 1 at the region of the track width Tw changes from the X direction to Y direction under the influence of an external magnetic field which is applied in the Y direction. Electric resistance is changed based on the relationship between the change of the magnetization in the free magnetic layer 1 and the fixed direction (Y direction) of magnetization of the pinned magnetic layer 3, the change in the electrical resistance causing a change in a voltage, thus enabling sensing of magnetic field leaking from a recording medium.

The single-spin-valve type magnetoresistive sensor of FIG. 7 may have a seed layer 22 such as that explained before with reference to FIGS. 4 and 5. In such a case, the seed layer 22 is interposed between the antiferromagnetic layer 4 and the underlying layer 6. The seed layer has a crystalline structure primarily constituted by face-centered cubic crystals, with the (111) face substantially oriented in a direction parallel to the interface adjacent to the antiferromagnetic layer 4. The use of the seed layer 22 permits substantial orientations of the (111) plane in the layers inclusive of the antiferromagnetic layer 4 and the free magnetic layer 1, as well as the intervening layers, thus allowing the crystal grains to grow large. It is therefore possible to increase the ratio of the resistance variation.

The requirements concerning the material of the seed layer 22 and the structure of the antiferromagnetic layer 4 are the same as those described before with reference to FIGS. 4 and 5. The seed layer 22 may be formed on the exchange bias layer 16

FIG. 8 shows a single-spin-valve type magnetoresistive sensor having a laminate structure deposited in the order reverse to that of the magnetoresistive sensor of FIG. 7. As shown in FIG. 8, an exchange bias layer is formed to have portions 16 at both lateral sides being spaced apart in the track width direction (X direction in the drawings). The space between these portions 16 of the exchange bias layer is filled with an insulating layer 17 made of an insulating material such as $SiO_2$ or $Al_2O_3$. A free magnetic layer 13 is formed to overlie the exchange bias layer 16 and the insulating layer 17. In this embodiment also, the exchange bias layer 16 as deposited, i.e., prior to the heat treatment, has a laminate structure composed of a first antiferromagnetic layer 14 and a second antiferromagnetic layer 15.

More specifically, the second antiferromagnetic layer 15 is deposited first, followed by deposition of the first antiferromagnetic layer 14 thereon, and the widthwise central portion of the first antiferromagnetic layer 14 and second antiferromagnetic layer 15 is removed by etching for example. Accordingly, the segments 16 of the exchange bias layer are obtained, the vacancy between the segments 16 of the exchange bias layer are then filled with the insulating layer 17, followed by deposition of the free magnetic layer 17 overlying the exchange bias layer 16 and the insulating layer 17. The first antiferromagnetic layer 14 constituting part of the exchange bias layer 16 has a greater composition ratio of the element X or the elements X+X' than the second antiferromagnetic layer 15, which constitutes the other part of the exchange bias layer 16. In addition, the second antiferromagnetic layer 15 is formed of an antiferromagnetic material having a composition approximating an ideal composition that permits easy transformation from the disordered lattice structure into ordered lattice structure. The requirements concerning the composition ratios of the element X or the elements X+X' and the thickness in the first antiferromagnetic layer 14 and the second antiferromagnetic layer 15 and the thicknesses of these layers are the same as those explained before with reference to FIG. 2.

The laminate structure after deposition up to the free magnetic layer 1 is subjected to a heat treatment. As a result of the heat treatment, the exchange bias layer 16 is properly transformed to change its structure from disordered lattice structure into ordered lattice structure, without being influenced by the restraint force of the crystalline structure of the free magnetic layer 1 at the interface adjacent to the free magnetic layer 1. An exchange coupling magnetic field is generated at the boundary between the exchange bias layer 16 and the free magnetic layer 1.

The exchange bias layer 16, after the heat treatment, has a region in which the ratio of the atomic percent of the element x or elements X+X' to Mn increases in a direction towards the free magnetic layer 1. Also, the crystalline structure of at least part of the exchange bias layer 16 has a CuAu—I type face-centered cubic ordered lattice. Preferably, a non-aligned crystal lattice state is created at at least part of the interface adjacent to the free magnetic layer 1. Both end portions of the free magnetic layer 1 are formed into single magnetic domain in the X direction by the effect of the aforesaid exchange coupling magnetic field. The region of the free magnetic layer 1 extending over the width Tw corresponding to the track width has been properly aligned in the X direction to such a degree as to be sensitive to external magnetic fields.

The exchange bias layer 16 after the heat treatment, has a region in which the ratio of the atomic percent of the element x or elements X+X' to Mn increases in a direction towards the free magnetic layer 1. Also, the crystalline structure of at least part of the exchange bias layer 16 has a CuAu—I type face-centered cubic ordered lattice. Preferably, a non-aligned crystal lattice state is created over at least part of the interface adjacent to the free magnetic layer 1. Both end portions of the free magnetic layer 1 are formed into single magnetic domain in the X direction by the effect of the aforesaid exchange coupling magnetic field. The region of the free magnetic layer 1 extending over the width Tw corresponding to the track width has been properly aligned in the X direction to such a degree as to be sensitive to external magnetic fields.

Then, the non-magnetic intermediate layer 2, the pinned magnetic layer 3, the antiferromagnetic layer 4 and the protective layer 7 are sequentially deposited on the free magnetic layer 1. In accordance with the invention, the first antiferromagnetic layer 14 is formed on the pinned magnetic layer 3 and the second antiferromagnetic layer 15 is formed on the first antiferromagnetic layer 13, in the as-deposited state prior to the heat treatment. In the as-deposited state, the first antiferromagnetic layer 14 has a greater composition ratio of the element X or the elements X+X' than that of the second antiferromagnetic layer 15. Preferably, a non-aligned crystal lattice state has been created over at least part of the interface adjacent to the pinned magnetic layer 3. In addition, the second antiferromagnetic layer 15 is made of an antiferromagnetic material having a composition approximating an ideal composition that permits easy transformation from a disordered lattice to an ordered lattice upon heat treatment.

A heat treatment is effected after the deposition of the first antiferromagnetic layer 14 and the second antiferromagnetic layer 15. As a result of this heat treatment, the structure of the antiferromagnetic layer 4 is properly transformed from a disordered lattice to an ordered lattice, without being restrained by the factors, such as the crystalline structure of the pinned magnetic layer 3 at the interface adjacent to the pinned magnetic layer 3. Accordingly, an exchange coupling magnetic field is generated at the interface between the antiferromagnetic layer 4 and the pinned magnetic layer 3. The exchange coupling magnetic field serves to fix the magnetization of the pinned magnetic layer 3 in the direction of the arrow Y shown in the drawings.

In accordance with the present invention, the antiferromagnetic layer 4 under the heat treatment is not restrained by the factors such as the crystalline structure of the pinned magnetic layer 3, at the interface between the antiferromagnetic layer 4 and the pinned magnetic layer 3. In addition, the antiferromagnetic layer 4 is made of an antiferromagnetic material having a composition approximating an ideal composition that permits easy transformation from a disordered lattice to an ordered lattice upon heat treatment. Consequently, an exchange coupling magnetic field greater than that obtainable with conventional devices can be produced at the interface between the antiferromagnetic layer 4 and the pinned magnetic layer 3. Specifically, a large magnetic field of about $7.9 \times 10^4$ (A/m) is expectable.

The antiferromagnetic layer 4 may be composed of three layers as is the case of the antiferromagnetic layer 4 shown in FIG. 4. In such a case, as a result of the heat treatment, the antiferromagnetic layer 4 is caused to have a region in which the ratio of the atomic percent of the element X to Mn increases in a direction towards the pinned magnetic layer 3 starting from a thicknesswise central portion, and a region in which the ratio of the atomic percent of the element X to Mn increases in a direction towards the protective layer 7. In addition, the crystalline structure of at least part of the antiferromagnetic layer 4 has a CuAu—I type face-centered cubic ordered lattice. Preferably, a non-aligned crystal lattice state is created over at least part of the interface adjacent to the pinned magnetic layer 3 or, alternatively, both layers on the above-mentioned interface have different lattice constants or different crystal orientations.

This embodiment also can employ a seed layer 22. The seed layer 22 is formed between the antiferromagnetic layer 4 and the protective layer 7. The provision of the seed layer 22 serves to increase the exchange coupling magnetic field. The requirements concerning the material of the seed layer 22 and the structure of the antiferromagnetic layer 4 are the same as those described before with reference to FIGS. 4 and 5.

Preferably, the seed layer 22 is formed at the lower side of the exchange bias layer 16, as shown in FIG. 8. The seed layer 22 serves to order the crystalline orientation of the exchange bias layer 22, thus enabling generation of appropriate exchange coupling magnetic field between the exchange bias layer 16 and the free magnetic layer 1.

Figure 9:
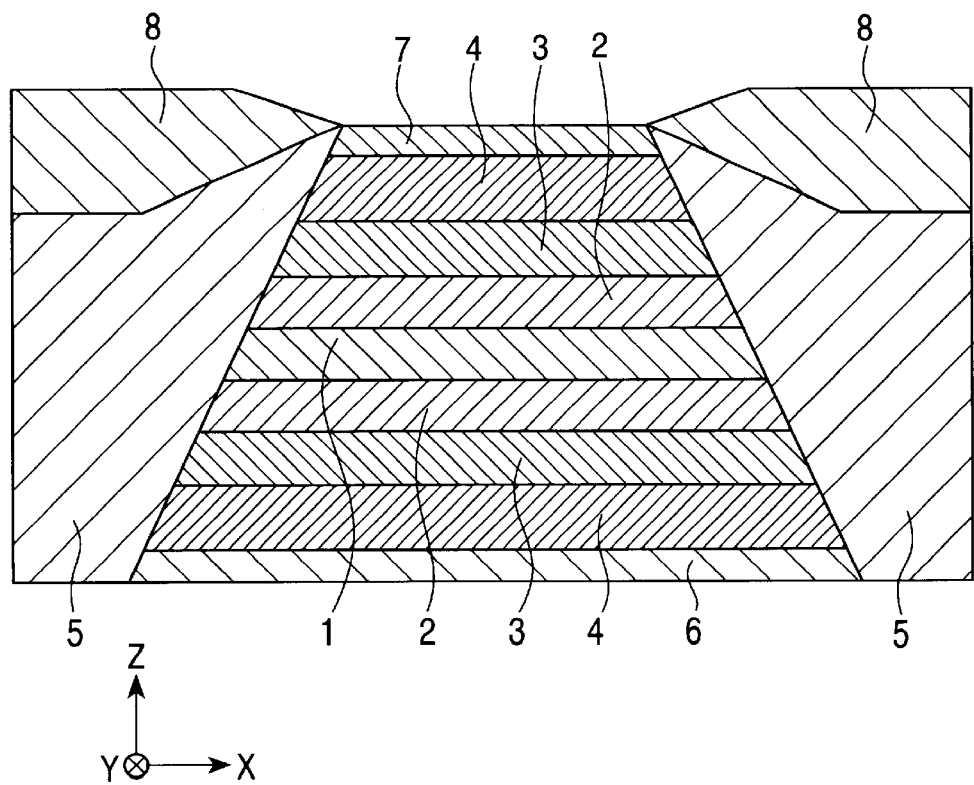
FIG. 9 is a cross-sectional view of the structure of a single spin valve type magnetoresistive sensor in accordance with a fifth embodiment of the present invention, as viewed from the same side as an ABS surface.

FIG. 9 is a cross-sectional view showing the structure of a dual-spin-valve type magnetoresistive sensor in accordance with the present invention. As will be seen from FIG. 9, an underlying layer 6, an antiferromagnetic layer 4, a pinned magnetic layer 3, a non-magnetic intermediate layer 2, and a free magnetic layer 1 are sequentially deposited. Further, another non-magnetic intermediate layer 2, another pinned magnetic layer 3, another antiferromagnetic layer 4 and a protective layer 7 are sequentially deposited on the free magnetic layer 1. Hard bias layers 5 and conductive layers 8 are formed on both lateral sides of the laminate structure having the underlying layer 6 and the protective layer 7. The described layers are made of materials which are the same as those described before with reference to FIGS. 1 to 7.

Figure 10:
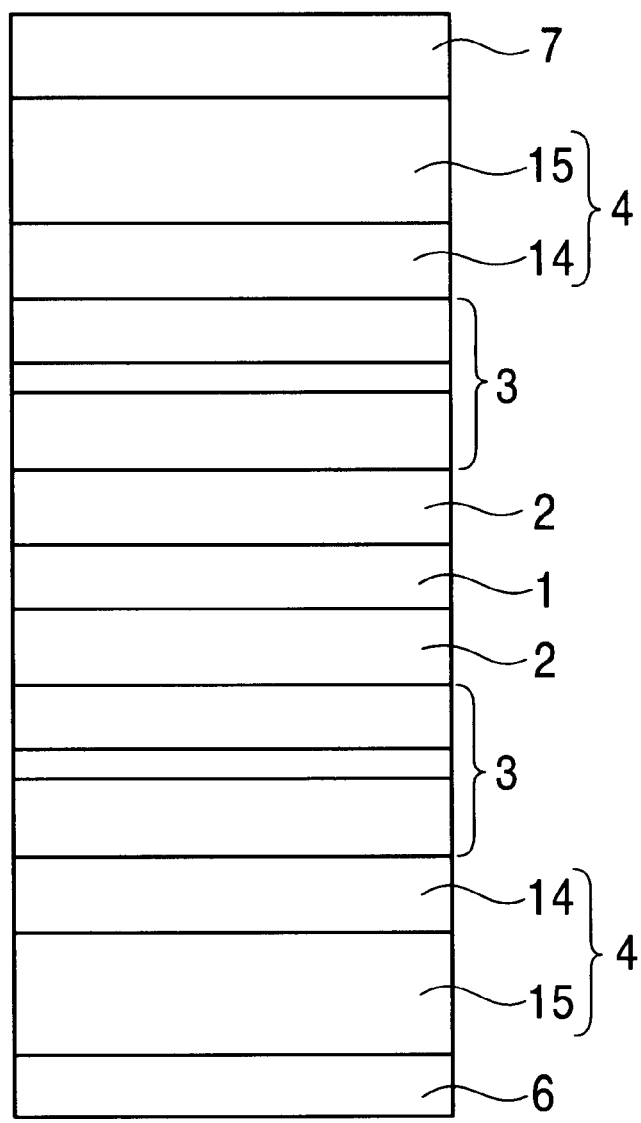
FIG. 10 is a schematic illustration of a dual-spin valve type laminate structure in a state after deposition.

A description will now be given of a production process, with reference to FIG. 10. The deposition is conducted such that each of the two antiferromagnetic layers 4 has a two-layered structure composed of a first antiferromagnetic layer 14 and a second antiferromagnetic layer 15. The first antiferromagnetic layer 15 is formed in contact with the pinned magnetic layer 3, while the second antiferromagnetic layer 15 is formed in contact with the first antiferromagnetic layer 14. Each of the first and second antiferromagnetic layers 14 and 15 is formed of the above-mentioned X—Mn alloy or X—Mn—X' alloy.

In the as-deposited state, the first antiferromagnetic layer 14 has a greater composition ratio of the element X or the element X+X' than the second antiferromagnetic layer 15. Preferably, a non-aligned crystal lattice state is created over at least part of the interface adjacent to the pinned magnetic layer 3. In addition, the second antiferromagnetic layer 15 is formed from an antiferromagnetic material having a composition approximating an ideal composition that permits easy transformation from disordered lattice structure to ordered lattice structure when heat-treated. Requirements for the composition ratios of the element X or the elements X+X' and thicknesses of the respective antiferromagnetic layers are the same as those described before with reference to FIG. 2.

The heat treatment is executed after the deposition of the antiferromagnetic layer 14 and the second antiferromagnetic layer 15. As a result of the heat treatment, the antiferromagnetic layer 4 is properly transformed to change its disordered lattice structure into ordered lattice structure, without being influenced by the restraint force produced by the crystalline structure of the pinned magnetic layer 3 at the interface adjacent to the pinned magnetic layer 3. An exchange coupling magnetic field generated at the above-mentioned interface serves to fix the magnetization of the pinned magnetic layer 3 in the direction Y shown in the drawings.

Since in the deposition process the first antiferromagnetic layer 14 is formed of a suitable material free from the influence of the restraint force produced by the crystalline structure of the magnetoresistive layer 20 at the interface adjacent to this layer 20, and since the second antiferromagnetic layer 15 is formed from a material having a composition approximating an ideal composition that permits easy transformation from disordered lattice structure to ordered lattice structure, transformation from disordered lattice structure into ordered lattice structure is properly effected by the heat treatment. A non-aligned crystal lattice state is maintained between the antiferromagnetic layer 4 and the magnetoresistive layer 20. Accordingly, a greater exchange coupling magnetic field than in the conventional devices can be obtained. Specifically, an exchange coupling magnetic field of about $7.9 \times 10^4$ (A/m) or greater is expectable in accordance with the present invention.

Figure 11:
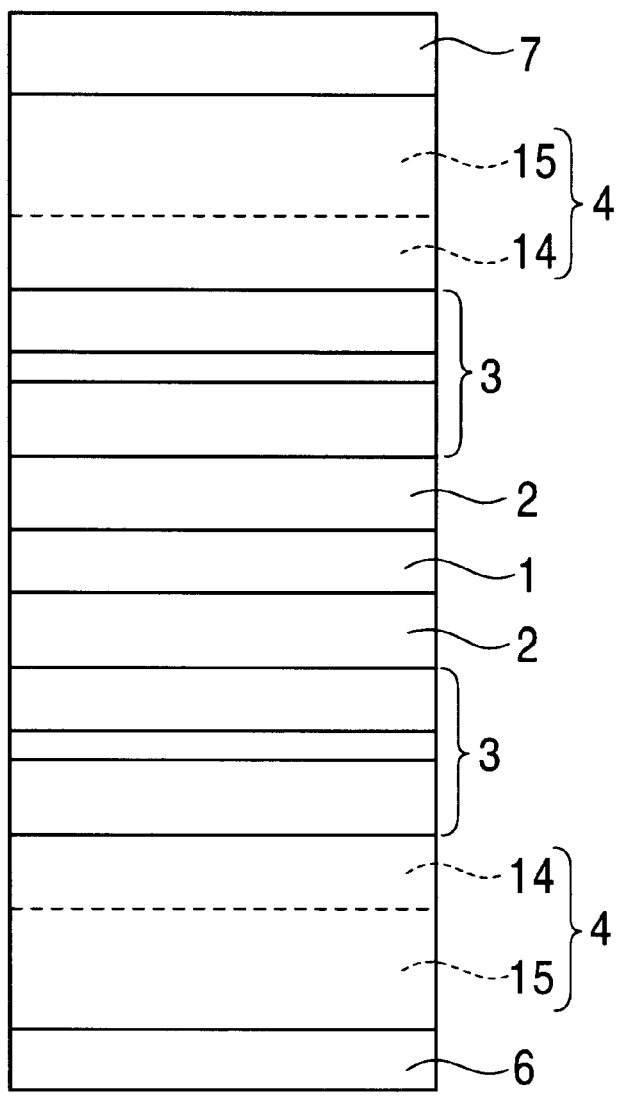
FIG. 11 is a schematic illustration of the laminate structure of FIG. 10 in a state after a heat treatment.

FIG. 11 shows the state of the structure after the heat treatment. The antiferromagnetic layer 4 shown in FIG. 11 has a region in which the ratio of atomic percent of the element X or the elements increases in a direction towards the pinned magnetic layer 3, and the crystalline structure of at least part of the antiferromagnetic layer 4 has a CuAu—I type face-centered square ordered lattice. Preferably, a non-aligned crystal lattice state is created over at least part of the interface adjacent to the pinned magnetic layer 3.

The presence of the region in the antiferromagnetic layer 4 in which the ratio of the atomic percent of the element X or elements X+X' to Mn increases in a direction towards the pinned magnetic layer 3 is attributable to the lamination of the first and second antiferromagnetic layers 14 and 15. Although the first antiferromagnetic layer 14 and the second antiferromagnetic layer 15 experience diffusion due to the heat treatment, the diffusion is still imperfect and the first antiferromagnetic layer 14 and the second antiferromagnetic layer are not completely diffused in each other. Accordingly, the antiferromagnetic layer after the heat treatment does not have completely uniform structure. Thus, the region that has been constituted by the first antiferromagnetic layer 14 still has a portion in which the composition ratio of the element X or the elements X+X' is still greater than that of a portion that has been constituted by the second antiferromagnetic layer 15. Accordingly, this region is formed in which the ratio of the atomic percent of the element X or the elements X+X' to Mn increases in a direction towards the pinned magnetic layer 3.

The antiferromagnetic layer 4 has a region near the interface adjacent to the pinned magnetic layer 3, in which the composition ratio of the element X or the elements X+X' in the antiferromagnetic layer 4 decreases in a direction towards the pinned magnetic layer 3. This is attributable to the diffusion of elements between the antiferromagnetic layer 4 and the pinned magnetic layer 3 caused by the heat treatment. Likewise, the diffusion of elements takes place also between the antiferromagnetic layer 4 and the underlying layer 6 and between the antiferromagnetic layer 4 and the protective layer 7. It is therefore understood that the antiferromagnetic layer 4 also has a region near the interface adjacent to the underlying layer 6, as well as a region near the interface adjacent to the protective layer 7, in which the composition ratio of the element X or the elements X+X' in the antiferromagnetic layer 4 decreases in a direction towards such interface.

Requirements concerning the composition ratios of the element X or the elements X+X' of the antiferromagnetic layer 4 at the interface adjacent to the pinned magnetic layer 3 or at the side opposite to this interface, thickness of the antiferromagnetic layer 4, and so forth, are the same as those described before in connection with FIG. 3.

Figure 12:
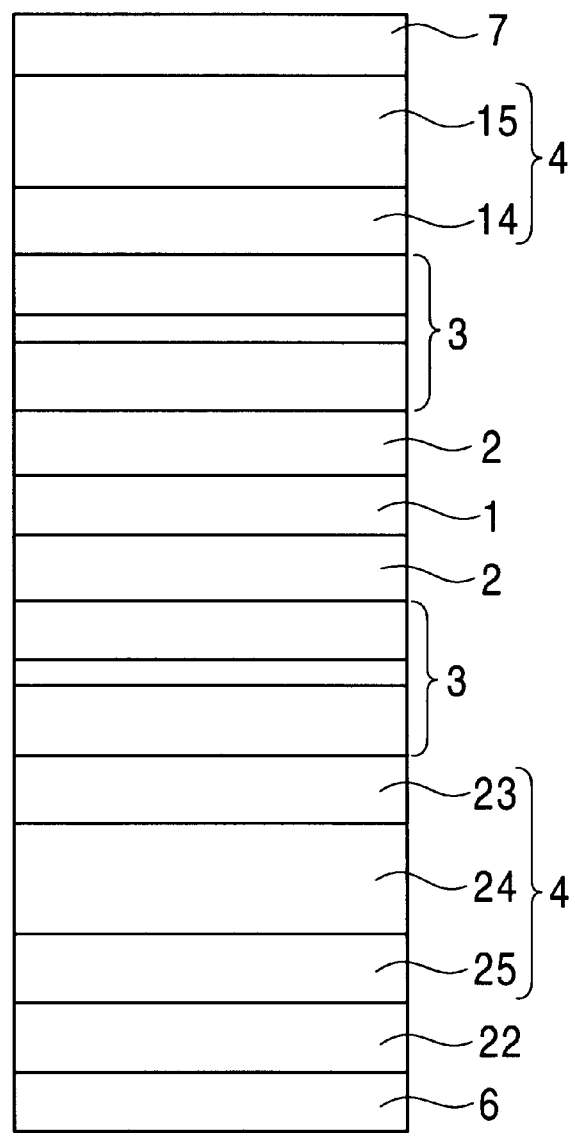
FIG. 12 is a schematic illustration of a dual-spin valve type laminate structure using a seed layer, in a state after deposition.

This embodiment also may employ a seed layer 22. The production process is illustrated in FIG. 12. As will be seen from this Figure, the seed layer 22 is formed on the underlying layer 6, and an antiferromagnetic layer 4 composed of three layers is formed on the seed layer 22. The structure formed on the antiferromagnetic layer 4 is the same as that shown in FIG. 10.

The antiferromagnetic layer 4 formed on the seed layer 22 has a third antiferromagnetic layer 25 adjacent to the seed layer 22, a first antiferromagnetic layer 23 adjacent to the pinned magnetic layer 3, and a second antiferromagnetic layer 24 interposed between the first antiferromagnetic layer 23 and the third antiferromagnetic layer 25.

As described before with reference to FIG. 4, each of the first to third antiferromagnetic layers is formed from an X—Mn alloy or an X—Mn—X' alloy, wherein a composition ratio of said element X or the elements X+X' in the second antiferromagnetic layer 24 is determined to be smaller than that in the remainder two antiferromagnetic layers. Such adjustment of the composition ratio makes it possible to create a non-aligned crystal lattice state at at least part of the interface between the seed layer 22 and the third antiferromagnetic layer 25, as well as at the interface between the pinned magnetic layer 3 and the third antiferromagnetic layer 25. The layers facing each other across each of these interfaces may have different lattice constants.

The seed layer 22 has face-centered cubic crystals with the (111) faces substantially oriented in the direction parallel to the interface adjacent to the pinned magnetic layer 3, so that the layers formed on this seed layer have crystalline structures in which their (111) faces are oriented in the direction parallel to the above-mentioned interface. The material of the seed layer 22 may be similar to that described before with reference to FIG. 4, although the material preferably has non-magnetic properties and a high specific resistance.

As will be seen from FIG. 12, the antiferromagnetic layer 4 formed above the free magnetic layer 1 has a structure composed of two films. This feature is exactly the same as that explained before with reference to FIG. 2. This, however, is only illustrative and the antiferromagnetic layer 4 formed above the free magnetic layer 1 may have a structure formed from three films, as is the case of the antiferromagnetic layer 1 formed below the free magnetic layer 1.

Figure 13:
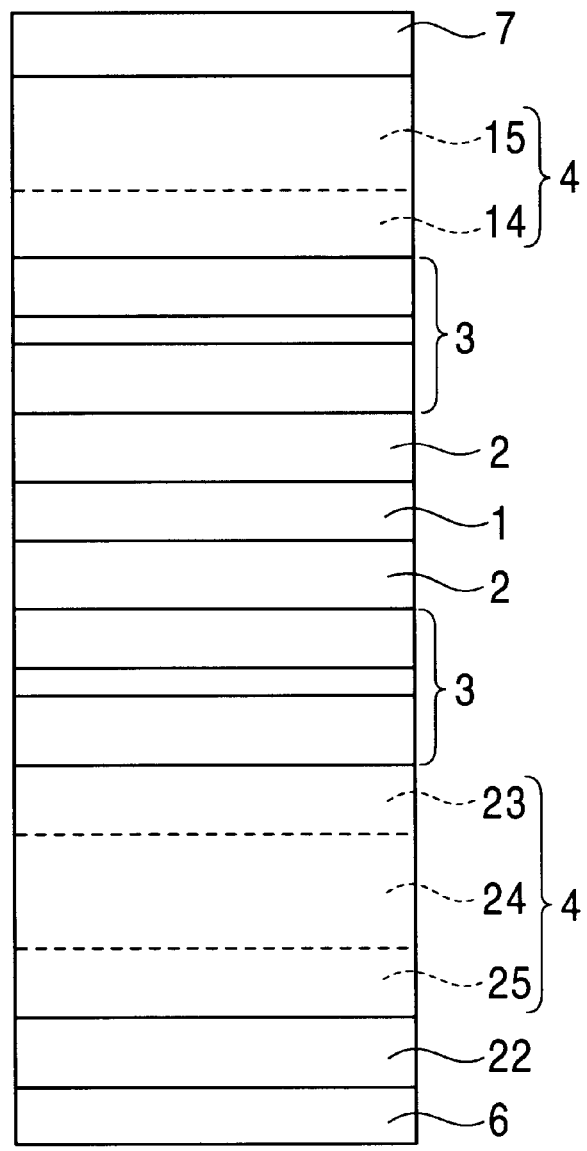
FIG. 13 is a schematic illustration of the laminate structure of FIG. 12 in a state after a heat treatment.
Figure 13:
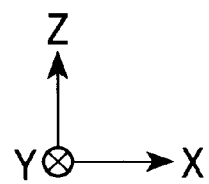

FIG. 13 schematically shows the dual-spin-valve type magnetoresistive sensor obtained through the heat treatment. As a result of the heat treatment, transformation into ordered lattice structure is commenced in the second antiferromagnetic layer 24 of the first antiferromagnetic layer 4 below the free magnetic layer 1 and in the second antiferromagnetic layer 15 of the antiferromagnetic layer 4 above the free magnetic layer 1, since these second antiferromagnetic layers 24 and 15 have compositions apt to be transformed into ordered lattice structure. As a result of diffusions of compositions caused by the heat treatment, transformation proceeds also in other layers, while the non-aligned crystal lattice state is maintained. Accordingly, a greater exchange coupling magnetic field than conventional devices can be achieved.

As a result of the above-described diffusions of compositions, the antiferromagnetic layer 4 beneath the free magnetic layer 1 has a region in which the ratio of the atomic percent of the element x or the elements X+X' to Mn increases in a direction towards the pinned magnetic layer 3, as well as a region in which this ratio increases towards the seed layer 22. At the same time, the crystalline structure of at least part of this antiferromagnetic layer 4 has a CuAu—I type face-centered crystalline structure. Preferably, a non-aligned crystal lattice state is created over at least part of the interface adjacent to the seed layer 22, as well as over at least part of the interface adjacent to the pinned magnetic layer 3.

The antiferromagnetic layer 4 above the free magnetic layer 1 has a region in which the ratio of the atomic percent of the element x or the elements X+X' to Mn increases in a direction towards the pinned magnetic layer 3. Also, the crystalline structure of at least part of this antiferromagnetic layer 4 has a CuAu—I type face-centered crystalline structure and, preferably, a non-aligned crystal lattice state is created at at least part of the interface adjacent to the pinned magnetic layer 3. The antiferromagnetic layer 4 formed above the free magnetic layer 1 also has a crystal orientation in which the (111) faces are substantially aligned.

In the antiferromagnetic layer 4 below the free magnetic layer 1, diffusion of elements takes place at the interface adjacent to the seed layer 22 and at the interface adjacent to the pinned magnetic layer 3, so that regions exist near the interface adjacent to the seed layer 22 and near the interface adjacent to the pinned magnetic layer 3, respectively, in which the atomic percent of the element X or the elements X+X' in the antiferromagnetic layer 4 decreases in a direction towards the respective interfaces. The presence of such regions indicates that the antiferromagnetic layer 4 has been properly transformed into ordered lattice structure at each of the interface adjacent to the seed layer 22 and the interface adjacent to pinned magnetic layer 3, making it possible to obtain a large exchange coupling magnetic field.

In the antiferromagnetic layer 4 formed above the free magnetic layer 1, a diffusion of elements takes place at the interface adjacent to the pinned magnetic layer 3, so that a region exists near the interface adjacent to the pinned magnetic layer 3, in which the atomic percent of the element X or the elements X+X' in the antiferromagnetic layer 4 decreases towards the above-mentioned interface. A diffusion of elements takes place also at the boundary between the antiferromagnetic layer 4 and the protective layer which is formed from, for example, Ta. If such a diffusion has taken place, a region exists in the antiferromagnetic layer 4 near the interface adjacent to the protective layer 7, in which the atomic percent of the element X or the elements X+X' in the antiferromagnetic layer 4 decreases in a direction towards this interface.

The presence of the seed layer 22 serves to promote substantial orientation of the (111) faces in parallel with the film planes and to increase the sizes of the crystal grains in the antiferromagnetic layer 4 below the free magnetic layer 1 and the antiferromagnetic layer 4 above the free magnetic layer 1, as well as in the layers intervening between these two antiferromagnetic layers 4. It is therefore possible to obtain a greater exchange magnetic field and a greater ratio of resistance variation than in the conventional devices.

For achieving a greater effect of improving the ratio of resistance variation, the seed layer 22 is preferably formed between the underlying layer 6 and the antiferromagnetic layer 4 below the free magnetic layer 1, as shown in FIGS. 12 and 13. The seed layer 22, however, may be formed between the protective layer 7 and the antiferromagnetic layer 4 above the free magnetic layer 1.

Figure 14:
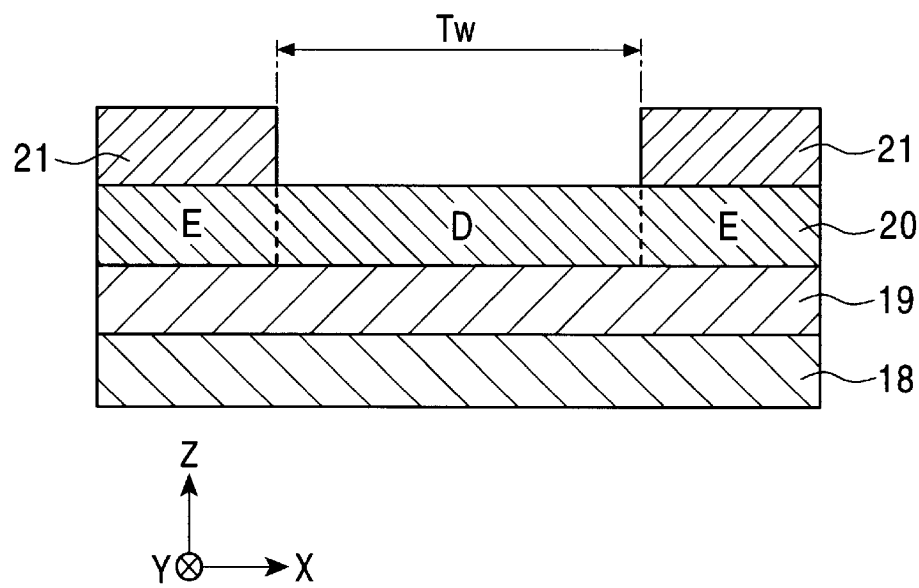
FIG. 14 is a cross-sectional view of a structure of an AMR magnetoresistive sensor in accordance with a sixth embodiment of the present invention, as viewed from the same side as the ABS surface.
Figure 15:
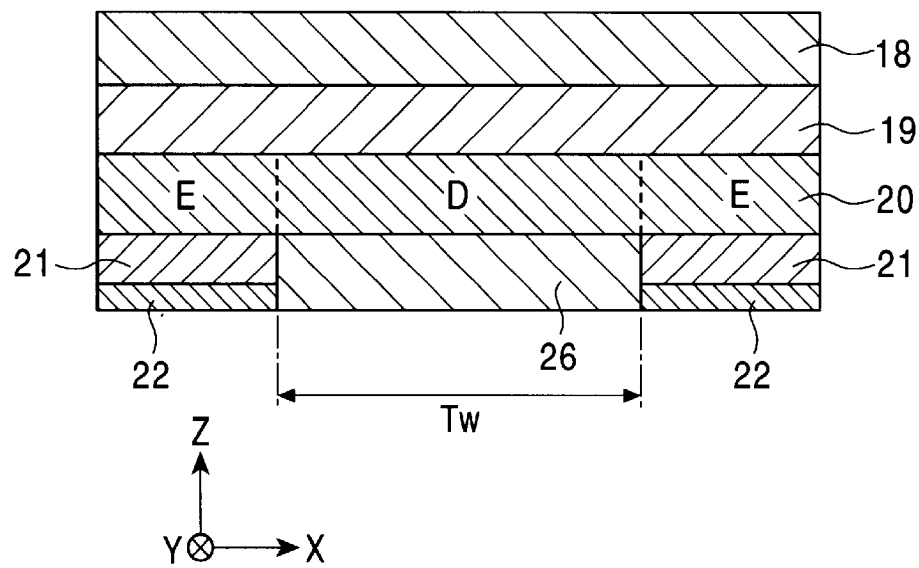
FIG. 15 is a cross-sectional view of a structure of an AMR magnetoresistive sensor in accordance with a seventh embodiment of the present invention, as viewed from the same side as the ABS surface.

FIGS. 14 and 15 are sectional views of AMR magnetoresistive sensors embodying the present invention. Referring to FIG. 14, a soft magnetic layer (SAL layer) 18, a non-magnetic layer (SHUNT layer) 19, and a magnetoresistive layer (MR layer) are successively deposited. By way of example, the soft magnetic layer 18 is formed of an Fe—Ni—Nb alloy, while the non-magnetic layer 19 is made from a Ta film. The magnetoresistive layer 20 is formed of an Ni—Fe alloy.

Formed on the magnetoresistive layer 20 are portions 21 of an exchange bias layer (antiferromagnetic layer) spaced from each other in the direction of the track width X by a distance corresponding to the track width Tw. Although not shown, a conductive layer is formed, for example, on the segments 21 of the exchange bias layer.

Referring to FIG. 15, segments 21 of the exchange bias layer are formed so as to be spaced apart from each other in the track width direction (X direction) by a distance corresponding to the track width Tw, and the vacancy between these segments 21 of the exchange bias layer is filled with an insulating layer 26 made of an insulating material such as $SiO_2$ or $Al_2O_3$. The exchange bias layer 21 and the insulating layer 26 are overlain by the magnetoresistive layer (MR layer) 20, the non-magnetic layer (SHUNT layer) 19 and the soft magnetic layer (SAL layer) 18.

In the production process, the exchange bias layer 21 is deposited to have a two-layered structure composed of the first antiferromagnetic layer 14 and the second antiferromagnetic layer 15.

The first antiferromagnetic layer 14 is formed in contact with the magnetoresistive layer 20, and the second antiferromagnetic layer 15 is formed on the magnetoresistive layer with the first antiferromagnetic layer 14 intervening therebetween.

As described before in connection with FIG. 2, the first antiferromagnetic layer 14 has a greater composition ratio of the element X or the element X+X' than that of the second antiferromagnetic layer 15. Preferably, a non-aligned crystal lattice state is created at at least part of the interface adjacent to the magnetoresistive layer 20, and the second antiferromagnetic layer 15 is formed of an antiferromagnetic material having a composition approximating an ideal composition that permits easy transformation from the disordered lattice structure to ordered lattice structure when heat-treated. The requirements concerning the composition ratios of the element X or the elements X+X' in the first and second antiferromagnetic layers 14 and 15 are the same as those described before with reference to FIG. 2.

As a result of the heat treatment, the exchange bias layer 21 is properly transformed from the disordered lattice structure to ordered lattice structure, while maintaining the non-aligned crystal lattice state at the interface adjacent to the magnetoresistive layer 20. Accordingly, an exchange coupling magnetic field is produced at the interface between the exchange bias layer 21 and the magnetoresistive layer 20.

Since in the deposition process the first antiferromagnetic layer 14 is formed of a suitable material free from the influence of the restraint force produced by the crystalline structure of the pinned magnetic layer 3 at the interface adjacent to the pinned magnetic layer 3, and since the second antiferromagnetic layer 15 is formed from a material having a composition approximating an ideal composition that permits easy transformation from disordered lattice structure to ordered lattice structure, transformation from disordered lattice structure into ordered lattice structure is properly effected by the heat treatment, while maintaining a non-aligned crystal lattice state between the antiferromagnetic layer 4 and the pinned magnetic layer 3. Accordingly, a greater exchange coupling magnetic field than in the conventional devices can be obtained. Specifically, an exchange coupling magnetic field of about $7.9 \times 10^4$ (A/m) or greater is expectable in accordance with the present invention.

The exchange bias layer 21 may be formed by depositing three films, as in the case of the structure shown in FIG. 4. The first antiferromagnetic layer 23 is formed on the side adjacent to the magnetoresistive layer 20, and the second antiferromagnetic layer 24 and the third antiferromagnetic layer 25 are sequentially formed on the first antiferromagnetic layer 23. In this case, the composition ratio of the element X or the elements X+X' in the second antiferromagnetic layer 24 is set to be smaller than those in the first and third antiferromagnetic layers 23 and 25. Preferably, a non-aligned crystal lattice state is created over at least part of the interface between the first antiferromagnetic layer 23 and the magnetoresistive layer 20 or, alternatively, both layers are made to have different lattice constants or different crystalline orientations at the interface therebetween.

When the heat treatment is effected on the exchange bias layer 21 thus formed, transformation into ordered lattice structure is commenced in the second antiferromagnetic layer 24, followed by transformation into ordered lattice structures in the first antiferromagnetic layer 23 and third antiferromagnetic layer 25 which occurs due to diffusions of compositions. Consequently, the heat-treated exchange bias layer 21 has a region in which the ratio of atomic percent of the element X to Mn increases in a direction towards the magnetoresistive layer 20 starting from a thicknesswise central portion of the exchange bias layer 21, and a region in which the ratio of atomic percent of the element X to Mn increases in the direction away from the magnetoresistive layer 20 starting from the above-mentioned thicknesswise central portion. Requirements concerning the compositions of the first to third antiferromagnetic layers 23, 24 and 25 are the same as those described before with reference to FIG. 4, and the composition and thickness of the exchange bias layer 21 after the heat treatment are the same as those of the antiferromagnetic layer 4 shown in FIG. 5.

This embodiment also can employ a seed layer 22. In particular, the use of the seed layer 22 in the structure shown in FIG. 15 offers a greater advantage. More specifically, in the case where the exchange bias layer 21 is formed at the lower side of the magnetoresistive layer 20, the seed layer 22 is formed at the lower side of the exchange bias layer 21. It is possible to use a seed layer also in the structure shown in FIG. 14. In such a case, the sewed layer 22 is formed on the exchange bias layer 22. By forming the seed layer 22, it is possible to increase the ratio of resistance variation. Requirements regarding the crystalline structure and material of the seed layer 22, as well as the material, composition and film thickness of the exchange bias layer 21, are the same as those shown in FIGS. 4 and 5.

In each of the AMR devices sown in FIGS. 14 and 15, the regions E of the magnetoresistive layer 20 are formed into single magnetic domain in the X direction of these Figures, due to the effect of the exchange coupling magnetic field produced at the interface between the exchange bias layer 21, 21 and the magnetoresistive layer 20. This causes the magnetization of the region D of the magnetoresistive layer 20 to be aligned in the X direction. A magnetic field which is produced when a sense current flows through the magnetoresistive layer 20 is applied to the soft magnetic layer 18, so that a lateral bias magnetic field Y is applied to the region D of the magnetoresistive layer 20, by static magnetic coupling energy produced by the soft magnetic layer 18. By the lateral bias layer given to the single-domain region D of the magnetoresistive layer 20, the variation of the resistance of the magnetoresistive layer 20 in response to the change in the magnetic field in the region D exhibits a linearity, i.e., the magnetoresistive characteristics of the magnetoresistive layer 20.

A recording medium moves in the direction Z, so that a magnetic field leaking in the Y direction causes a change in the electrical resistance in the region D of the magnetoresistive layer 20, and such a change is sensed as a change in a voltage.

Figure 16:
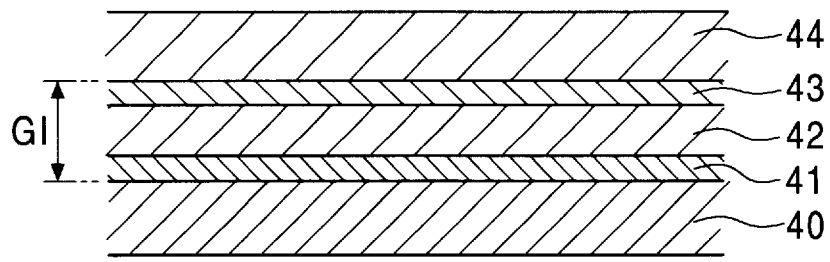
FIG. 16 is a fragmentary sectional view of a structure of a thin-film magnetic head (reproduction head) in accordance with the present invention.

FIG. 16 is a cross-sectional view of the structure of a reading head having any of the magnetoresistive sensor described heretofore with reference to FIGS. 1 to 11, as viewed from the surface which opposes the recording medium. Numeral 40 designates a lower shield layer formed of, for example, an Ni—Fe alloy, and overlain by a lower gap layer 41. A magnetoresistive sensor 42, which may be any one of those described heretofore with reference to FIGS. 1 to 15, is formed on the lower gap layer 41. The magnetoresistive sensor 42 is overlain by an upper gap layer 43 formed thereon, and an upper shield layer 44 formed of an Ni—Fe alloy for example is formed on the upper gap layer 43.

The lower gap layer 41 and the upper gap layer 43 are formed of an insulating material such as $SiO_2$ or $Al_2O_3$ (alumina). The length between the extremities of the lower gap layer 41 and the upper gap layer 43 as shown in FIG. 16 is the gap length G1, and the reading head with smaller gap length G1 can be used at higher recording density.

As described before in connection with FIG. 2, the first antiferromagnetic layer 14 has a greater composition ratio of the element X or the element X+X' than that of the second antiferromagnetic layer 15. Preferably, a non-aligned crystal lattice state is created over at least part of the interface adjacent to the magnetoresistive layer 20, and the second antiferromagnetic layer 15 is formed of an antiferromagnetic material having a composition approximating an ideal composition that permits easy transformation from the disordered lattice structure to ordered lattice structure when heat-treated. The requirements concerning the composition ratios of the element X or the elements X+X' in the first and second antiferromagnetic layers 14 and 15 are the same as those described before with reference to FIG. 2.

EXAMPLES

Figure 20:
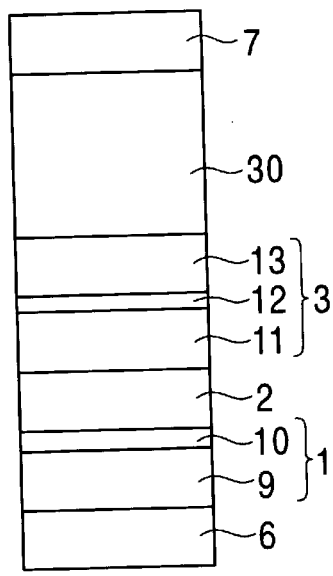
FIG. 20 is a schematic illustration of the structure of a conventional single spin valve type magnetoresistive sensor.

The following laminate structures were formed by deposition and samples were prepared to include Examples in which the antiferromagnetic layer 4 was formed by depositing two layers (first antiferromagnetic layer 14 and second antiferromagnetic layer 15) having different composition ratios as in FIG. 2. Comparative Examples were prepared in which the antiferromagnetic layer 30 was deposited to have a single layer, as shown in FIG. 20. The samples being then subjected to heat treatments conducted under the same condition, followed by measurements of the exchange coupling magnetic field (Hex) and the ratio of resistance variation (ΔMR). The heat treatment was conducted for more than 2 hours at temperature not lower than 200° C.

Example 1

The laminate structure was composed of the following layers, sequentially formed from the bottom layer: Underlying layer 6: Ta (50)/free magnetic layer 1: [Ni$_{80}$Fe$_{20}$(45)/Co(5)]/non-magnetic intermediate layer 2: Cu(25)/pinned magnetic layer 3: [Co(20)/Ru(8)/Co(15)]/first antiferromagnetic layer 14: Pt$_{58}$Mn$_{42}$ (10)/second antiferromagnetic layer: Pt$_{50}$Mn$_{50}$(110)/protective layer 7:Ta(30)

Comparative Example 1

Underlying layer 6: Ta(50)/free magnetic layer 1: [Ni$_{80}$Fe$_{20}$(45)/Co(5)]/non-magnetic intermediate layer 2: Cu(25)/pinned magnetic layer 3: [Co(20)/Ru(8)/Co(15)]/antiferromagnetic layer 30: Pt$_{58}$Mn$_{42}$(120)/protective layer 7:Ta(30)

Comparative Example 2

Underlying layer 6: Ta(50)/free magnetic layer 1: [Ni$_{80}$Fe$_{20}$(45)/Co(5)]/non-magnetic intermediate layer 2: Cu(25)/pinned magnetic layer 3: [Co(20)/Ru(8)/Co(15)]/antiferromagnetic layer 30: Pt$_{46}$Mn$_{50}$(120)/protective layer 7: Ta(30)

Comparative Example 3

Underlying layer 6: Ta(50)/free magnetic layer 1: [Ni$_{80}$Fe$_{20}$(45)/Co(5)]/non-magnetic intermediate layer 2: Cu(25)/pinned magnetic layer 3: [Co(20)/Ru(8)/Co(15)]/antiferromagnetic layer 30: Pt$_{50}$Mn$_{50}$ (120)/protective layer 7:Ta(30)

Comparative Example 4

Underlying layer 6:Ta(50)/free magnetic layer 1: [Ni$_{80}$Fe$_{20}$(45)/Co(5)]/non-magnetic intermediate layer 2: Cu(25)/pinned magnetic layer 3: [Co(20)/Ru(8)/Co( 15)]/antiferromagnetic layer 30: Pt$_{52}$Mn$_{48}$( 120)/protective layer 7:Ta(30)

Values in parenthesis indicate layer thicknesses in terms of Angstroms. The suffixes in the representations of Ni—Fe alloys and Pt—Mn alloys represent composition ratios in terms of at %.

Thus, all the samples had the same laminate structure, except for the structure of the antiferromagnetic layer. The thickness of the antiferromagnetic layers was about 120 Å in all the samples, where, in Example 1, this thickness is the sum of the thicknesses of the first antiferromagnetic layer 14 and second antiferromagnetic layer 15.

In order to obtain a non-aligned interface structure, it is necessary to increase the Pt content in the Pt—Mn alloy. In Example 1 and Comparative Example 1, the Pt content of the antiferromagnetic layer contacting the interface with the pinned magnetic layer was 58 (at %), whereas the Pt content was smaller in each of other samples, leading to the above-described results.

Referring now to item "Hex" which represents the exchange coupling magnetic field, Example 1 showed a very large exchange coupling magnetic field of about 17.4×10$^4$ (A/m), while Comparative Examples showed much smaller values of the exchange coupling magnetic field. In Comparative Examples 3 and 4, the values of the exchange coupling magnetic fields were greater than those in Comparative Examples 1 and 2, but were much smaller than that obtained with Example 1 of the invention.

In order to obtain a large exchange coupling magnetic field, it is necessary that the antiferromagnetic layer is formed of a Pt—Mn alloy having a composition that approximates an ideal composition which permits easy transformation from disordered lattice structure to ordered lattice structure when heat-treated. The ideal composition here means Pt$_{50}$Mn$_{50}$.

The use of the ideal composition that permits easy transformation alone is still insufficient. It is also important that the interface adjacent to the pinned magnetic layer is held in non-aligned crystal lattice state. An aligned crystal lattice state of the interface impedes proper transformation of the antiferromagnetic layer during the heat treatment, due to restraint force produced by the crystalline structure of the pinned magnetic layer.

It will be seen that only Example 1 simultaneously met these two conditions. More specifically, in Example 1, the interface between the first antiferromagnetic layer and the pinned magnetic layer was held in the non-aligned crystal lattice state in the as-deposited state before the heat treatment, while the second antiferromagnetic layer had the ideal composition. In contrast, in Comparative Example 1, antiferromagnetic properties could hardly be obtained despite the heat treatment, because the composition deviated from the ideal composition due to too large Pt content, although the interface adjacent to the pinned magnetic layer was held in a non-aligned crystal lattice state. In Compara-

TABLE 1

|  | Example 1 | Comp. Ex. 1 | Comp. Ex. 2 | Comp. Ex. 3 | Comp. Ex. 4 |
| --- | --- | --- | --- | --- | --- |
| Interface with ferromagnetic layer | Non-alignment very strong | Non-alignment very strong | Non-alignment strong | Non-alignment weak | Non-alignment very strong |
| (Hex) | 17.4 × 10$^4$(A/m) | 1.2 × 10$^4$(A/m) | 0.79 × 10$^4$(A/m) | 6.48 × 10$^4$(A/m) | 8.37 × 10$^4$(A/m) |
| Resistance variation ratio | 8.3% | 5.5% | 5.0% | 8.0% | 8.1% |
| Features of PtMn | With strong non-aligned state, bulk ideal composition (Pt50—Mn50) is used for 90% of more. | Non-aligned state is very strong advantageously, but antiferromagnetic properties can hardly be obtained due to too high Pt content. | Antiferromagnetic properties can hardly be obtained due to strong non-alignment and due to small Pt content. | Unsatisfactory due to weak non-alignment, although ideal bulk composition was used. | The non-aligned state was held rather strong, and composition approximates bulk ideal composition. Best composition among samples of single-layered type. |

Table 1 shows the results of experiments executed in the samples after the heat treatment. Referring to the item "Interface with Ferromagnetic layer," both Example 1 and Comparative Example 1 had very strong state of non-alignment, whereas Comparative Examples 2 and 3 showed greater tendencies of alignment. In Comparative Example 4, the non-aligned crystal lattice state was not so strong.

tive Example 2, antiferromagnetic properties could hardly be obtained despite the heat treatment, because the composition deviates from the ideal composition due to too small Pt content, and due to aligned crystal lattice state of the interface adjacent to the pinned magnetic layer. In case of Comparative Example 3, transformation from disordered lattice structure to ordered lattice structure could hardly occur despite the heat treatment, due to the aligned state of the interface adjacent to the pinned magnetic layer, although the ideal composition was employed.

Comparative Example 4 employed a composition approximating the ideal composition and had the interface adjacent to the pinned magnetic layer, which is comparatively easy to maintain non-aligned crystal lattice state. Accordingly, this Comparative Example produced an exchange coupling magnetic field that is the greatest of those of all other Comparative Examples, but was still smaller than that of Example 1. This is due to a large Pt content and due to the non-aligned crystal lattice state, which is not very strong.

In accordance with the present invention, transformation from disordered lattice structure into ordered lattice structure caused by the heat treatment was properly performed without losing the non-aligned crystal lattice state at the interface. This is because the antiferromagnetic layer, as deposited, had a first antiferromagnetic layer 14 facing the interface adjacent to the pinned magnetic layer and a composition in which it is easy to create the non-aligned crystal lattice state. Another contributing factor is the second antiferromagnetic layer 15 having a composition approximating the ideal composition and formed on the pinned magnetic layer with the first antiferromagnetic layer 14 intervening therebetween. Accordingly, a greater exchange coupling magnetic field than those of conventional devices can be achieved. The data in the item "Resistance variation ratio" also shows the superiority of Example 1 to Comparative examples.

Figure 17:
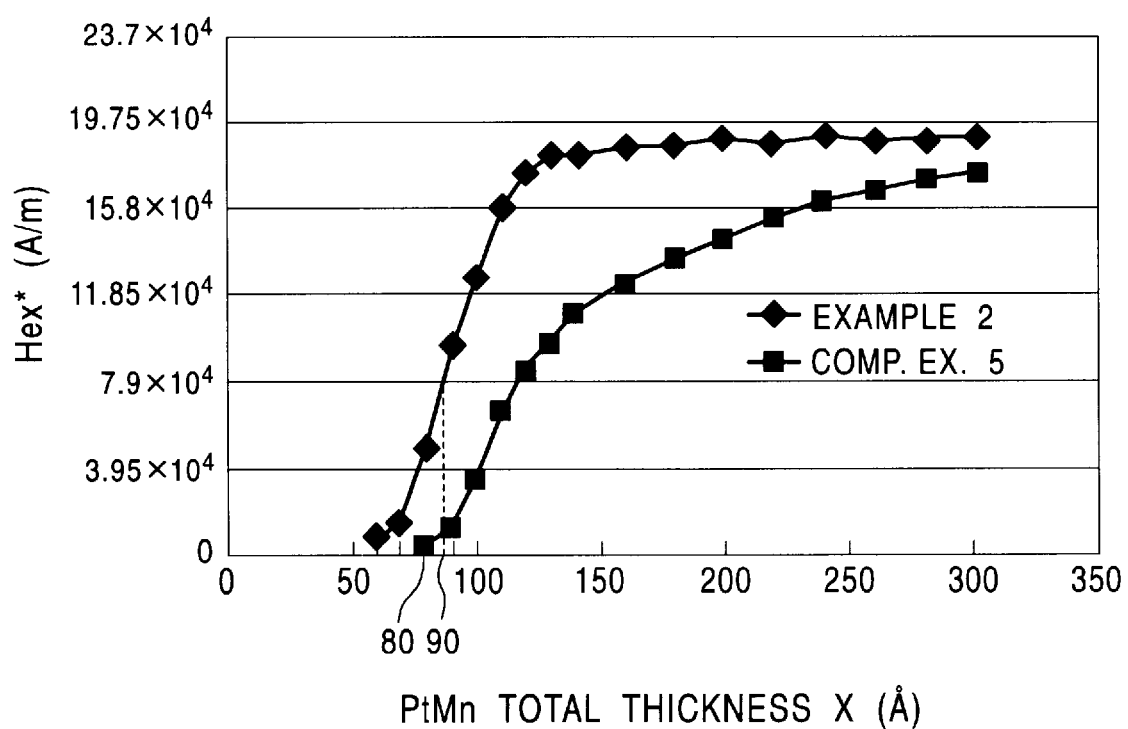
FIG. 17 is a graph showing the relationship between the total film thickness of an antiferromagnetic layer and an exchange coupling magnetic field (Hex), the antiferromagnetic layer in accordance with the invention being formed of a first antiferromagnetic layer and a second antiferromagnetic layer.

Then, the relationship between the total film thickness of the antiferromagnetic layer and the exchange coupling magnetic field (Hex) was examined (see FIG. 17). The following two samples in the as-deposited state (prior to heat treatment) were prepared. The structure of Example 2 was the same as that shown in FIG. 2, while the structure of Comparative Example 5 was the same as that shown in FIG. 20.

Example 2

The laminate structure was composed of the following layers, sequentially formed from the bottom layer: Underlying layer 6: (50)/free magnetic layer 1: [$Ni_{80}Fe_{20}$(45)/Co (5)]/non-magnetic intermediate layer 2: Cu(25)/pinned magnetic layer 3: [Co(20)/Ru(8)/Co(15)]/first antiferromagnetic layer 14: $Pt_{58}Mn_{42}$ (10)/second antiferromagnetic layer: $Pt_{50}Mn_{50}$(X-10)/protective layer 7:Ta(30)

Comparative Example 5

Underlying layer 6:Ta(50)/free magnetic layer 1 [$Ni_{80}Fe_{20}$ (45)/Co(5)]/non-magnetic intermediate layer 2:Cu(25)/ pinned magnetic layer 3:[Co(20)/Ru(8)/Co( 15)]/ antiferromagnetic layer 30:$Pt_{52}Mn_{48}$(X)/protective layer 7:Ta(30)

Values in parenthesis indicate layer thicknesses in terms of Angstrom. The suffixes in the representations of Ni—Fe alloys and Pt—Mn alloys represent composition ratios in terms of at %.

In Example 2, the thickness of the first antiferromagnetic layer 14 was about 10 Å, while the thickness of the second antiferromagnetic layer 15 was varied, as will be seen from the composition shown above. These samples were heat-treated and were subjected to measurement of the exchange coupling magnetic field (Hex). It will be seen that a greater total thickness of the Pt—Mn alloy layer provides a greater exchange coupling magnetic field, both in Example 2 and Comparative Example 5, as will be seen from FIG. 17.

Example 2 of the invention showed a drastic increase of the exchange coupling magnetic field as compared with that of Comparative Example 5, when the total thickness of the Pt—Mn layer was increased, i.e., when the thickness of the second antiferromagnetic layer 15 was increased, and provided an exchange coupling magnetic field as large as about 7.9 4×10⁴ (A/m) or greater when the total thickness reached and exceeded about 80 Å.

An exchange coupling magnetic field of about 7.9×10⁴ (A/m) or greater was obtainable also with Comparative Example 5, when the thickness of the antiferromagnetic layer exceeded about 120 Å. This suggests that a greater thickness of the antiferromagnetic layer 30 than that in Example 2 was required for achieving the same exchange coupling magnetic field as that produced in Example 2.

The result of this experiment also shows that, when the antiferromagnetic layer 4 is formed by depositing two layers, the first antiferromagnetic layer 14 and the second antiferromagnetic layer 15 as in Example 2, the second antiferromagnetic layer 15 that is formed by an antiferromagnetic material having a composition approximating the ideal composition for easy transformation from disordered lattice structure to ordered lattice structure should have a thickness greater than a predetermined thickness.

In accordance with the present invention, it is understood from the experiment results shown in FIG. 17 that a large exchange coupling magnetic field of about 7.9×10⁴ (A/m) or greater is obtainable when the total thickness of the antiferromagnetic layer is about 80 Å or greater and, since the thickness of the first antiferromagnetic layer 14 is about 10 Å in this case, the thickness of the second antiferromagnetic layer 15 is about 70 Å or greater.

Figure 18:
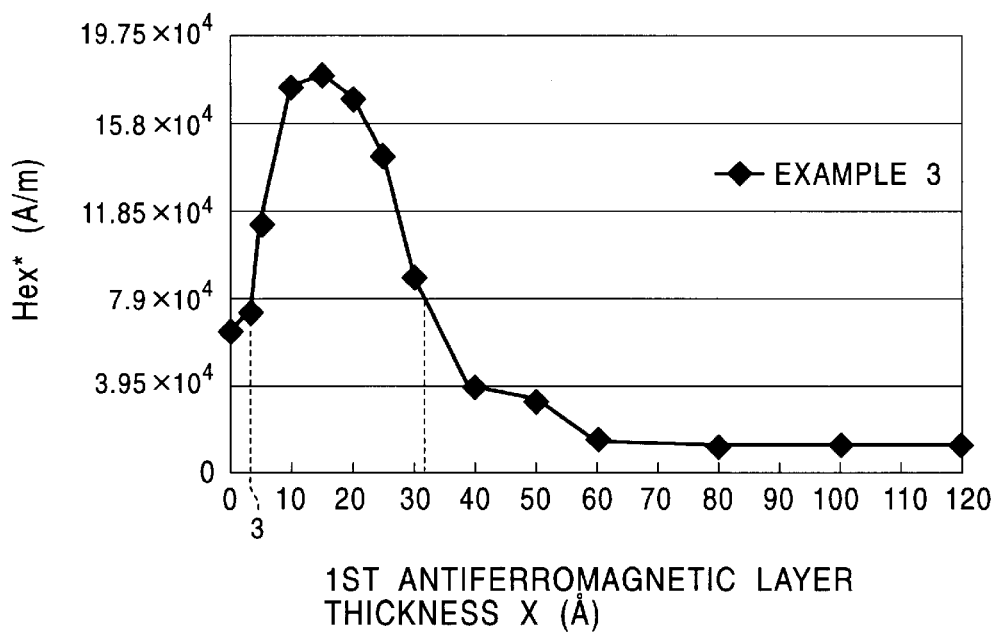
FIG. 18 is a graph showing the relationship between the thickness of a first antiferromagnetic layer which together with a second antiferromagnetic layer forms an antiferromagnetic layer in accordance with the invention, and an exchange coupling magnetic field (Hex)

Then, the relationship was examined between the thickness of the first antiferromagnetic layer and the exchange coupling magnetic field (Hex) in the structure in which the antiferromagnetic layer as deposited is composed of the first antiferromagnetic layer 14 and the second antiferromagnetic layer 15 (FIG. 18). The laminate structure used in this experiment was the same as that shown in FIG. 2.

Example 3

The structure had the following layers sequentially formed from the bottom: underlying layer 6:Ta(50)/free magnetic layer 1:[$Ni_{80}Fe_{20}$(45)/Co(5)]/non-magnetic intermediate layer 2:Cu(25)/pinned magnetic layer 3:[Co(20)/Ru (8)/Co(15)]/first antiferromagnetic layer 14:$Pt_{58}Mn_{42}$(X)/ second antiferromagnetic layer 15:$Pt_{50}Mn_{50}$(120-X)/ protective layer 7:Ta(30)

Values in parenthesis indicate layer thicknesses in terms of Angstroms. The suffixes in the representations of Ni—Fe alloys and Pt—Mn alloys represent composition ratios in terms of at %.

A plurality of samples having different thicknesses of the first antiferromagnetic layer 14 were prepared and heat-treated, and the exchange coupling magnetic field was measured on each of the heat-treated samples. From FIG. 18, it is understood that the exchange coupling magnetic field of about 7.9×10⁴ (A/m) or greater was obtainable when the thickness X of the first antiferromagnetic layer 14 ranged from about 3 Å to about 30 Å.

The first antiferromagnetic layer 14 had a large Pt content, in order to maintain the required non-aligned crystal lattice state at the interface adjacent to the pinned magnetic layer 3. For example, the Pt content was as large as about 58 at % in the Example. The composition having such a high Pt content is not easy to transform from disordered lattice structure to ordered lattice structure when-heat treated and, therefore, can hardly exhibit antiferromagnetic properties, although this composition effectively maintains the above-mentioned non-aligned crystal lattice state. Therefore, a too large of thickness of the first antiferromagnetic layer 14 increases the ratio of the region which is hard to transform and, as will be clearly seen from the experiment results shown in FIG. 18, incurs a serious reduction in the exchange coupling magnetic field.

In contrast, the thickness of the first antiferromagnetic layer 14 ranging from about 3 Å to about 30 Å provides a large exchange coupling magnetic field. This is possibly for the reason that a diffusion of elements takes place as a result of the heat treatment between the first antiferromagnetic layer 14 and the second antiferromagnetic layer 15 which is inherently easy to transform. The composition modulation takes place throughout the whole thickness region of the first antiferromagnetic layer 14 when the thickness of the first antiferromagnetic layer 14 falls within the above-specified range. This diffusion causes the Pt content to be decreased in the first antiferromagnetic layer 14 from that obtained in the as-deposited state. Accordingly, the first antiferromagnetic layer 14 becomes more easy to be transformed, thus providing a large exchange coupling magnetic field.

Thus, in order to obtain a large exchange coupling magnetic field in accordance with the present invention, it is necessary that the second antiferromagnetic layer 15 made of an antiferromagnetic material approximating an ideal composition that is easy to transform from disordered lattice structure to ordered lattice structure. The second antiferromagnetic layer 15 should be deposited to have a thickness of about 70 Å or greater as explained before with reference to FIG. 17. Also, the first antiferromagnetic layer 14 should have a high Pt content to maintain the non-aligned crystal lattice state at the interface adjacent to the pinned magnetic layer and be deposited to have a thickness ranging from about 3 Å to about 30 Å, as explained before with reference to FIG. 18.

Thus, the exchange coupling magnetic field of about $7.9 \times 10^4$ (A/m) or greater is obtainable when the thickness of the first antiferromagnetic layer 14 is set to be about 3 Å or greater while the thickness of the second antiferromagnetic layer 15 is set to be about 70 Å or greater, providing a total thickness of the antiferromagnetic layer 4 of about 73 Å. Based on this result of the experiment, in accordance with the present invention, the thickness of the antiferromagnetic layer 4 after the heat treatment is preferably about 73 Å or greater.

Thus, in accordance with the present invention, the minimum thickness required for the antiferromagnetic layer 4 is about 73 Å or greater, so that the thickness of the antiferromagnetic layer can be reduced as compared with that in the conventional devices, thus meeting the demand for narrower gaps.

Figure 19:
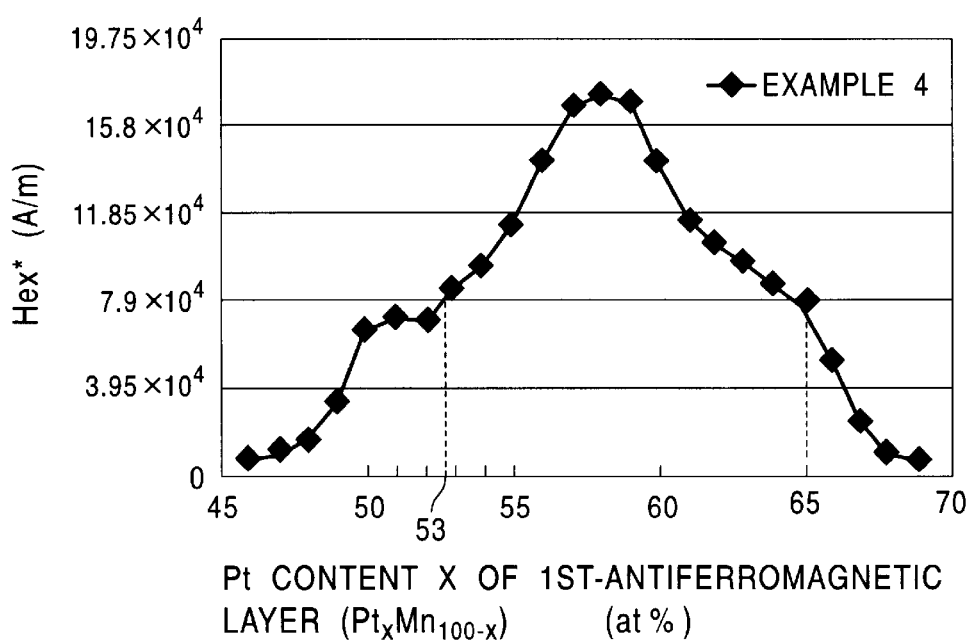
FIG. 19 is a graph showing the relationship between the Pt content (X) and exchange coupling magnetic field (Hex) as observed when the antiferromagnetic layer of the invention is composed of first and second antiferromagnetic layers, the first antiferromagnetic layer having a composition expressed by $Pt_xMn_{100-x}$.

Then, the relationship was examined between the composition ratio of the first antiferromagnetic layer and the exchange coupling magnetic field (Hex) in the structure in which the antiferromagnetic layer as deposited is composed of the first antiferromagnetic layer 14 and the second antiferromagnetic layer 15 (FIG. 19). The laminate structure used in this experiment was the same as that shown in FIG. 2.

Example 4

The structure had the following layers sequentially formed from the bottom: underlying layer 6:Ta(50)/free magnetic layer 1:[$Ni_{80}Fe_{20}$(45)/Co(5)]/non-magnetic intermediate layer 2:Cu(25)/pinned magnetic layer 3:[Co(20)/Ru(8)/Co(15)]/first antiferromagnetic layer 14:$Pt_{(x)}Mn_{(100-x)}$(10)/second antiferromagnetic layer:$Pt_{50}Mn_{50}$(120-X)/protective layer 7:Ta(30)

Values in parenthesis indicate layer thicknesses in terms of Angstroms. The suffixes in the representations of Ni—Fe alloys and Pt—Mn alloys represent composition ratios in terms of at %.

A plurality of samples were prepared having different composition ratios in the first antiferromagnetic layer 14, and were subjected to the heat treatment, followed by measurement of the exchange coupling magnetic field (Hex). The heat treatment was conducted for more than 2 hours at temperatures not lower than 200° C. From FIG. 19, it is understood that the exchange coupling magnetic field of about $7.9 \times 10^4$ (A/m) or greater is obtainable when the Pt content of the first antiferromagnetic layer 14 is about 53 at % to about 65 at %.

A Pt content of the first antiferromagnetic layer 14 ranging from about 53 at % to about 65 at % can adequately create a non-aligned crystal lattice state at the interface between the first antiferromagnetic layer 14 and the pinned magnetic layer 3, and this is the reason why the above-mentioned large exchange coupling magnetic field is obtained.

It is understood, however, that the exchange coupling magnetic field starts to decrease when the Pt content mentioned before exceeds about 65 at %. When the first antiferromagnetic layer 14, as deposited, contains such a large amount of Pt, the Pt content in the first antiferromagnetic layer is not decreased to such a level as to enable a proper transformation in the first antiferromagnetic layer 14, despite any diffusion of elements between the first antiferromagnetic layer 14 and second antiferromagnetic layer 15 caused by the heat treatment, resulting in a reduction of the exchange coupling magnetic field.

A large exchange coupling magnetic field, specifically about $11.85 \times 10^4$ (A/m) or greater, is obtainable when the Pt content is about 55 at % to about 60 at %. Pt content less than about 53 at % causes a reduction of the exchange coupling magnetic field, because such a small Pt content makes the lattice constant of the antiferromagnetic layer 4 approach that of the pinned magnetic layer 3 so as to make it difficult to create the required non-aligned crystal lattice state.

Then, in accordance with the present invention, an experiment was conducted by using samples prepared as Example 5 in which the antiferromagnetic layer 4 was deposited in a different method, and exchange coupling magnetic fields (Hex) on these samples after a heat treatment were measured.

The materials and thicknesses of the layers other than the antiferromagnetic layer 4 were the same as those of Examples 1 to 3. In this experiment, the antiferromagnetic layer 4 in each sample was deposited on the pinned magnetic layer 3 by using a target formed of a Pt—Mn alloy, while progressively changing the sputtering gas pressure from low to high. A measurement of the composition ratio in the antiferromagnetic layer 4 along the thickness thereof proved that a composition $Pt_{58}Mn_{42}$ was developed at the region near the interface adjacent to the pinned magnetic layer 3. Also, the Pt content was progressively decreased in the direction away from the above-mentioned interface to develop a composition $Pt_{48}Mn_{52}$ in the region near the side of the antiferromagnetic layer 4 opposite to the above-mentioned interface.

A laminate structure having an antiferromagnetic layer 30 was prepared as Comparative Example 5, the whole structure of the antiferromagnetic layer 30 having a composition $Pt_{52}Mn_{48}$. Materials and thicknesses of the layers other than the antiferromagnetic layer 30 were the same as those of Comparative Examples 1 to 4.

The samples of Example 5 and Comparative Examples 5 as deposited were subjected to the heat treatment, followed by measurement of the exchange coupling magnetic field, the results of which are shown in Table 2. The heat treatment was conducted for more than 2 hours at temperatures not lower than 200° C.

TABLE 2

| (Hex) | $18.2 \times 10^4$ A/m | $18.5 \times 10^4$ A/m | $6 \times 10^4$ A/m | $6.5 \times 10^4$ A/m |
|---|---|---|---|---|
| Resistance variation ratio | 7.8% | 10.2% | 8.1% | 10.3% |
| Role pleyed by seed layer | Seed layer is composed mainly of face-centered cubic structure with the most dense (111) plane strongly aligned, so that layers from Pt to free layer have rather strong (111) plane orientation and, accordingly, grater crystal grains, resulting in large resistance variation ratio. Alignment between seed layer and PtMn, however, makes it difficult to obtain large Hex on one hand, but on the other hand significantly enhances the (111) planes of layers down to the free layer, resulting in grater crystal grain size and consequent greater resistance variation ratio. In order to simultaneously meet the requirements for greater Hex and greater resistance variation ratio, it is preferred that the (111) plane orientations are enhanced in the layers from the PtMn layer to the free layer, while maintaining a non-aligned crystal lattice state between the seed layer and the PtMn layer, as in Example 8. | | | |
| Features of PtMn | Bulk ideal composition(Pt50-Mn50) used in the region around central region, while maintaining very strongly non-aligned state | Bulk ideal composition(Pt50-Mn50) used in the region around central region, while maintaining very strongly non-aligned state | Insufficient due to almost-aligned state, although the composition is ideal | insufficient due to almost-aligned state, although the composition is ideal |
| Feature of resistance variation ratio | Variation ratio not large because of small specific resistance of seed layer | Variation ratio large because of large specific resistance of seed layer | Variation ratio not large because of small specific resistance of seed layer | Variation ratio large because of large specific resistance of seed layer |

As shown in the item "Interface with ferromagnetic layer" in Table 2, in Example 5, the non-aligned crystal lattice state was strongly held in the interface structure between the antiferromagnetic layer 4 and the pinned magnetic layer 3. In contrast, in Comparative Example 5, the non-aligned crystal lattice state was not so strong as in Example 5, although this Comparative Example employed a composition that enables the non-aligned crystal lattice state to be easily created.

There was no significant difference in the resistance variation ratio (ΔMR) between Example 5 and Comparative Example 5. However, a major difference between Example 5 and Comparative example 5 is that the former exhibited an exchange coupling magnetic field (Hex) two times as large that of the latter.

Example 5 showed such a large exchange coupling magnetic field owing to a proper transformation of the antiferromagnetic layer 4. This is attributed to the high Pt content of the antiferromagnetic layer 4 as expressed by $Pt_{58}Mn_{42}$ at the interface adjacent to the pinned magnetic layer so as to properly maintain the non-aligned crystal lattice state at that interface. Also, the composition modulation in the thicknesswise direction of the antiferromagnetic layer 4 is formed such that most portions of the antiferromagnetic layer 4 were constituted by compositions approximating the ideal composition that allows easy transformation from disordered lattice structure to lattice structure under the heat treatment.

Then, in accordance with the invention, samples were prepared as Example 6 in which the antiferromagnetic layer 4 of so-called dual-spin-valve type magnetoresistive sensor was deposited to have a laminate structure composed of a first antiferromagnetic layer 14 and a second antiferromagnetic layer 15. Additionally, samples were prepared in accordance with Comparative Example 6 in which the antiferromagnetic layer was composed of a single layer, and exchange coupling magnetic fields were measured on these samples.

Example 6

$Pt_{50}Mn_{50}$(83)/first antiferromagnetic layer 14:$Pt_{58}Mn_{42}$ (7)/pinned magnetic layer 3: [Co(15)/Ru(8)/Co(20)]/non-magnetic intermediate layer 2: Cu(22)/free magnetic layer 1: Co (20)/ non-magnetic intermediate layer 2: Cu(22)/pinned magnetic layer 3: [Co(20)/Ru(8)/Co(15)]/first antiferromagnetic layer 14: $Pt_{58}Mn_{42}$ (7)/second antiferromagnetic layer: $Pt_{50}Mn_{50}$(83)/protective layer 7:Ta(10)

Comparative Example 6

The structure had the following layers sequentially formed from the bottom: antiferromagnetic layer 30:$Pt_{50}Mn_{50}$(90)/pinned magnetic layer 3:[Co(15)/Ru(8)/Co (20)]/non-magnetic intermediate layer 2:Cu(22)/free magnetic layer 1:Co(20)/non-magnetic intermediate layer 2:Cu (22)/pinned magnetic layer 3:[Co(20)/Ru(8)/Co(15)]/antiferromagnetic layer 30:$Pt_{50}Mn_{50}$(90)/protective layer 7:Ta(10)

Values in parenthesis indiate layer thicknesses in terms of Angstrom. The suffixes in the representations of Ni—Fe alloys and Pt—Mn alloys represent composition ratios in terms of at %.

The samples of Example 6 and Comparative Examples 6 as deposited were subjected to the heat treatment, followed by measurement of the exchange coupling magnetic field. The results of which are shown in Table 2. The heat treatment was conducted for more than 2 hours at temperatures not lower than 200° C.

TABLE 3

|  | Example 6 | Comp. Ex. 6 |
| --- | --- | --- |
| Interface with ferromagnetic layer | Non-alignment very strong | Non-alignment very strong |
| (Hex) | $15.96 \times 10^4$(A/m) | $10.59 \times 10^4$(A/m) |
| Resistance variation ratio | 14.0% | 13.4% |
| Features of PtMn | With strong non-aligned state, bulk ideal composition (Pt50—Mn50) is used for 90% of more. | The non-aligned state was held rather strong, and composition approximates bulk ideal composition. Best composition among samples of single-layered type. |

As shown in the item "Interface with ferromagnetic layer" in Table 3, in Example 6, the non-aligned crystal lattice state was strongly held in the interface structure between the antiferromagnetic layer 4 and the pinned magnetic layer 3. In contrast, in Comparative Example 6, the non-aligned crystal lattice state was not so strong as in Example 6, although this Comparative Example employed a composition that enables the non-aligned crystal lattice state to be easily created.

There was no significant difference in the resistance variation ratio ($\Delta$MR) between Example 6 and Comparative Example 6. However, a major difference between Example 6 and Comparative Example 6 was that the former showed much greater exchange coupling magnetic field (Hex) than the latter.

Example 6 showed such a large exchange coupling magnetic field owing to the fact that the transformation from the disordered lattice structure to the ordered lattice structure was properly effected by the heat treatment while the non-aligned crystal lattice state was maintained. The large exchange coupling also relates to the fact that the interface adjacent to the pinned magnetic layer was held in the non-aligned crystal lattice state due to the formation of the first antiferromagnetic layer 14 and that the second antiferromagnetic layer 15 was formed on the pinned magnetic layer 3 through the first antiferromagnetic layer having an ideal composition that permits easy transformation under the heat treatment.

Figure 21:
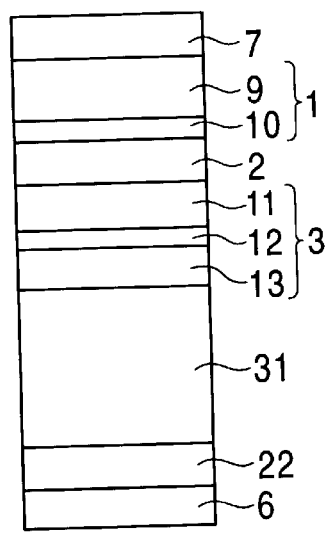
FIG. 21 is a schematic illustration of the structure of a conventional experimental single spin valve type magnetoresistive sensor using a seed layer.

Then, in accordance with the present invention, four types of laminate structures each having a seed layer 22 explained before with reference to FIG. 4 were prepared. The samples included two types of samples (Example 7 an Example 8) in which the interface adjacent to the seed layer was held in a non-aligned crystal lattice state and the remainder two types (Comparative Example 7 and Comparative Example 8) in which the interface adjacent to the seed layer 22 was held in an aligned crystal lattice state. These samples were subjected to a heat treatment and subsequent measurement of the exchange coupling magnetic field (Hex) and resistance variation ratio ($\Delta$MR). The structures of Examples 7 and 8 were the same as that shown in FIG. 8, while the structures of Comparative Examples 7 and 8 were the same as that shown in FIG. 21.

Example 7

The laminate structure had the following layers sequentially formed from the bottom: Underlying layer 6: Ta(50)/seed layer 22: $Ni_{80}Fe_{20}$(30)/antiferromagnetic layer 4[third antiferromagnetic layer 25: $Pt_{58}Mn_{42}$(10)/second antiferromagnetic layer 24: $Pt_{50}Mn_{50}$(100)/first antiferromagnetic layer 23: $Pt_{58}Mn_{42}$(10)]/pinned magnetic layer 3[Co(15)/Ru(8)/Co(20)]/non-magnetic intermediate layer 2: Cu(22)/free magnetic layer 1[Co(5)/$Ni_{80}Fe_{20}$(45)]/protective layer 7:Ta(30)

Example 8

The laminate structure had the following layers sequentially formed from the bottom: Underlying layer 6: Ta(50)/seed layer 22: $Ni_{60}Fe_{10}Cr_{30}$(30)/antiferromagnetic layer 4[third antiferromagnetic layer 25: $Pt_{58}Mn_{42}$(10)/second antiferromagnetic layer 24: $Pt_{50}Mn_{50}$(100)/first antiferromagnetic layer 23: $Pt_{58}Mn_{42}$(10)]/pinned magnetic layer 3[Co(15)/Ru(8)/Co(20)]/non-magnetic intermediate layer 2: Cu(22)/free magnetic layer 1[CO(5)/$Ni_{80}Fe_{20}$(45)]/protective layer 7:Ta(30)

Comparative Example 7

The laminate structure had the following layers, as mentioned from the bottom: Underlying layer 6: Ta(50)/seed layer 22: $Ni_{80}Fe_{20}$(30)/antiferromagnetic layer 31: $Pt_{50}Mn_{50}$(120)/pinned magnetic layer 3[Co(15)/Ru(8)/Co(20)]/non-magnetic intermediate layer 2: Cu(22)/free magnetic layer 1[Co(5)/$Ni_{80}Fe_{20}$(45)]/protective layer 7:Ta(30)

Comparative Example 8

The structure had the following layers from the bottom: underlying layer 6:Ta(50)/seed layer 22:$Ni_{60}Fe_{10}Cr_{30}$(30)/antiferromagnetic layer 31:$Pt_{50}Mn_{50}$(120)/pinned magnetic layer 3[Co(15)/Ru(8)/Co(20)]/non-magnetic intermediate layer 2:Cu(22)/free magnetic layer 1[Co(5)/$Ni_{80}Fe_{20}$(45>]/protective layer 7:Ta(30)

Values in parenthesis indicate layer thicknesses in terns of Angstroms. The suffixes in the representations of Ni—Fe alloys and Pt—Mn alloys represent composition ratios in terms of at %.

The samples prepared to have the above-described structures, as deposited, were subjected to the heat treatment, followed by measurement of the exchange coupling magnetic field (Hex) and resistance variation ratio ($\Delta$MR), as well as other properties. The results are shown in Table 4. The heat treatment was conducted for more than 2 hours at temperatures not lower than 200° C.

TABLE 4

|  | Example 7 | Example 8 | Comp. Ex. 7 | Comp. Ex. 8 |
| --- | --- | --- | --- | --- |
| Interface with seed layer | Non-alignment very strong | Non-alignment very strong | Almost aligned | Almost aligned |
| Saturationmagnetic field of seed layer | 0.9T | Non-magnetic | 0.9T | Non-magnetic |
| specific resistance of seed layer | 25 $\mu\Omega \cdot$ cm | 160 $\mu\Omega \cdot$ cm | 25 $\mu\Omega \cdot$ cm | 160 $\mu\Omega \cdot$ cm |

TABLE 4-continued

|  | Example 7 | Example 8 | Comp. Ex. 7 | Comp. Ex. 8 |
|---|---|---|---|---|
| Crystalline structure of seed layer | Mostly face-centered cubes with strong (111) plane orientation | Mostly face-centered cubes with strong (111) plane orientation | Mostly face-centered cubes with strong (111) plane orientation | Mostly face-centered cubes with strong (111) plane orientation |
| Interface with ferro-magnetic layer | Non-alignment very strong | Non-alignment very strong | Almost aligned | Almost aligned |
| (Hex) | $18.2 \times 10^4$ A/m | $18.5 \times 10^4$ A/m | $6 \times 10^4$ A/m | $6.5 \times 10^4$ A/m |
| Resistance variation ratio | 7.8% | 10.2% | 8.1% | 10.3% |

As will be seen from Table 4, the same "Role of seed layer" was applicable to all of Examples 7 and 8 and Comparative Examples 7 and 8. The seed layer 22 in accordance with the present invention is primarily constituted by face-centered cubic structure, with the (111) faces substantially oriented in the direction parallel to the interface. Therefore, the layers formed on the seed layer 22, from the antiferromagnetic layer to the free magnetic layer 1, also have their (111) faces substantially oriented in the direction parallel to the interfaces and have greater sized crystal grains. For these reasons, large resistance variation ratios were obtained in all samples, as will be seen from FIG. 4.

Example 8 showed a greater resistance variation ratio than Example 7, and Comparative Example 8 showed a greater resistance variation ratio than Comparative Example. This is because in each of Example 7 and Comparative Example 7, the seed layer 22 formed of $Ni_{80}Fe_{20}$ alloy had a low specific resistance, while in Example 8 and Comparative Example 8, the seed layer 22 contained non-magnetic Cr and a composition $Ni_{60}Fe_{10}Cr_{30}$, and had a high specific resistance.

In example 7 and Comparative Example 7, the sense current shunted into the seed layer 22 due to the low specific resistance, whereas, in Example 8 and Comparative Example 8, such shunting did not take place. Accordingly, greater resistance variation ratios were obtained in Example 8 and Comparative Example 8 than in Example 7 and Comparative Example 7.

In regard to the exchange coupling magnetic field, it is understood that Examples 7 and 8 exhibit much greater strength of magnetic field than Comparative Examples 7 and 8. This is because the interface adjacent to the seed layer 22 and the interface adjacent to the pinned magnetic layer 3 are held in a non-aligned crystal lattice state by virtue of the third antiferromagnetic layer 25 and the first antiferromagnetic layer 23. In contrast, in Comparative Examples 7 and 8, the transformation is suppressed so that a large exchange coupling magnetic field is not obtained. This is due to an aligned state at each of the interface adjacent to the seed layer 22 and the interface adjacent to the pinned magnetic layer, even though the antiferromagnetic layer 31 has an ideal composition that permits easy transformation from a disordered lattice to an ordered lattice.

From the results of this experiment, it is understood that the requirements for high resistance variation ratio and exchange coupling magnetic field are satisfied when the following conditions are met. In particular, it is possible to increase the resistance variation ratio by forming the seed layer 22 on the side of the antiferromagnetic layer opposite to the interface adjacent to the pinned magnetic layer 3, and by using a material having a large specific resistance as the material of the seed layer 22. In addition, the antiferromagnetic layer 4, as deposited, has three layers among which the first antiferromagnetic layer 23 contacting the pinned magnetic layer 3 and the third antiferromagnetic layer 25 contacting the seed layer are made to have greater Pt contents than the intermediate second antiferromagnetic layer 24. Accordingly, non-aligned crystal lattice states are maintained at the interface adjacent to the pinned magnetic layer 3 and at the interface adjacent to the seed layer 22. Also, the intermediate second antiferromagnetic layer 22 is formed from a material having an ideal composition that permits easy transformation from a disordered lattice to an ordered lattice structure. By using this antiferromagnetic layer, it is possible to enhance the exchange coupling magnetic field (Hex).

As in the case of the experiment results shown in FIGS. 18 and 19, the thicknesses of the first antiferromagnetic layer 23 and the third antiferromagnetic layer 25 are preferably about 3 Å to about 30 Å, while the composition ratios are preferably such that the Pt content is about 53 at % to about 65 at %. The thickness of the second antiferromagnetic layer 24 is preferably 70 Å or greater, as in the case of the experiment result shown in FIG. 17.

Although the invention has been described through its preferred forms, it is to be understood that the described embodiments are only illustrative and various changes and modifications may be imparted thereto without departing from the scope of the present invention.

What is claimed is:

1. An exchange coupling film comprising:
   an antiferromagnetic layer having a first region configured to create a non-aligned crystal lattice state and a second region configured to transform from a disordered lattice to an ordered lattice; and
   a ferromagnetic layer formed in contact with said first region of said antiferromagnetic layer, such that an exchange coupling magnetic field is produced at an interface between said antiferromagnetic layer and said ferromagnetic layer that fixes the magnetization of said ferromagnetic layer in a predetermined direction,
   wherein said antiferromagnetic layer comprises an antiferromagnetic material containing an element X and Mn, wherein said element X is selected from the group of elements consisting of Pt, Pd, Ir, Rh, Ru, and Os, and combinations thereof;
   wherein said antiferromagnetic layer is transformed by an annealing process to an annealed antiferromagnetic layer,
   wherein said annealed antiferromagnetic layer includes a region in which a ratio of an atomic percent of said element X to Mn increases in a direction towards said ferromagnetic layer; and
   wherein a crystalline structure of at least a portion of said annealed antiferromagnetic layer has a CuAu—I type face-centered square ordered lattice.

2. An exchange coupling film comprising:
an antiferromagnetic layer having a first region configured to create a non-aligned crystal lattice state and a second region configured to transform from a disordered lattice to an ordered lattice; and
a ferromagnetic layer formed in contact with said first region of said antiferromagnetic layer such that an exchange coupling magnetic field is produced at an interface between said antiferromagnetic layer and said ferromagnetic layer to fix the magnetization of said ferromagnetic layer in a predetermined direction,
wherein said antiferromagnetic layer comprises an antiferromagnetic material containing an element X, an element X' and Mn, wherein said element X is selected from the group of elements consisting of Pt, Pd, Ir, Rh, Ru, and Os, and combinations thereof, wherein the element X' is selected from the group of elements consisting of Ne, Ar, Kr, Xe, Be, B, C, N, Mg, Al, Si, P, Ti, V, Cr, Fe, Go, Ni, Cu, Zn, Ga, Ge, Zr, Nb, Mo, Ag, Cd, Sn, Hf, Ta, W, Re, Au, Pb and a rare earth element and combinations thereof;
wherein said antiferromagnetic layer is transformed by an annealing process to an annealed antiferromagnetic layer, wherein said annealed antiferromagnetic layer includes a region in which the ratio of the atomic percent of the elements X+X' to Mn increases in a direction towards said ferromagnetic layer; and
wherein a crystalline structure of at least a portion of said annealed antiferromagnetic layer has a CuAu—I type face-centered square ordered lattice.

3. An exchange coupling film according to claim 2, wherein said antiferromagnetic material comprises one of an interstitial solid solution in which the element X' has invaded the interstices of a space lattice constituted by the element X and Mn, or a substitutive solid solution in which a portion of the lattice points of a crystal lattice constituted by said element X and Mn is substituted by said element X'.

4. An exchange coupling film according to claim 1, wherein said antiferromagnetic layer has a lattice constant and said ferromagnetic layer has a lattice constant and wherein said lattice constants of said antiferromagnetic layer and said ferromagnetic layer have different values over at least part of said interface.

5. An exchange coupling film according to claim 2, wherein said antiferromagnetic layer has a lattice constant and said ferromagnetic layer has a lattice constant and wherein said lattice constants of said antiferromagnetic layer and said ferromagnetic layer have different values over at least part of said interface.

6. An exchange coupling film according to claim 1, wherein said antiferromagnetic layer has a crystalline orientation and said ferromagnetic layer has a crystalline orientation and wherein said crystalline orientations of said antiferromagnetic layer and said ferromagnetic layer differ over at least part of said interface.

7. An exchange coupling film according to claim 2, wherein said antiferromagnetic layer has a crystalline orientation and said ferromagnetic layer has a crystalline orientation and wherein said crystalline orientations of said antiferromagnetic layer and said ferromagnetic layer differ over at least part of said interface.

8. An exchange coupling film according to one of claims 1, wherein a non-aligned crystal lattice state exists over at least part of said interface.

9. An exchange coupling film according to one of claims 2, wherein a non-aligned crystal lattice state exists over at least part of said interface.

10. An exchange coupling film according to claim 1, wherein an imaginary boundary within a thickness of said annealed antiferromagnetic layer resides in parallel with said interface so as to divide said annealed antiferromagnetic layer into a first region between said imaginary boundary and said interface and a second region between said imaginary boundary and a face surface of said annealed antiferromagnetic layer opposite to said interface, and wherein said annealed antiferromagnetic has a region in which said ratio increases from said second region in a direction towards said first region across said imaginary boundary.

11. An exchange coupling film according to claim 2, wherein an imaginary boundary within a thickness of said annealed antiferromagnetic layer resides in parallel with said interface so as to divide said annealed antiferromagnetic layer into a first region between said imaginary boundary and said interface and a second region between said imaginary boundary and a face surface of said annealed antiferromagnetic layer opposite to said interface, and wherein said annealed antiferromagnetic layer has a region in which said ratio increases from said second region in a direction towards said first region across said imaginary boundary.

12. An exchange coupling film according to claim 1, wherein said annealed antiferromagnetic layer includes a region in which a composition ratio (atomic percent) of said element X increases in a direction towards said ferromagnetic layer.

13. An exchange coupling film according to claim 1, wherein said annealed antiferromagnetic layer includes a region in which a composition ratio (atomic percent) of said elements X+X' increases in a direction towards said ferromagnetic layer.

14. An exchange coupling film according to claim 1, wherein said annealed antiferromagnetic layer includes a region in proximity to said interface and wherein a composition ratio (atomic percent) of said element X decreases in a direction towards said ferromagnetic layer.

15. An exchange coupling film according to claim 1, wherein said annealed antiferromagnetic layer includes a region in proximity to said interface and wherein a composition ratio (atomic percent) of said elements X+X' decreases in a direction towards said ferromagnetic layer.

16. An exchange coupling film according to claim 12, wherein said annealed antiferromagnetic layer further includes a region in proximity to said interface and wherein a composition ratio (atomic percent) of said element X decreases in a direction towards said ferromagnetic layer.

17. An exchange coupling film according to claim 13, wherein said annealed antiferromagnetic layer further includes a region in proximity to said interface and wherein the composition ratio (atomic percent) of said elements X+X' decreases in a direction towards said ferromagnetic layer.

18. An exchange coupling film according to claim 1, wherein said annealed antiferromagnetic layer includes a region in proximity to a face surface thereof opposite to said interface and wherein a composition ratio (atomic percent) of said element X decreases in a direction away from said ferromagnetic layer.

19. An exchange coupling film according to claim 2, wherein said annealed antiferromagnetic layer includes a region in proximity to a face surface thereof opposite to said interface and wherein a composition ratio (atomic percent) of said element X decreases in a direction away from said ferromagnetic layer.

20. An exchange coupling film according to claim 12, wherein said annealed antiferromagnetic layer includes a region in proximity to a face surface thereof opposite to said interface and wherein a composition ratio (atomic percent) of said element X decreases in a direction away from said ferromagnetic layer.

21. An exchange coupling film according to claim 13, wherein said annealed antiferromagnetic layer further includes a region in proximity to a face surface thereof opposite to said interface and wherein a composition ratio (atomic percent) of said elements X+X' decreases in a direction away from said ferromagnetic layer.

22. An exchange coupling film according to claim 14, wherein said annealed antiferromagnetic layer further includes a region in proximity to a face surface thereof opposite to said interface and wherein a composition ratio (atomic percent) of said element X decreases in a direction away from said ferromagnetic layer.

23. An exchange coupling film according to claim 15, wherein said annealed antiferromagnetic layer further includes a region in proximity to a face surface thereof opposite to said interface and wherein a composition ratio (atomic percent) of said elements X+X' decreases in a direction away from said ferromagnetic layer.

24. An exchange coupling film according to claim 16, wherein said annealed antiferromagnetic layer further includes a region in proximity to a face surface thereof opposite to said interface and wherein a composition ratio (atomic percent) of said element X decreases in a direction away from said ferromagnetic layer.

25. An exchange coupling film according to claim 17, wherein said annealed antiferromagnetic layer further includes a region in proximity to a face surface thereof opposite to said interface and wherein a composition ratio (atomic percent) of said elements X+X' decreases in a direction away from said ferromagnetic layer.

26. An exchange coupling film according to claim 1, wherein a composition ratio of said element X of said annealed antiferromagnetic layer to a total composition ratio 100 at % of all elements constituting said annealed antiferromagnetic layer is about 50 at % to about 65 at %, in a region in proximity to said interface between said annealed antiferromagnetic layer and said ferromagnetic layer.

27. An exchange coupling film according to claim 2, wherein a composition ratio of said elements X+X' of said annealed antiferromagnetic layer to a total composition ratio 100 at % of all elements constituting said annealed antiferromagnetic layer is about 50 at % to about 65 at %, in the region in proximity to said interface between said annealed antiferromagnetic layer and said ferromagnetic layer.

28. An exchange coupling film according to claim 26, wherein a composition ratio of said element X is about 50 at % to about 60 at %.

29. An exchange coupling film according to claim 27, wherein a composition ratio of said elements X+X' is about 50 at % to about 60 at %.

30. An exchange coupling film according to claim 1, wherein a composition ratio of said element X of said second region of said antiferromagnetic layer to a total composition ratio 100 at % of all elements constituting said antiferromagnetic layer is about 44 at % to about 57 at %, in a region in proximity to a face surface of said antiferromagnetic layer opposite to said interface.

31. An exchange coupling film according to claim 2, wherein a composition ratio of said elements X+X' of said second region of said antiferromagnetic layer to a total composition ratio 100 at % of all elements constituting said antiferromagnetic layer is about 44 at % to about 57 at %, in a region in proximity to a face surface of said antiferromagnetic layer opposite to said interface.

32. An exchange coupling film according to claim 26, wherein a composition ratio of said element X of said second region of said antiferromagnetic layer to said total composition ratio 100 at % of all elements constituting said antiferromagnetic layer is about 44 at % to about 57 at %, in a region proximate to a face surface of said antiferromagnetic layer opposite to said interface.

33. An exchange coupling film according to claim 27, wherein a composition ratio of said elements X+X' of said second region of said antiferromagnetic layer to the total composition ratio 100 at % of all the elements constituting said antiferromagnetic layer is about 44 at % to about 57 at %, in the region near the face of said antiferromagnetic layer opposite to the interface adjacent to said ferromagnetic layer.

34. An exchange coupling film according to claim 28, wherein a composition ratio of said elements X+X' of said second region of said antiferromagnetic layer to the total composition ratio 100 at % of all the elements constituting said antiferromagnetic layer is about 44 at % to about 57 at %, in the region near the face of said antiferromagnetic layer opposite to the interface adjacent to said ferromagnetic layer.

35. An exchange coupling film according to claim 29, wherein a composition ratio of said elements X+X' of said second region of said antiferromagnetic layer to the total composition ratio 100 at % of all the elements constituting said antiferromagnetic layer is about 44 at % to about 57 at %, in the region near the face of said antiferromagnetic layer opposite to the interface adjacent to said ferromagnetic layer.

36. An exchange coupling film according to claim 30, wherein a composition ratio of said element X is about 46 at % to about 55 at %.

37. An exchange coupling film according to claim 31, wherein a composition ratio of said elements X+X' is about 46 at % to about 55 at %.

38. An exchange coupling film according to claim 32, wherein a composition ratio of said element X is about 46 at % to about 55 at %.

39. An exchange coupling film according to claim 33, wherein a composition ratio of said elements X+X' is about 46 at % to about 55 at %.

40. An exchange coupling film according to claim 34, wherein a composition ratio of said element X is about 46 at % to about 55 at %.

41. An exchange coupling film according to claim 35, wherein a composition ratio of said elements X+X' is about 46 at % to about 55 at %.

42. An exchange coupling film according to claim 1, wherein said antiferromagnetic layer has a thickness at least about 73 Å.

43. An exchange coupling film according to claim 2, wherein said antiferromagnetic layer has a thickness at least about 73 Å.

44. An exchange coupling film comprising:
an antiferromagnetic layer having a first region and a second region configured to create a non-aligned crystal lattice state and a third region intermediate to the first and second regions that is configured to transform from a disordered lattice to an ordered lattice; and
a ferromagnetic layer formed such that an exchange coupling magnetic field is produced at an interface between said first region of said antiferromagnetic layer and said ferromagnetic layer,
wherein said antiferromagnetic layer comprises an antiferromagnetic material containing an element X and Mn, where the element X is selected from the group of elements consisting of Pt, Pd, Ir, Rh, Ru, and Os, and combinations thereof;

wherein said antiferromagnetic layer is transformed by an annealing process to an annealed antiferromagnetic layer, wherein said annealed antiferromagnetic layer includes a region in which the ratio of the atomic percent of the element X to Mn increases towards said ferromagnetic layer starting from a thicknesswise central region and a region in which the ratio of the atomic percent of the element X to Mn increases in the direction away from said ferromagnetic layer starting from said thicknesswise central region; and wherein the crystalline structure of at least part of said annealed antiferromagnetic layer has a CuAu—I type face-centered square ordered lattice.

45. An exchange coupling film comprising:

an antiferromagnetic layer having a first region and a second region configured to create a non-aligned crystal lattice state and a third region intermediate to the first and second regions that is configured to transform from a disordered lattice to an ordered lattice; and a ferromagnetic layer formed such that an exchange coupling magnetic field is produced at an interface between said first region of said antiferromagnetic layer and said ferromagnetic layer, wherein said antiferromagnetic layer comprises an antiferromagnetic material containing an element X, an element X', and Mn, where the element X is selected from the group of elements consisting of Pt, Pd, Ir, Rh, Ru, and Os, and combinations thereof, while the element X' is selected from the group of elements consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and a rare earth element and combinations thereof;

wherein said antiferromagnetic layer is transformed by an annealing process to an annealed antiferromagnetic layer, wherein said annealed antiferromagnetic layer includes a region in which the ratio of the atomic percent of the elements X+X' to Mn increases towards said ferromagnetic layer starting from a thicknesswise central region and a region in which the ratio of the atomic percent of the elements X+X' to Mn increases in the direction away from said ferromagnetic layer starting from said thicknesswise central region; and wherein the crystalline structure of at least part of said annealed antiferromagnetic layer has a CuAu—I type face-centered square ordered lattice.

46. An exchange coupling film according to claim 45, said antiferromagnetic material containing an element X, an element X', and Mn, is an interstitial solid solution in which the element X' has invaded the interstices of a space lattice constituted by the element X and Mn, or a substitutive solid solution in which part of the lattice points of a crystal lattice constituted by the element X and Mn has been substituted by the element X'.

47. An exchange coupling film according to claim 44, further comprising a seed layer formed on the side of said antiferromagnetic layer opposite to the interface adjacent to said ferromagnetic layer, said seed layer having face-centered cubic crystals with substantially oriented (111) planes, said antiferromagnetic layer and said ferromagnetic layer having crystalline orientations with the (111) planes substantially oriented in parallel with said interface.

48. An exchange coupling film according to claim 45, further comprising a seed layer formed on the side of said antiferromagnetic layer opposite to the interface adjacent to said ferromagnetic layer, said seed layer having face-centered cubic crystals with substantially oriented (111) planes, said antiferromagnetic layer and said ferromagnetic layer having crystalline orientations with the (111) planes substantially oriented in parallel with said interface.

49. An exchange coupling film according to claim 47, wherein said antiferromagnetic layer and said seed layer have different lattice constants over at least part of the interface therebetween.

50. An exchange coupling film according to claim 48, wherein said antiferromagnetic layer and said seed layer have different lattice constants over at least part of the interlace therebetween.

51. An exchange coupling film according to claim 47, wherein a non-aligned crystal lattice state has been created over at least part of the interface between said annealed antiferromagnetic layer and said seed layer.

52. An exchange coupling film according to claim 48, wherein a non-aligned crystal lattice state has been created over at least part of the interlace between said annealed antiferromagnetic layer and said seed layer.

53. An exchange coupling film according to claim 47, wherein said seed layer is formed of an Ni—Fe alloy or an Ni—Fe—Y alloy, wherein Y is one or more elements selected from the group consisting of Cr, Rh, Ta, Hf, Nb, Zr, and Ti.

54. An exchange coupling film according to claim 48, wherein said seed layer is formed of an Ni—Fe alloy or an Ni—Fe—Y alloy, wherein Y is one or more elements selected from the group consisting of Cr, Rh, Ta, Hf, Nb, Zr, and Ti.

55. An exchange coupling film according to claim 47, wherein said seed layer is a non-magnetic layer.

56. An exchange coupling film according to claim 48, wherein said seed layer is a non-magnetic layer.

57. An exchange coupling film according to claim 47, wherein said seed layer, said antiferromagnetic layer, and said ferromagnetic layer are formed in this order on an underlying layer, said underlying layer being formed of at least one element selected from the group consisting of Ta, Hf, Nb, Zr, Ti, Mo and W.

58. An exchange coupling film according to claim 48, wherein said seed layer, said antiferromagnetic layer, and said ferromagnetic layer are formed in this order on an underlying layer, said underlying layer being formed of at least one element selected from the group consisting of Ta, Hf, Nb, Zr, Ti, Mo and W.

59. An exchange coupling film according to claim 44, wherein a layer formed of elements selected from the group consisting of Ta, Hf, Nb, Zr, Ti, Mo and W is formed on the side of said antiferromagnetic layer opposite to the interface adjacent to said ferromagnetic layer.

60. An exchange coupling film according to claim 45, wherein a layer formed of elements selected from the group consisting of Ta, Hf, Nb, Zr, Ti, Mo and W is formed on the side of said antiferromagnetic layer opposite to the interface adjacent to said ferromagnetic layer.

61. An exchange coupling film according to claim 42, wherein, assuming a first imaginary boundary at the side of the thicknesswise center of said annealed antiferromagnetic layer adjacent to the face of said annealed antiferromagnetic layer opposite to said interface and a second imaginary boundary at the side of said thicknesswise center adjacent to said interface, said ratio is greater in a first region between said face of said annealed antiferromagnetic layer and said first imaginary boundary and in a third region between said interface adjacent to said ferromagnetic layer and said second imaginary boundary than in a second region between said first and second imaginary boundaries, and said ratio linearly or non-linearly increases from said second region towards said first region across said first imaginary boundary and from said second region towards said third region across said second imaginary boundary.

62. An exchange coupling film according to claim 44, wherein, assuming a first imaginary boundary at the side of the thicknesswise center of said annealed antiferromagnetic layer adjacent to the face of said annealed antiferromagnetic layer opposite to said interface and a second imaginary boundary at the side of said thicknesswise center adjacent to said interface, said ratio is greater in a first region between said face of said annealed antiferromagnetic layer and said first imaginary boundary and in a third region between said interface adjacent to said ferromagnetic layer and said second imaginary boundary than in a second region between said first and second imaginary boundaries, and said ratio linearly or non-linearly increases from said second region towards said first region across said first imaginary boundary and from said second region towards said third region across said second imaginary boundary.

63. An exchange coupling film according to claim 44, wherein said annealed antiferromagnetic layer includes a region in which the atomic percent of the element X increases towards said interface adjacent to said ferromagnetic layer starting from a predetermined thicknesswise central region, and a region in which the atomic percent of the element X increases towards the side opposite to said interface starting from the predetermined thicknesswise central region.

64. An exchange coupling film according to claim 45, wherein said annealed antiferromagnetic layer includes a region in which the atomic percent of the elements X+X' increases towards said interface adjacent to said ferromagnetic layer starting from a predetermined thicknesswise central region, and a region in which the atomic percent of the elements X+X' increases towards the side opposite to said interface starting from the predetermined thicknesswise central region.

65. An exchange coupling film according to claim 44, wherein said annealed antiferromagnetic layer includes a region in which the atomic percent of the element X decreases towards said interface adjacent to said ferromagnetic layer, and a region in which the atomic percent of the element X decreases towards the side opposite to said interface.

66. An exchange coupling film according to claim 45, wherein said annealed antiferromagnetic layer includes a region in which the atomic percent of the elements X+X' decreases towards said interface adjacent to said ferromagnetic layer, and a region in which the atomic percent of the elements X+X' decreases towards the side opposite to said interface.

67. An exchange coupling film according to claim 62, wherein said annealed antiferromagnetic layer includes a region in which the atomic percent of the element X decreases towards said interface adjacent to said ferromagnetic layer, and a region in which the atomic percent of the element X decreases towards the side opposite to said interface.

68. An exchange coupling film according to claim 64, wherein said annealed antiferromagnetic layer includes a region in which the atomic percent of the elements X+X' decreases towards said interface adjacent to said ferromagnetic layer, and a region in which the atomic percent of the element X+X' decreases towards the side opposite to said interface.

69. An exchange coupling film according to claim 44, wherein a composition ratio of said element X of said annealed antiferromagnetic layer to the total composition ratio 100 at % of all the elements constituting each of the portions of said annealed antiferromagnetic layer in proximity to said interface adjacent to said ferromagnetic layer and near the side opposite to said interface is about 50 at % to about 65 at %, in the region in proximity to said interface between said annealed antiferromagnetic layer and said ferromagnetic layer.

70. An exchange coupling film according to claim 45, wherein a composition ratio of said elements X+X' of said annealed antiferromagnetic layer to the total composition ratio 100 at % of all the elements constituting each of the portions of said annealed antiferromagnetic layer in proximity to said interface adjacent to said ferromagnetic layer and near the side opposite to said interface is about 50 at % to about 65 at %, in the region in proximity to said interface between said annealed antiferromagnetic layer and said ferromagnetic layer.

71. An exchange coupling layer according to claim 69, wherein said composition ratio of the element X is about 50 at % to about 60 at % at each of said portions of said annealed antiferromagnetic layer.

72. An exchange coupling layer according to claim 70, wherein said composition ratio of the elements X+X' is about 50 at % to about 60 at % at each of said portions of said annealed antiferromagnetic layer.

73. An exchange coupling film according to claim 44, wherein said second region of said antiferromagnetic layer which comprises an atomic percent of the element X to the total composition ratio of all the elements expressed by 100 at % of about 44 at % to about 57 at %.

74. An exchange coupling film according to claim 45, wherein said third region of said antiferromagnetic layer which comprises an atomic percent of the elements X+X' to the total composition ratio of all the elements expressed by 100 at % of about 44 at % to about 57 at %.

75. An exchange coupling film according to claim 69, wherein said second region of said antiferromagnetic layer which comprises an atomic percent of the element X to the total composition ratio of all the elements expressed by 100 at % of about 44 at % to about 57 at %.

76. An exchange coupling film according to claim 70, wherein said third region of said antiferromagnetic layer which comprises an atomic percent of the elements X+X' to the total composition ratio of all the elements expressed by 100 at % of about 44 at % to about 57 at %.

77. An exchange coupling film according to claim 71, wherein said second region of said antiferromagnetic layer which comprises an atomic percent of the element X to the total composition ratio of all the elements expressed by 100 at % of about 44 at % to about 57 at %.

78. An exchange coupling film according to claim 72, wherein said third region of said antiferromagnetic layer which comprises an atomic percent of the elements X+X' to the total composition ratio of all the elements expressed by 100 at % of about 44 at % to about 57 at %.

79. An exchange coupling film according to claim 73, wherein said second region of said antiferromagnetic layer comprises an atomic percent of the element X to the total composition ratio of all the elements expressed by 100 at % of about 46 at % to about 55 at %.

80. An exchange coupling film according to claim 74, wherein third region of said antiferromagnetic layer comprises an atomic percent of the elements X+X' to the total composition ratio of all the elements expressed by 100 at % of about 46 at % to about 55 at %.

81. An exchange coupling film according to claim 75, wherein said second region of said antiferromagnetic layer comprises an atomic percent of the elements X+X' to the total composition ratio of all the elements expressed by 100 at % of about 46 at % to about 55 at %.

82. An exchange coupling film according to claim 76, wherein said third region of said antiferromagnetic layer comprises an atomic percent of the elements X+X' to the total composition ratio of all the elements expressed by 100 at % of about 46 at % to about 55 at %.

83. An exchange coupling film according to claim 77, wherein said second region of said antiferromagnetic layer comprises an atomic percent of the element X to the total composition ratio of all the elements expressed by 100 at % of about 46 at % to about 55 at %.

84. An exchange coupling film according to claim 78, wherein said third region of said antiferromagnetic layer comprises an atomic percent of the elements X+X' to the total composition ratio of all the elements expressed by 100 at % of about 46 at % to about 55 at %.

85. An exchange coupling film according to claim 44, wherein said antiferromagnetic layer has a thicknesswise at least about 76 Å.

86. An exchange coupling film according to claim 45, wherein said antiferromagnetic layer has a thicknesswise at least about 76 Å.

87. An exchange coupling film according to claim 44, wherein said first region of said antiferromagetic layer and said ferromagetic layer have different lattice constants at the interface therebetween.

88. An exchange coupling film according to claim 53, wherein said first region of said antiferromagetic layer and said ferromagetic layer have different lattice constants at the interface therebetween.

89. An exchange couling film according to claim 44, wherein said first region of said antiferromagnetic layer and said ferromagetic layer have different crystalline orientations at the interface therebetween.

90. An exchange couling film according to claim 45, wherein said first region of said antiferromagnetic layer and said ferromagetic layer have different crystalline orientations at the interface therebetween.

91. An exchange coupling film according to claim 44, wherein a non-aligned crystal lattice state has been created over at least part of the interface between said annealed antiferromagnetic layer and said ferromagnetic layer.

92. An exchange coupling film according to claim 45, wherein a non-aligned crystal lattice state has been created over at least part of the interface between said antiferromagnetic layer and said ferromagnetic layer.

93. An exchange coupling film according to claim 30, wherein said composition ratio of said element X is about 46 at % to about 55 at %.

* * * * *

UNITED STATES PATENT AND TRADEMARK OFFICE
CERTIFICATE OF CORRECTION

| | | |
|---|---|---|
| PATENT NO. | : 6,790,541 B2 | Page 1 of 1 |
| APPLICATION NO. | : 09/834105 | |
| DATED | : September 14, 2004 | |
| INVENTOR(S) | : Masamichi Saito et al. | |

It is certified that error appears in the above-identified patent and that said Letters Patent is hereby corrected as shown below:

In the Claims

In claim 2, line 19, after "Fe," delete "Go," and substitute --Co,-- in its place.

In claim 52, line 3, delete "interlace" and substitute --interface-- in its place.

In claim 89, line 1, delete "couling" and substitute --coupling-- in its place.

In claim 90, line 1, delete "couling" and substitute --coupling-- in its place.

Signed and Sealed this

Twenty-ninth Day of August, 2006

JON W. DUDAS
*Director of the United States Patent and Trademark Office*